United States Patent
Lee et al.

(10) Patent No.: US 9,530,789 B2
(45) Date of Patent: Dec. 27, 2016

(54) SEMICONDUCTOR MEMORY DEVICE AND METHOD OF FABRICATING THE SAME

(71) Applicants: Joonhee Lee, Seongnam-si (KR); Jintaek Park, Hwaseong-si (KR)

(72) Inventors: Joonhee Lee, Seongnam-si (KR); Jintaek Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 47 days.

(21) Appl. No.: 14/701,985

(22) Filed: May 1, 2015

(65) Prior Publication Data
US 2015/0318301 A1 Nov. 5, 2015

(30) Foreign Application Priority Data
May 2, 2014 (KR) ........................ 10-2014-0053601

(51) Int. Cl.
| | |
|---|---|
| H01L 27/115 | (2006.01) |
| H01L 29/792 | (2006.01) |
| H01L 29/423 | (2006.01) |
| H01L 29/66 | (2006.01) |

(52) U.S. Cl.
CPC ..... *H01L 27/11582* (2013.01); *H01L 27/1157* (2013.01); *H01L 27/11565* (2013.01); *H01L 29/4234* (2013.01); *H01L 29/66833* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 8,456,909 B2 | 6/2013 | Lee et al. | |
| 8,492,797 B2 | 7/2013 | Hwang et al. | |
| 8,541,831 B2 | 9/2013 | Chae et al. | |
| 8,569,827 B2 * | 10/2013 | Lee | H01L 27/11582 257/315 |
| 2009/0267128 A1 | 10/2009 | Maejima | |
| 2012/0098050 A1 | 4/2012 | Shim et al. | |
| 2013/0009236 A1 | 1/2013 | Lee et al. | |
| 2013/0100738 A1 | 4/2013 | Choi | |

* cited by examiner

*Primary Examiner* — Angel Roman
(74) *Attorney, Agent, or Firm* — Myers Bigel, P.A.

(57) ABSTRACT

Semiconductor memory devices and methods of fabricating the same are provided. A semiconductor memory device includes stack gate structures that are spaced apart from each other in a first direction horizontal to a substrate. Each of the stack gate structures includes insulating layers and gate electrodes alternately and repeatedly stacked on the substrate. Vertical channel structures penetrate the stack gate structures. A source plug line is provided between the stack gate structures. The source plug line is in contact with the substrate and extends in a second direction intersecting the first direction. The substrate being in contact with the source plug line includes a plurality of protruding regions formed along the second direction. Each of the protruding regions has a first width, and the protruding regions are spaced apart from each other by a first distance greater than the first width.

20 Claims, 47 Drawing Sheets

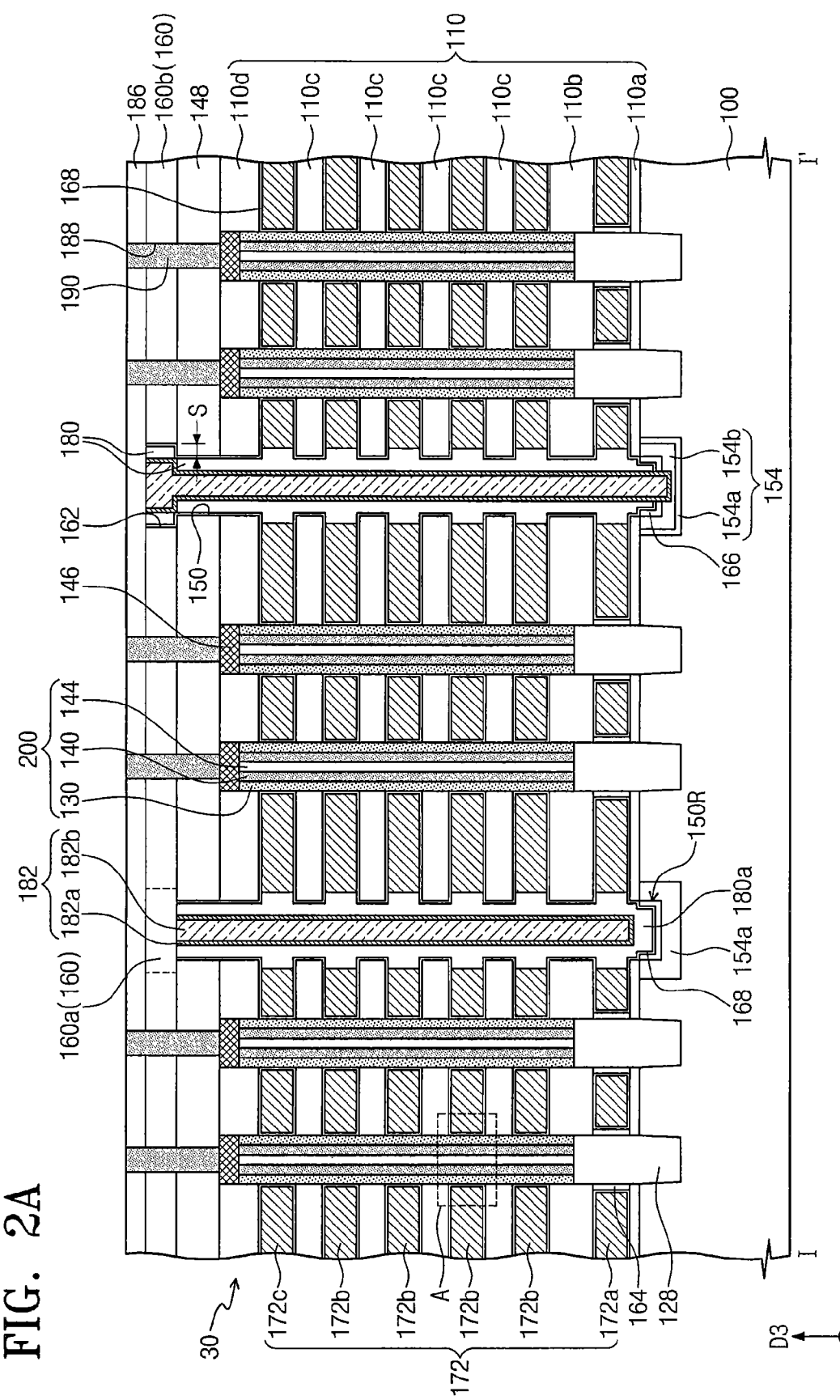

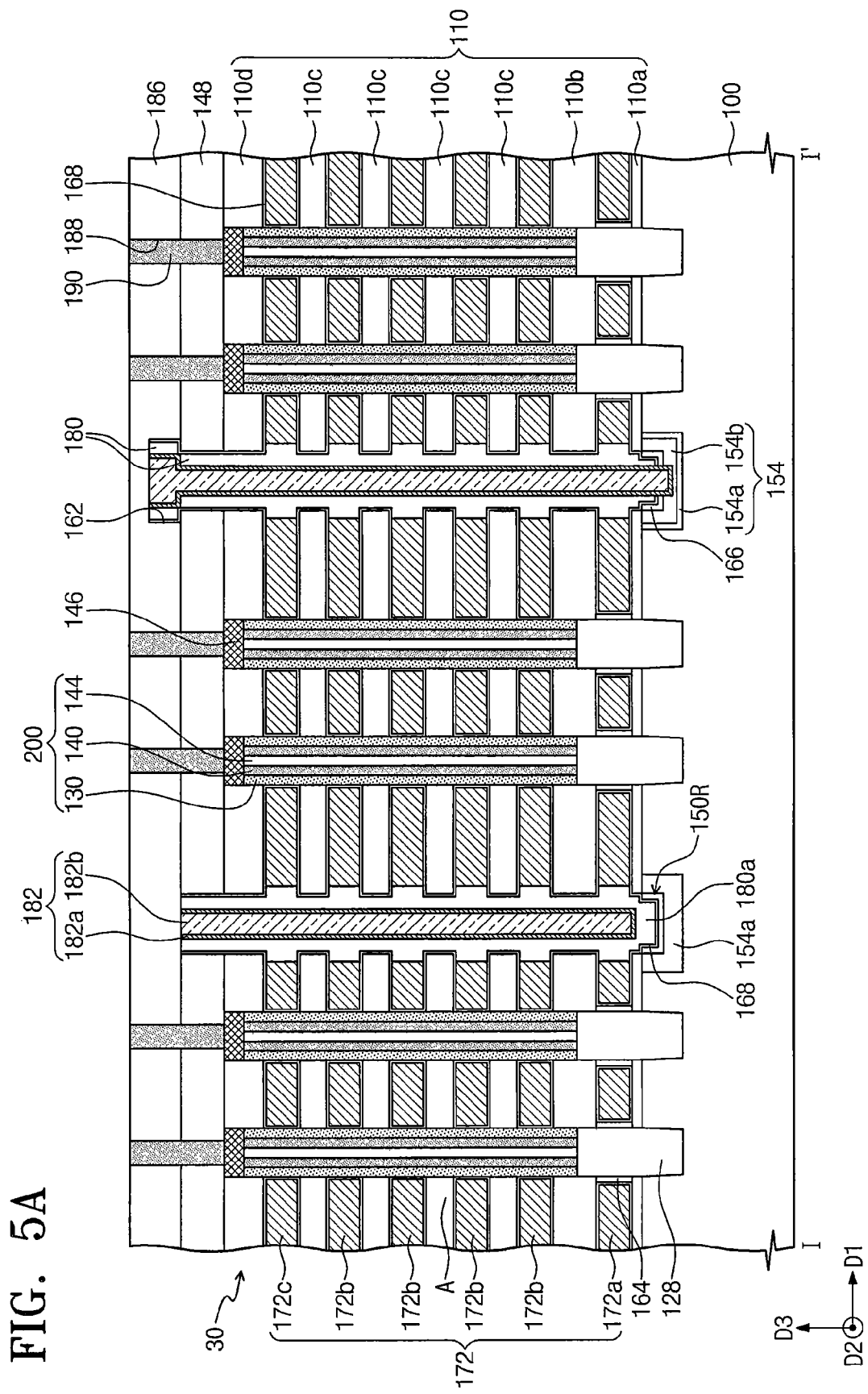

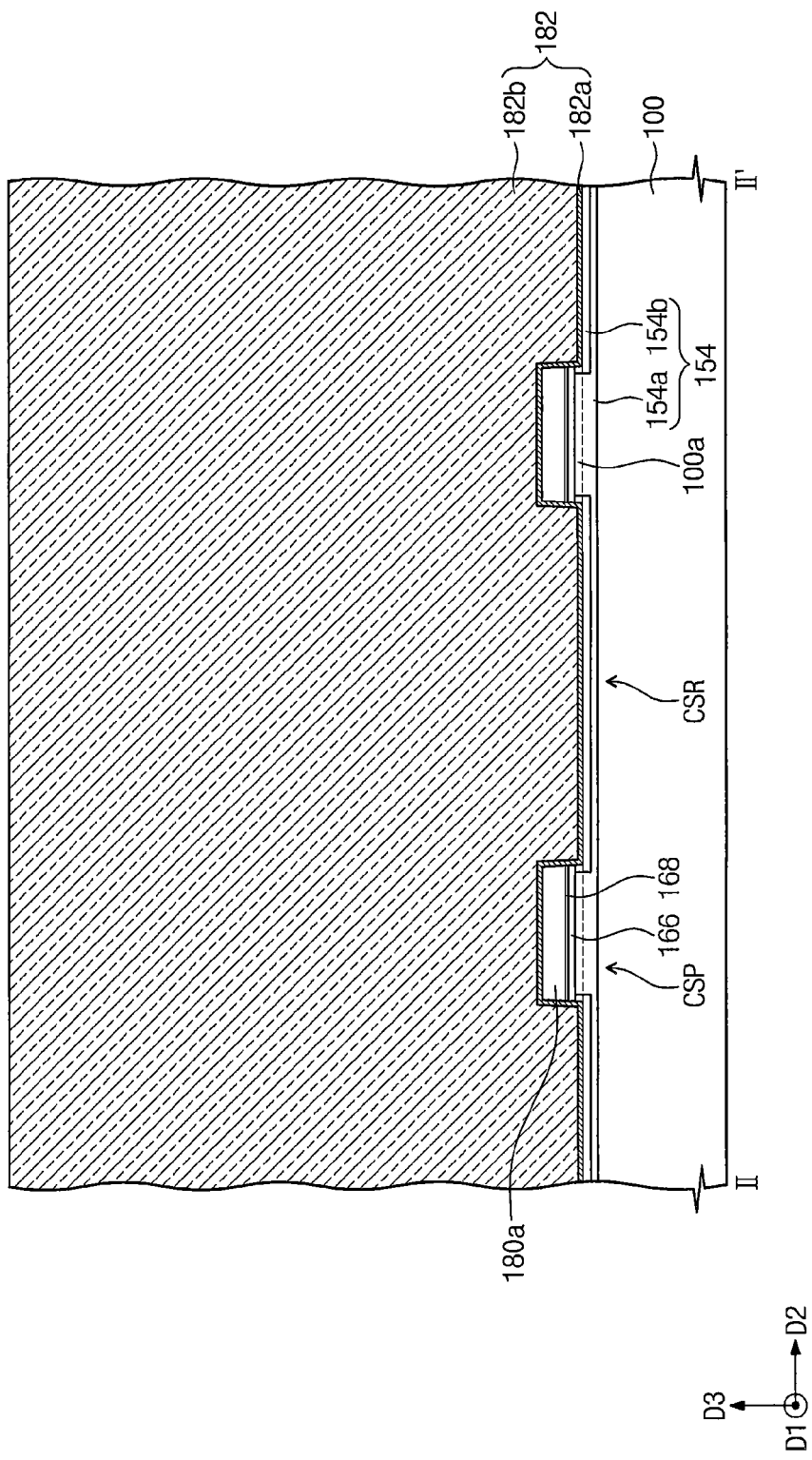

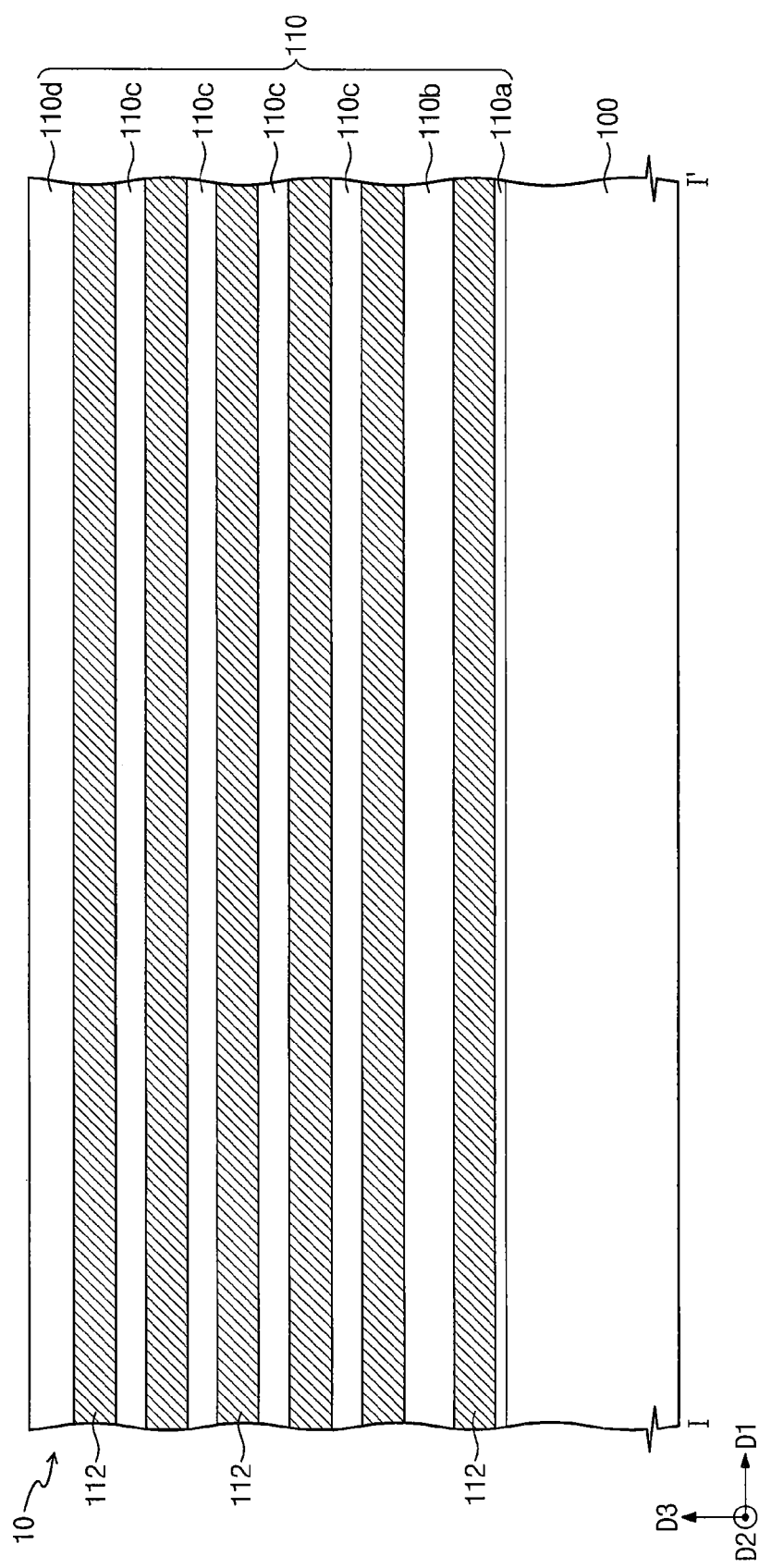

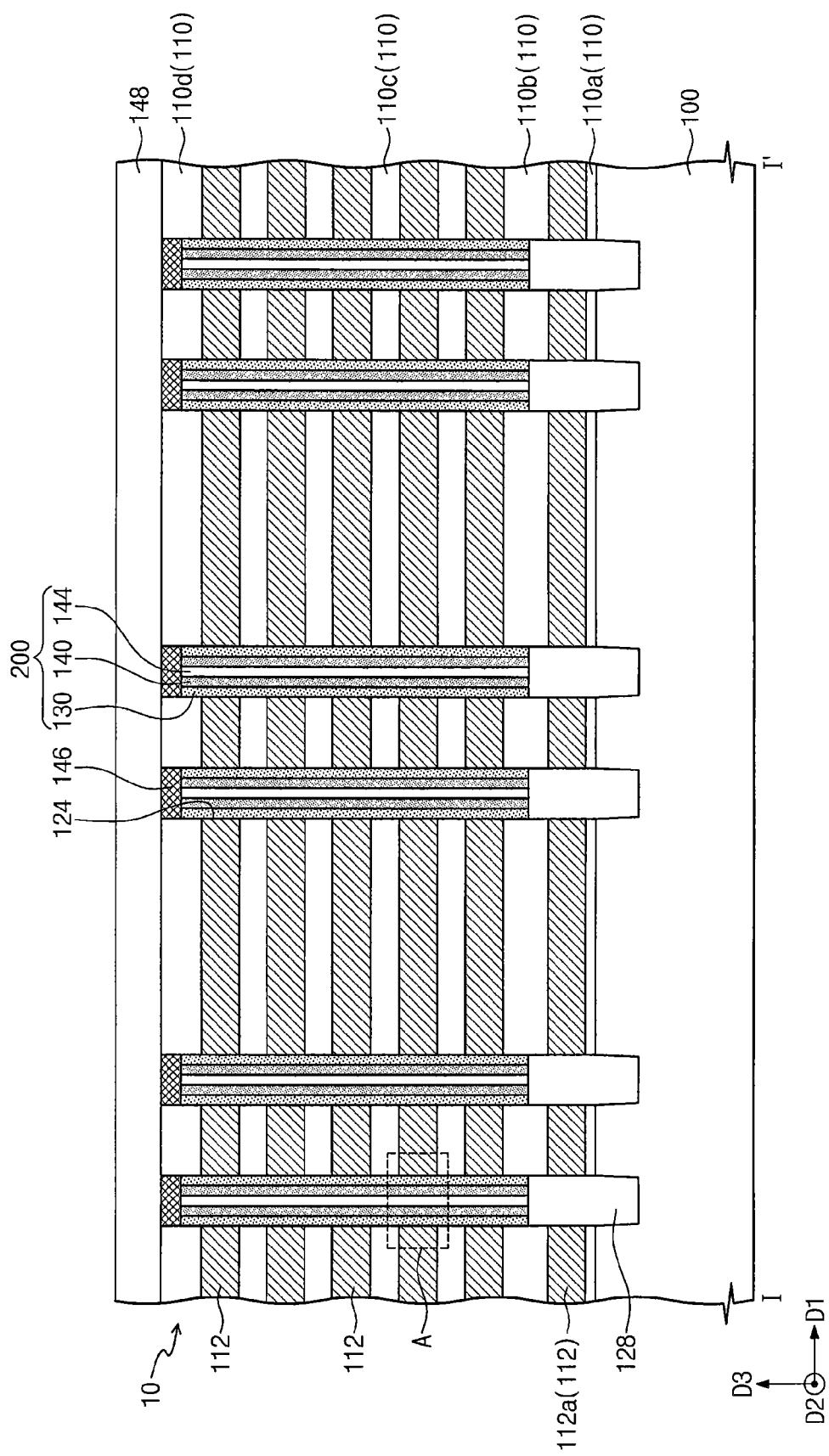

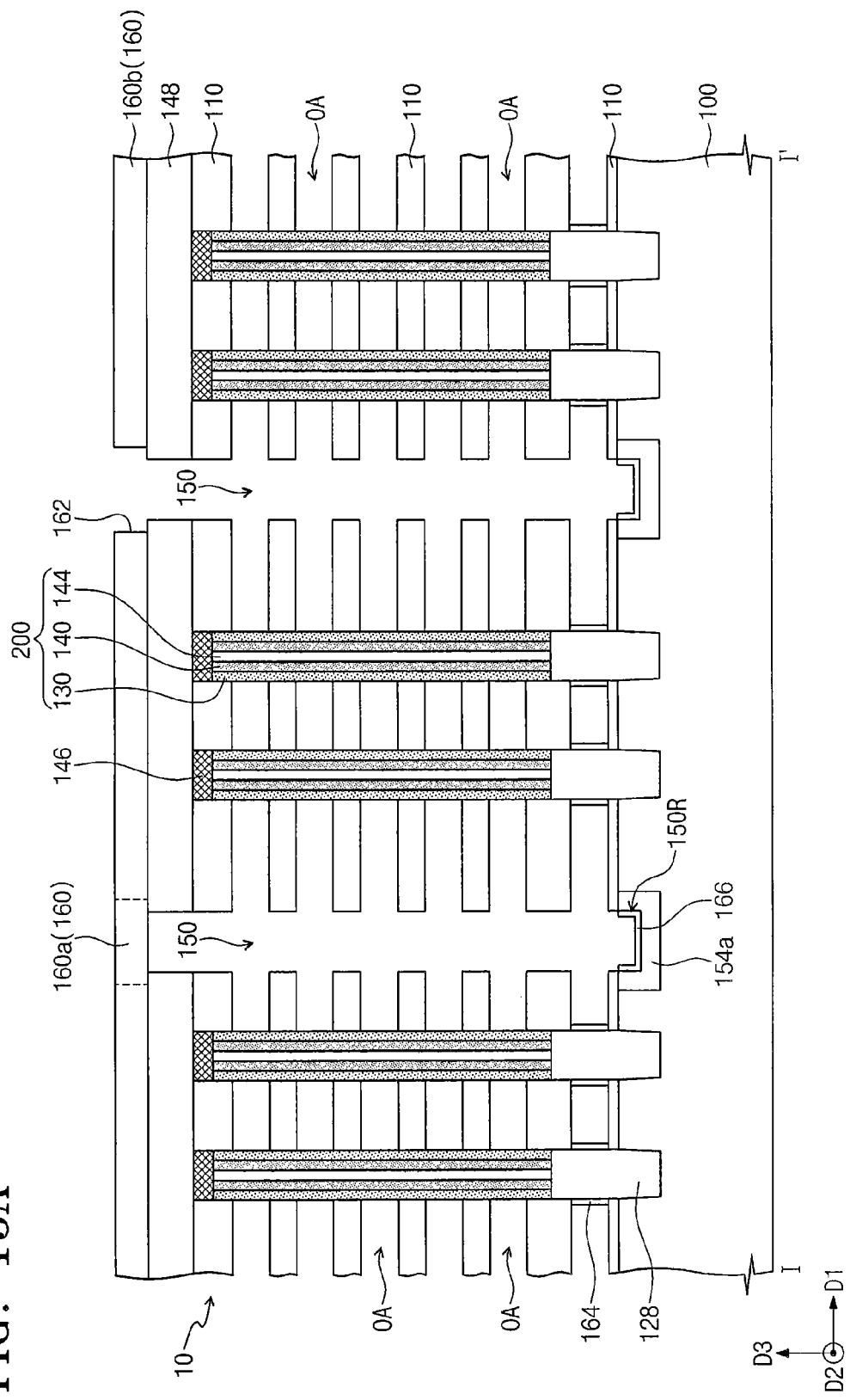

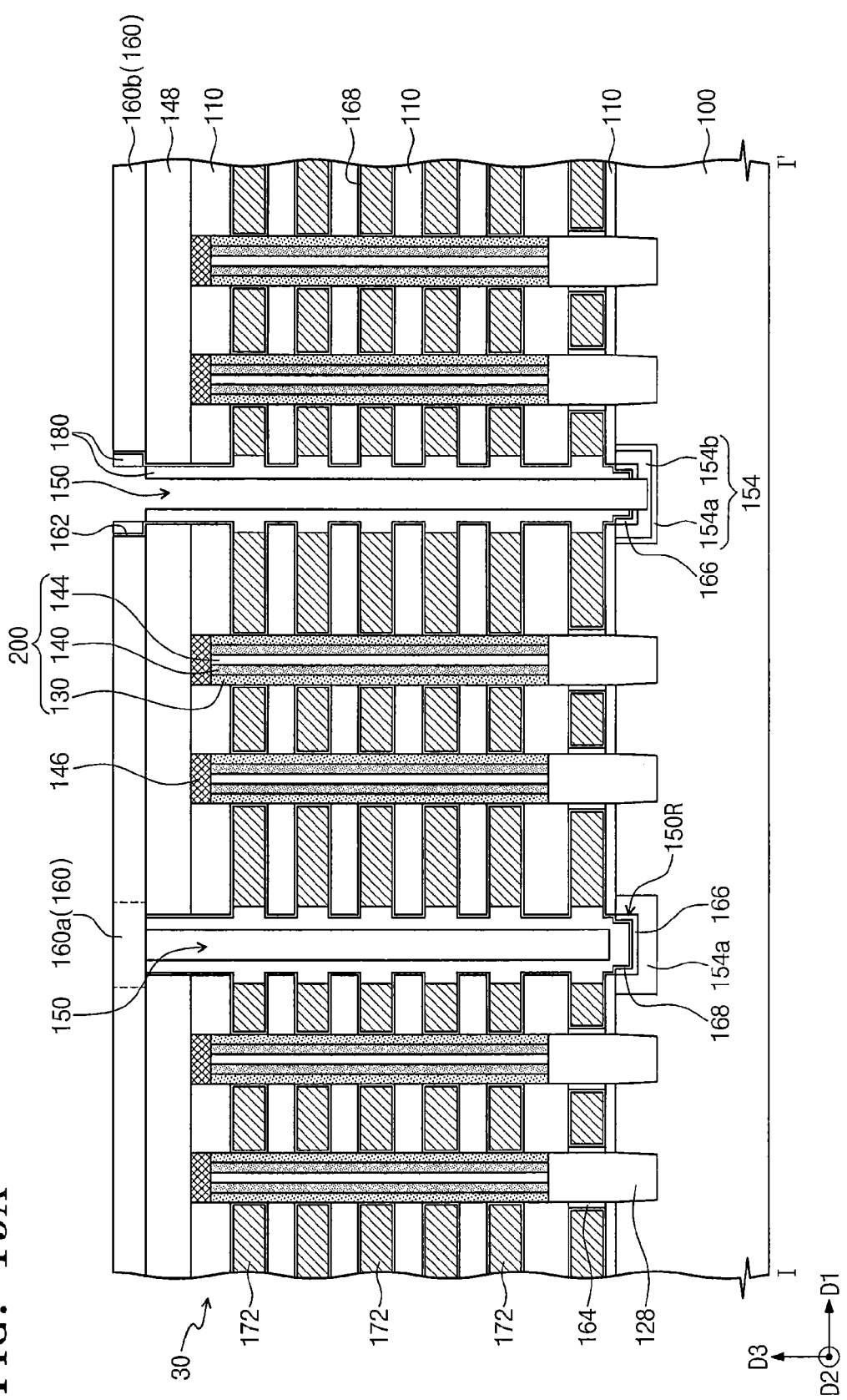

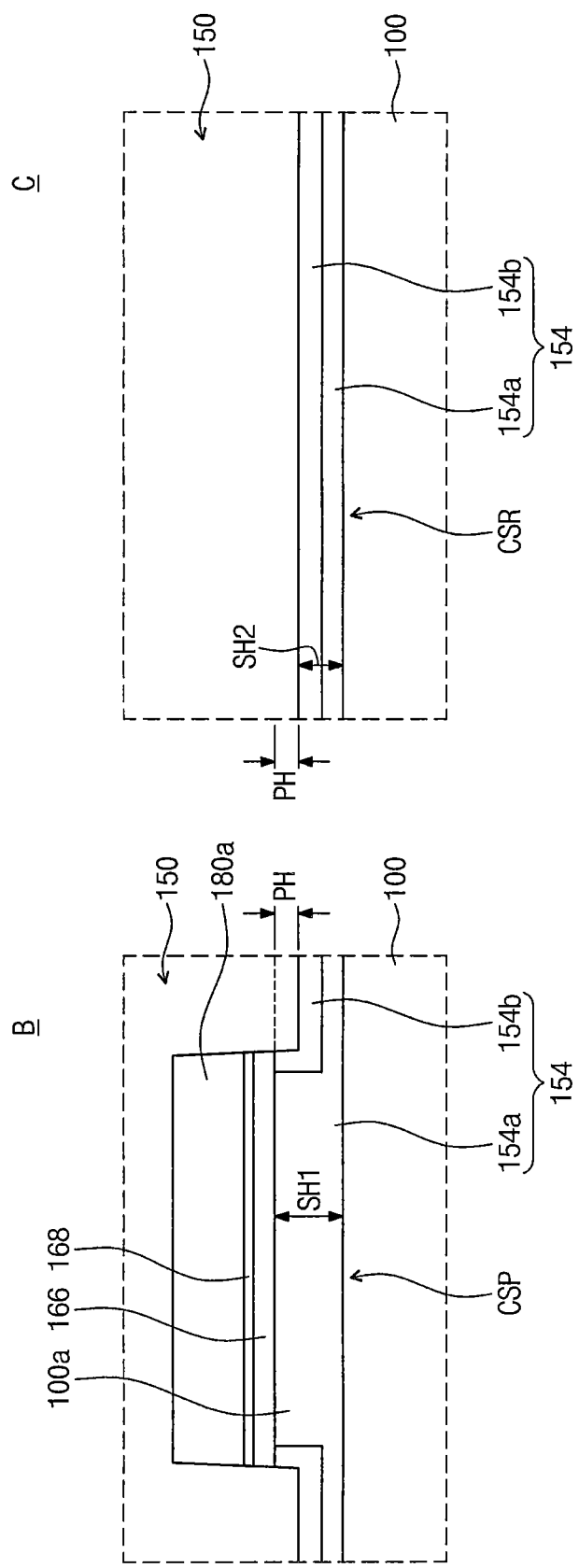

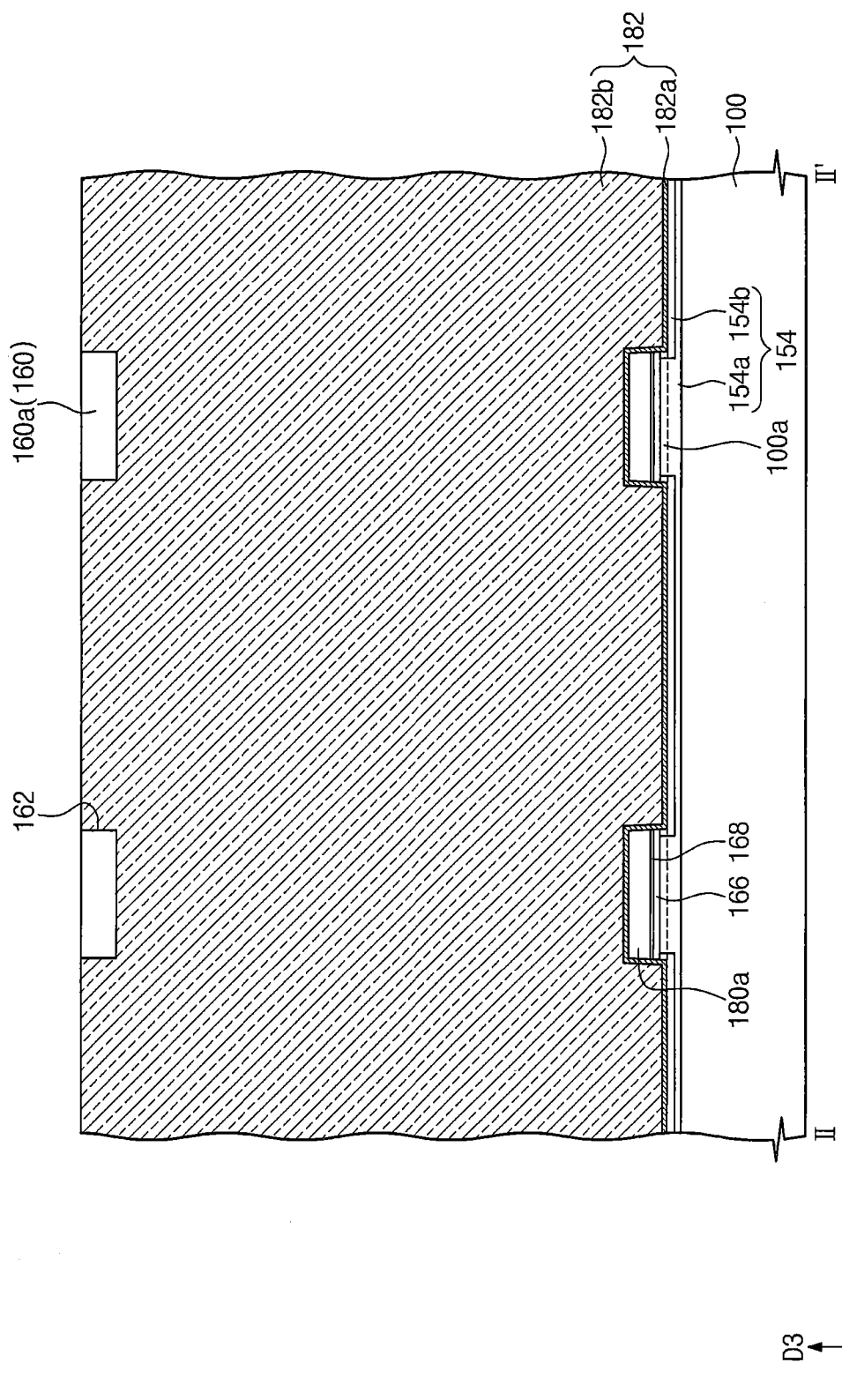

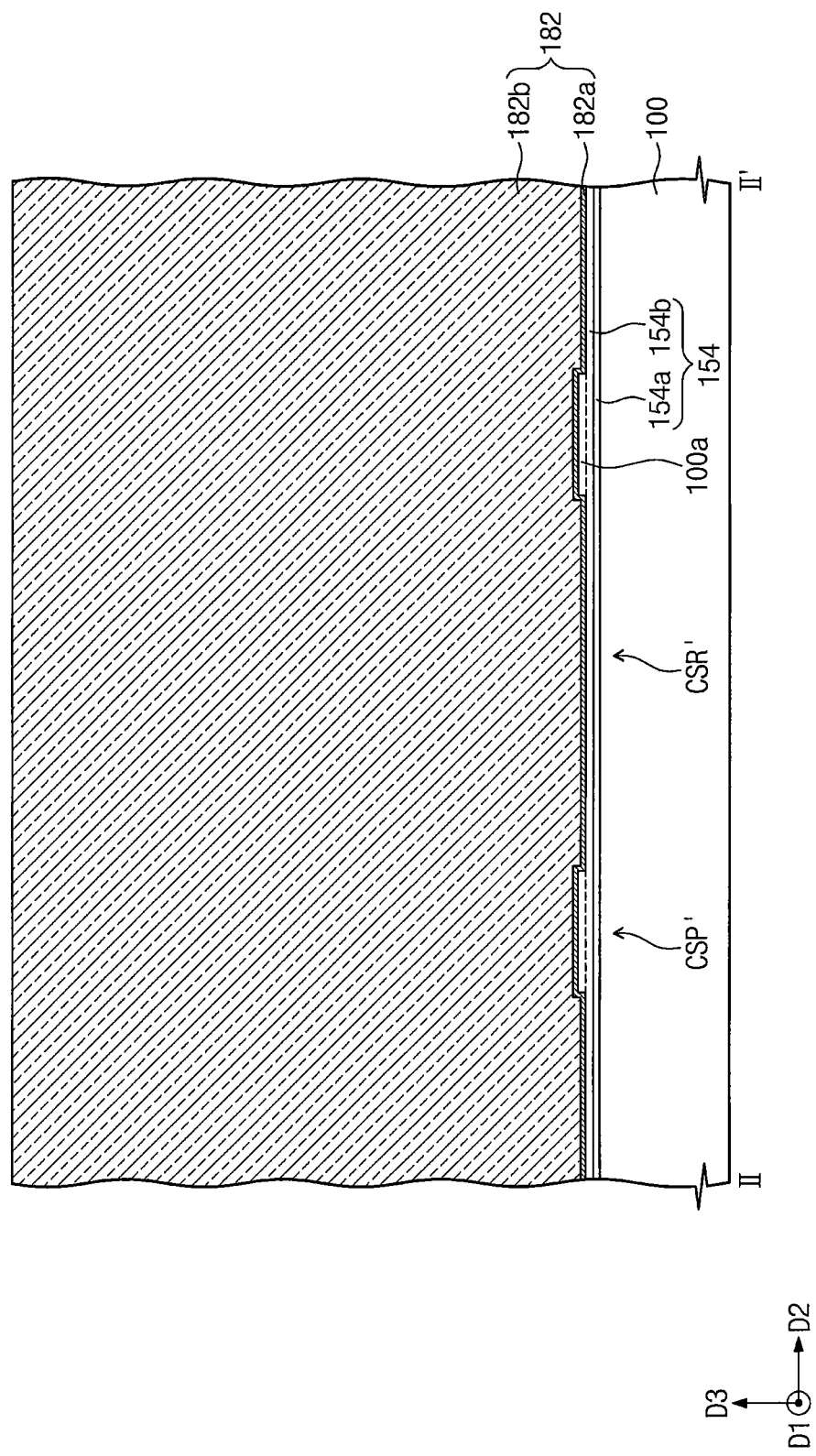

US 9,530,789 B2

SEMICONDUCTOR MEMORY DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0053601, filed on May 2, 2014, in the Korean Intellectual Property Office, the disclosure of which is hereby incorporated by reference in its entirety.

BACKGROUND

The inventive concepts relate to semiconductor memory devices and methods of fabricating the same. More particularly, the inventive concepts relate to three-dimensional (3D) semiconductor memory devices and methods of fabricating the same.

Semiconductor devices are becoming more highly integrated to provide high performance and low costs. The integration density of semiconductor memory devices directly affects the costs of the semiconductor memory devices, thereby resulting in demand for highly integrated semiconductor devices. An integration degree of a conventional two-dimensional (2D) or planar memory device is mainly determined by an area that a unit memory cell occupies. Therefore, the integration density of a conventional 2D memory device may be greatly affected by a technique of forming fine patterns. However, because extremely high-priced apparatuses are needed to form fine patterns, the integration density of 2D memory devices continues to increase but is still limited. Thus, research has been conducted for a 3D semiconductor memory device including memory cells that are vertically arranged.

SUMMARY

Example embodiments of the inventive concepts may provide semiconductor memory devices capable of improving an integration degree and structural and electrical characteristics.

Example embodiments of the inventive concepts may also provide methods of fabricating a semiconductor memory device capable of improving an integration degree and structural and electrical characteristics.

In example embodiments of the inventive concepts, a semiconductor memory device may include: a substrate; a plurality of stack gate structures spaced apart from each other in a first direction parallel to a main surface of the substrate, each of the stack gate structures including insulating layers and gate electrodes that are alternately and repeatedly stacked on the substrate; a plurality of vertical channel structures penetrating each of the stack gate structures; and a source plug line disposed between the stack gate structures, the source plug line being in contact with the substrate and extending in a second direction intersecting the first direction. The substrate being in contact with the source plug line may include a plurality of protruding regions arranged along the second direction. Each of the protruding regions may have a first width, and the protruding regions may be spaced apart from each other by a first distance greater than the first width.

In example embodiments of the inventive concepts, a semiconductor memory device may include: a plurality of stack gate structures disposed on a substrate, each of the stack gate structures including insulating layers and gate electrodes that are alternately and repeatedly stacked on the substrate, and the stack gate structures being spaced apart from each other in a first direction; a plurality of vertical channel structures penetrating each of the stack gate structures; a source plug line disposed between the plurality of stack gate structures, the source plug line including a conductive material and extending in a second direction intersecting the first direction; and a common source region being in contact with the source plug line and disposed in the substrate. The common source region may include: a first dopant region and a second dopant region that are alternately formed along the second direction. The first dopant region may have a first height and the second dopant region may have a second height. The first height may be greater than the second height.

In example embodiments of the inventive concepts, a semiconductor memory device may include: a plurality of vertical channel structures disposed on a substrate and extending in a direction vertical to the substrate; a plurality of stack gate structures surrounding the vertical channel structures and including gate electrodes stacked in the direction vertical to the substrate, the stack gate structures being spaced apart from each other in a first direction parallel to the substrate; and a common source region formed in the substrate and including a plurality of protruding regions that are formed along a second direction intersecting the first direction between the stack gate structures. Each of the protruding regions may have a first width in the second direction, and the protruding regions may be spaced apart from each other by a first distance greater than the first width.

In example embodiments of the inventive concepts, a method of fabricating a semiconductor memory device may include: forming a molding structure including insulating layers and sacrificial layers that are alternately and repeatedly stacked on a substrate; forming a plurality of vertical channel structures penetrating the molding structure; forming a trench in the molding structures, the trench isolating some of the vertical channel structures from others of the vertical channel structures in a first direction parallel to the substrate, and the trench extending in a second direction intersecting the first direction; forming a supporting pattern including a plurality of bridges and fixing portions on the molding structure, the bridges intersecting the trench in the first direction and being spaced apart from each other in the second direction, and the fixing portions being connected to the bridges; removing the sacrificial layers of the molding structure to form openings; forming gate electrodes in the openings, respectively; forming an isolation insulating pattern on a sidewall of the trench; forming a plurality of protruding regions on the substrate exposed by the trench, each of the protruding regions having a first width in the second direction, and the protruding regions being spaced apart from each other by a first distance greater than the first width in the second direction; and forming a source plug line in the trench, the source plug line being in contact with the substrate between the plurality of protruding regions and extending in the second direction.

In example embodiments of the inventive concepts, a method of fabricating a semiconductor memory device may include: forming a plurality of vertical channel structures on a substrate, the vertical channel structures extending in a direction vertical to the substrate; forming a plurality of stack gate structures surrounding the vertical channel structures and including gate electrodes stacked in the direction vertical to substrate, the stack gate structures spaced apart from each other in a first direction parallel to the substrate;

and forming a common source region in the substrate between the plurality of stack gate structures. The common source region may include a first dopant region and a second dopant region that are alternately formed along a second direction intersecting the first direction. The first dopant region may have a first height, and the second dopant region may have a second height smaller than the first height.

BRIEF DESCRIPTION OF THE DRAWINGS

The inventive concepts will become more apparent in view of the attached drawings and accompanying detailed description.

FIGS. 2A and 2B are cross-sectional views taken along lines I-I' and II-II' of FIG. 1A, respectively, to illustrate a semiconductor memory device according to an example embodiment of the inventive concepts;

FIGS. 5A and 5B are cross-sectional views taken along lines I-I' and II-II' of FIG. 1A, respectively, to illustrate a semiconductor memory device according to an example embodiment of the inventive concepts;

FIGS. 6A and 6B are cross-sectional views taken along lines I-I' and II-II' of FIG. 1A, respectively, to illustrate a semiconductor memory device according to an example embodiment of the inventive concepts;

FIGS. 9, 10, 11A, 12, 13, 14A to 21A, and 14B to 21B are cross-sectional views illustrating some processes of a method of fabricating a semiconductor memory device according to an example embodiment of the inventive concepts;

FIGS. 19C and 19D are enlarged views of portions and 'C' of FIG. 19B, respectively;

FIGS. 24B and 25B are cross-sectional views taken along a line II-II' of FIG. 1A to illustrate some processes of a method of fabricating the semiconductor memory device of FIGS. 7A, 7B, 8A, and 8B;

DETAILED DESCRIPTION OF THE EMBODIMENTS

Figure 1A:
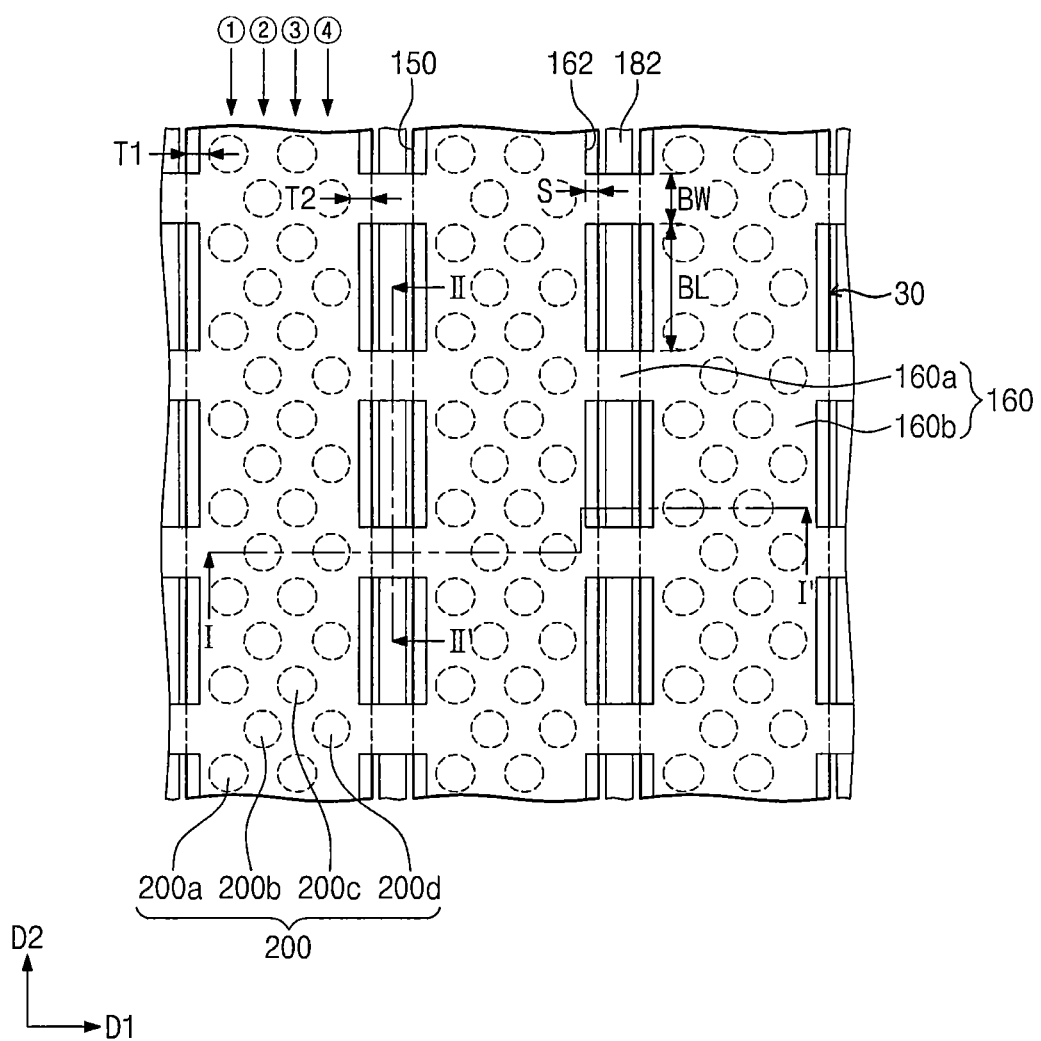
FIG. 1A is a plan view illustrating a semiconductor memory device according to an example embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
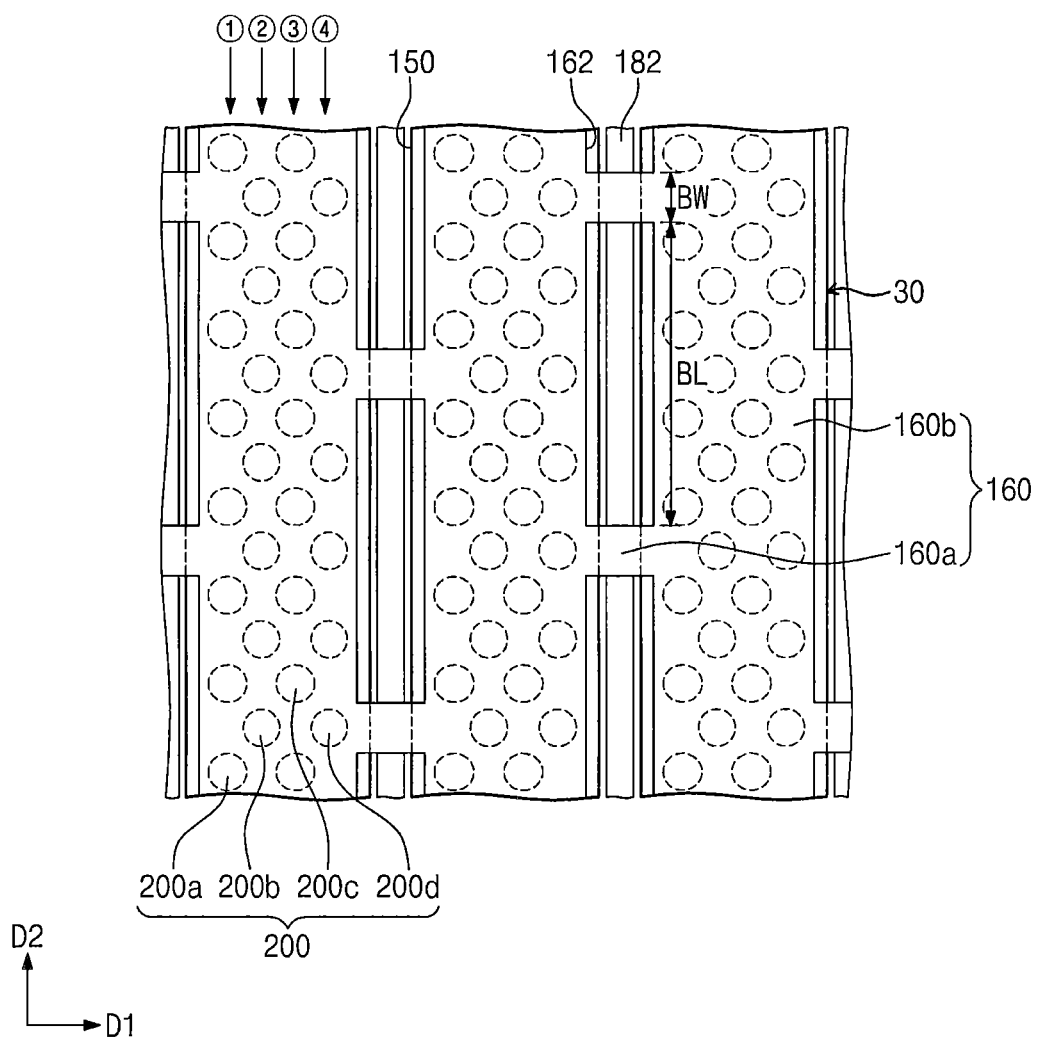
FIG. 1B is a plan view illustrating an embodiment of a supporting pattern included in a semiconductor memory device according to an example embodiment of the inventive concepts.
Figure 2B:
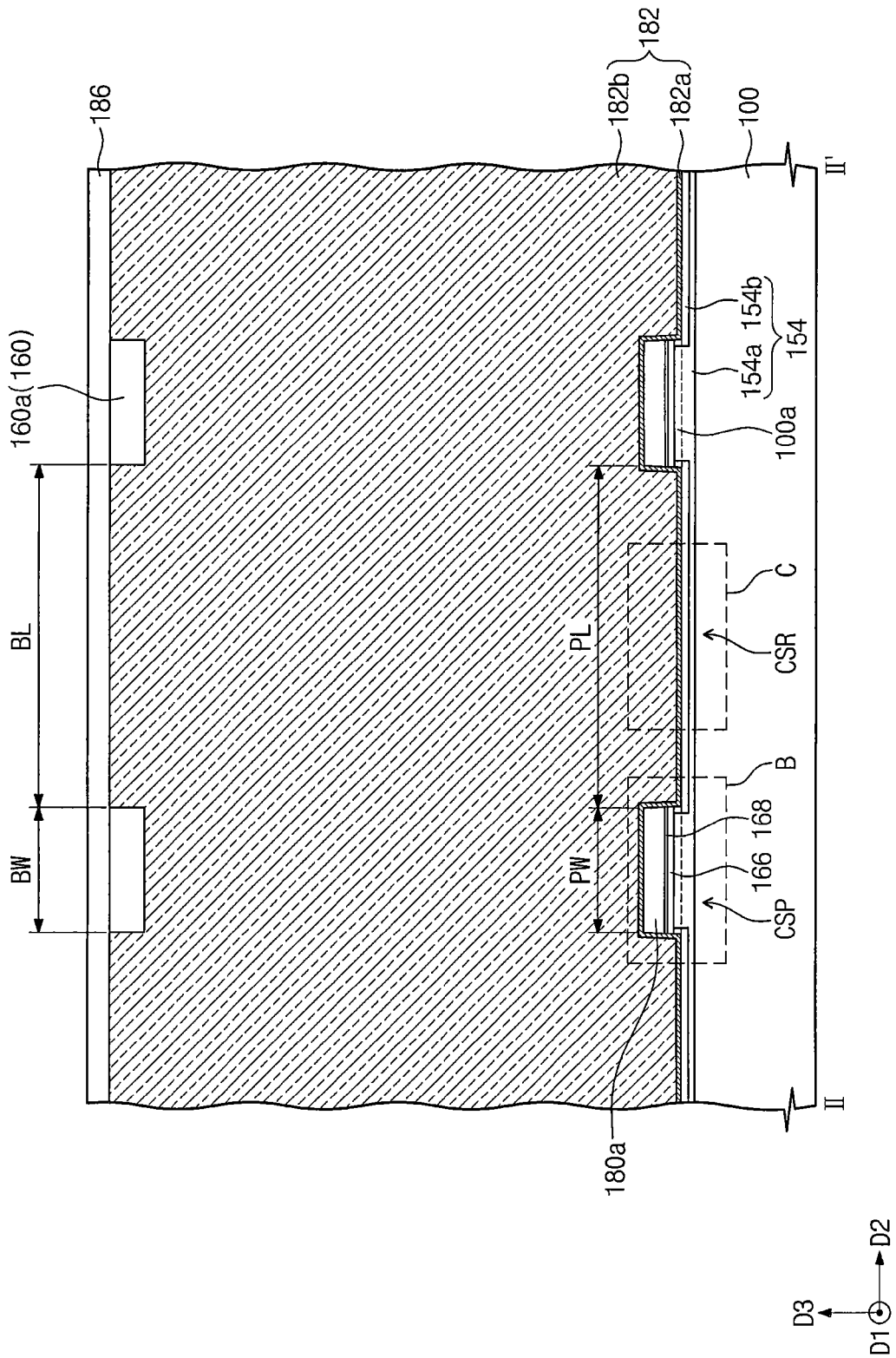
Figure 3A:
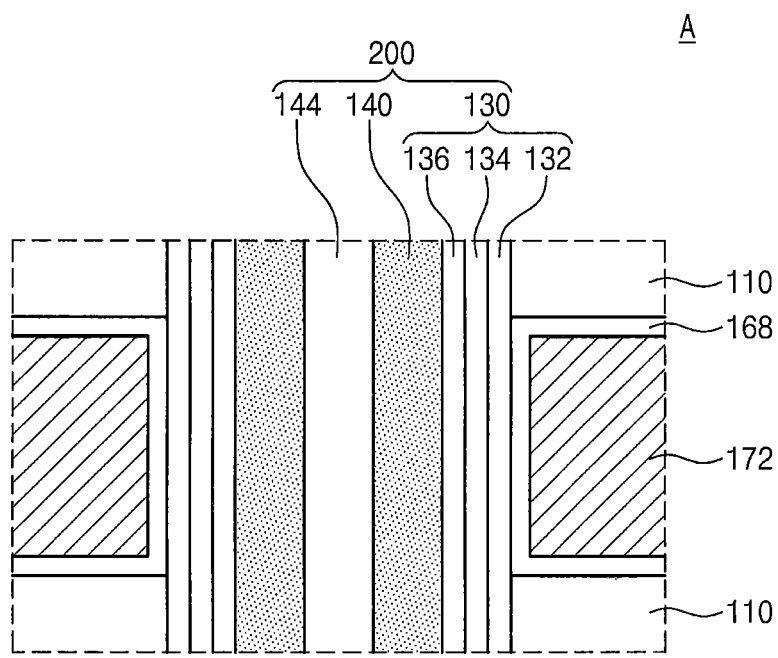
FIG. 3A is an enlarged view of a portion 'A' of FIG. 2A.
Figure 3B:
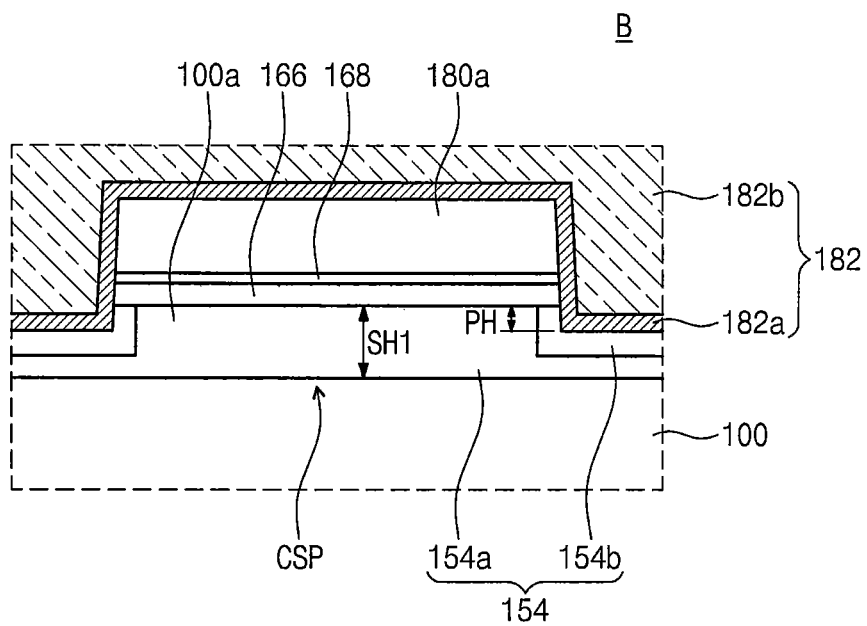
FIGS. 3B and 3C are enlarged views of portions 'B' and 'C' of FIG. 2B, respectively.
Figure 3C:
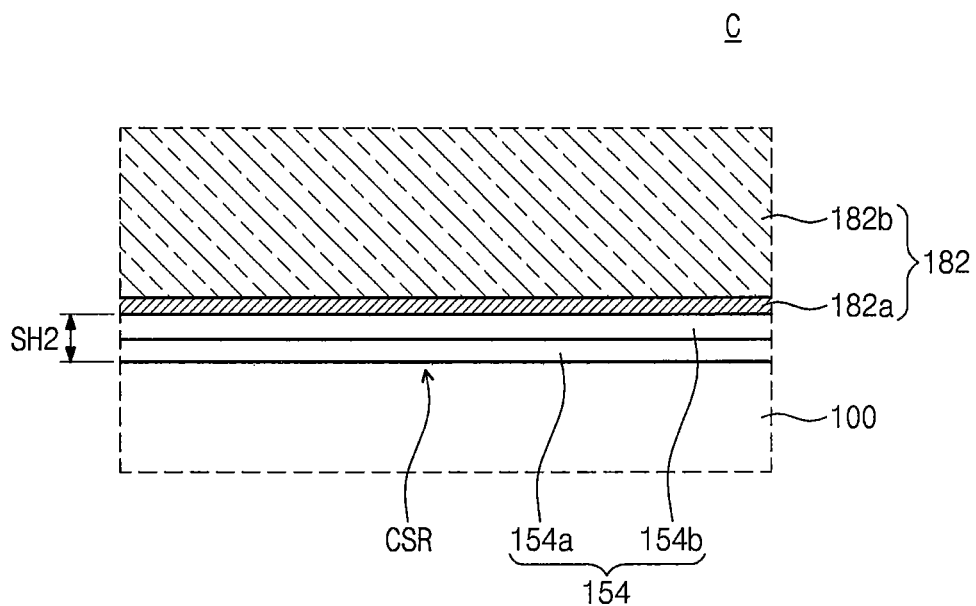
Figure 4:
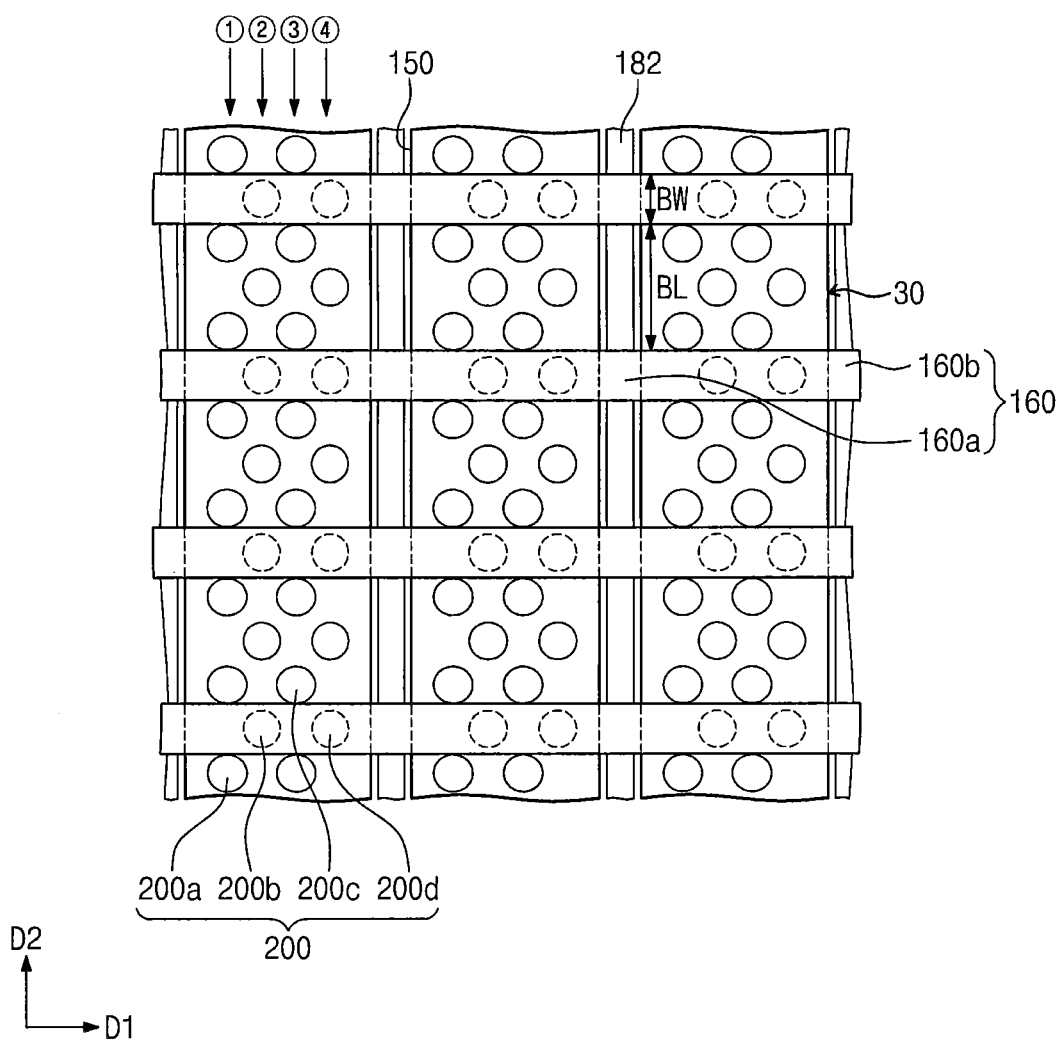
FIG. 4 is a plan view illustrating another embodiment of a supporting pattern included in a semiconductor memory device according to an example embodiment of the inventive concepts.

FIG. 1A is a plan view illustrating a semiconductor memory device according to an example embodiment of the inventive concepts. FIG. 1B is a plan view illustrating an embodiment of a supporting pattern included in a semiconductor memory device according to an example embodiment of the inventive concepts. FIGS. 2A and 2B are cross-sectional views taken along lines I-I' and II-II' of FIG. 1A, respectively. FIG. 3A is an enlarged view of a portion 'A' of FIG. 2A, and FIGS. 3B and 3C are enlarged views of portions 'B' and 'C' of FIG. 2B, respectively. FIG. 4 is a plan view illustrating another embodiment of a supporting pattern included in a semiconductor memory device according to an example embodiment of the inventive concepts.

Referring to FIGS. 1A to 3C, a semiconductor memory device according to an example embodiment may include a stack gate structure 30 and vertical channel structures 200. The stack gate structure 30 may include insulating layers 110 and gate electrodes 172 that are alternately and repeatedly stacked on a substrate 100. The vertical channel structures 200 may penetrate the stack gate structure 30 and may be spaced apart from each other in a first direction D1 parallel to a main surface of the substrate 100. The vertical channel structures 200 may extend from the substrate 100 in a third direction D3 perpendicular to the main surface of the substrate 100. The substrate 100 may include a semiconductor material. For example, the substrate 100 may be a silicon single-crystalline substrate, a germanium single-crystalline substrate, or a silicon-germanium single-crystalline substrate. Alternatively, the substrate 100 may be a silicon-on-insulator (SOI) substrate. For example, the substrate 100 may include a semiconductor layer (e.g., a silicon layer, a silicon-germanium layer, or a germanium layer) disposed on an insulating layer that protects transistors provided on a semiconductor substrate. The substrate 100 may be a semiconductor substrate having a first conductivity type (e.g., a P-type).

As illustrated in FIG. 1A, the stack gate structure 30 may have a linear shape extending in a second direction D2 that intersects the first direction D1 and is parallel to the main surface of the substrate 100. For example, the insulating layers 110 and the gate electrodes 172, which are included in the stack gate structure 30, may be linear patterns extending in the second direction D2. The insulating layers 110 may be stacked on the substrate 100 in the third direction D3. Thicknesses of the insulating layers 110 may be less than those of the gate electrodes 172. In other embodiments, a thickness of at least one of the insulating layers 110 may be greater than that of each of the gate electrodes 172. For example, an insulating layer 110b secondly stacked from the substrate 100, an uppermost insulating layer 110d, and an insulating layer 110c directly adjacent to the uppermost insulating layer 110d may be thicker than the gate electrodes 172. In still other embodiments, the thicknesses of the insulating layers 110 may be about equal to those of the gate electrodes 172. A lowermost insulating layer 110a in contact with the substrate 100 may be thinner than other insulating layers 110b, 110c, and 110d disposed thereon. Each of the insulating layers 110 may include, for example, a silicon oxide layer.

The gate electrodes 172 may be stacked in the third direction D3 and may be disposed between the insulating layers 110. The gate electrodes 172 may include control gate electrodes of memory cells included in a three-dimensional (3D) semiconductor memory device (e.g., a vertical NAND flash memory device). For example, the gate electrodes 172b disposed between an uppermost gate electrode 172c and a lowermost gate electrode 172a may be word lines corresponding to the control gate electrodes. The control gate electrodes 172b may be coupled to the vertical channel structures 200 to form the memory cells. Thus, vertical memory cell strings may be provided on the substrate 100. Each of the vertical memory cell strings may include the memory cells arranged in the third direction D3.

The lowermost and uppermost gate electrodes 172a and 172c may be used as gate electrodes of selection transistors. For example, the uppermost gate electrode 172c may be used as a gate electrode of a string selection transistor controlling electrical connection between a bit line (not shown) and the vertical channel structures 200, and the lowermost gate electrode 172a may be used as a gate electrode of a ground selection transistor controlling electrical connection between a common source region 154 formed in the substrate 100 and the vertical channel structures 200.

The gate electrodes 172 may surround the vertical channel structure 200. Each of the gate electrodes 172 may include a gate conductive layer. The gate conductive layer may include a metal silicide layer, a metal layer, a metal nitride layer, or any combination thereof. For example, the metal silicide layer may include at least one of cobalt silicide, titanium silicide, tungsten silicide, or tantalum silicide. The metal layer may include at least one of, but not limited to, tungsten, nickel, cobalt, titanium, or tantalum. For example, the metal nitride layer may include at least one of titanium nitride, tungsten nitride, or tantalum nitride.

The vertical channel structures 200 may penetrate each of the stack gate structures 30 so as to be electrically connected to the substrate 100. Referring to FIG. 1A, the vertical channel structures 200 coupled to each of the stack gate structures 30 may be arranged along a first column 1 and a second column 2 that are parallel to the second direction D2. First vertical channel structures 200a of the first column 1 may be spaced apart from second vertical channel structures 200b of the second column 2 in the first direction D1. The first and second vertical channel structures 200 may be arranged in a zigzag form. The first vertical channel structures 200a and the second vertical channel structures 200b are not symmetric in the first direction D1. For example, the first vertical channel structures 200a may be respectively shifted from the second vertical channel structures 200b by half the pitch, in the second direction D2, of the second vertical channel structures 200b.

In addition, third and fourth vertical channel structures 200c and 200d of third and fourth columns 3 and 4 may be further coupled to each of the stack gate structures 30. The third and fourth vertical channel structures 200c and 200d may be disposed at a side of the first and second vertical channel structures 200a and 200b in the first direction D1. The first and third vertical channel structures 200a and 200c may be symmetric with respect to the second column 2. The second and fourth vertical channel structures 200b and 200d may be symmetric with respect to the third column 3. A group consisting of the vertical channel structures 200 arranged along the four columns may be repeatedly disposed in the first direction D1. A source plug line 182 may be disposed between the groups adjacent to each other when viewed from a plan view. However, the inventive concepts are not limited to the vertical channel structures 200 arranged along the four columns. In other embodiments, the vertical channel structures 200 may be arranged along columns of which the number is different from four. For example, the number of the columns may be two or may be greater than or equal to five.

The vertical channel structures 200 may penetrate a plurality of the gate electrodes 172. The gate electrodes 172 may surround the vertical channel structures 200. Each of the vertical channel structures 200 may include a first vertical channel pattern 128, a data storage pattern 130, a second vertical channel pattern 140, and a filling insulation pattern 144. The data storage pattern 130, the second vertical channel pattern 140, and the filling insulation pattern 144 may be disposed on the first vertical channel pattern 128.

The first vertical channel pattern 128 may extend into the substrate 100. A portion of the first vertical channel pattern 128 may be disposed in the substrate 100, and another portion of the first vertical channel pattern 128 may have a pillar shape that is vertically protruding from the substrate 100. The first vertical channel pattern 128 may be disposed in a lower portion of the stack gate structure 30. For example, a top surface of the first vertical channel pattern 128 may be higher than a top surface of the lowermost gate electrode 172a adjacent to the substrate 100 (e.g., a top surface of the gate electrode of the ground selection transistor). The first vertical channel pattern 128 may include a semiconductor material. For example, the first vertical channel pattern 128 may include at least one of silicon (Si), germanium (Ge), silicon-germanium (SiGe), III-V group compounds, or II-VI group compounds. For example, the first vertical channel pattern 128 may be an epitaxial layer including single-crystalline silicon. The first vertical channel pattern 128 may include an undoped semiconductor material, or a semiconductor material doped with dopants of which a conductivity type is the same as that of the substrate 100.

A gate oxide layer 164 may be disposed on a sidewall of the first vertical channel pattern 128. The gate oxide layer 164 may be disposed between the lowermost gate electrode 172a and the first vertical channel pattern 128.

The second vertical channel pattern 140 extending in the third direction D3 may be disposed on the first vertical channel pattern 128. The second vertical channel pattern 140 may be electrically connected to the first vertical channel pattern 128. The second vertical channel pattern 140 may be disposed between the data storage pattern 130 and the filling insulation pattern 144. The second vertical channel pattern 140 may have a hollow macaroni shape with an opened top end. In some embodiments, the second vertical channel pattern 140 may have a pipe shape with opened top and bottom ends. In other embodiments, the second vertical channel pattern 140 may have a filled cylinder shape, and the filling insulation pattern 144 may be omitted. The second vertical channel pattern 140 may include a poly-crystalline semiconductor material, an amorphous semiconductor material, or a single-crystalline semiconductor material. For example, the second vertical channel pattern 140 may include at least one of silicon (Si), germanium (Ge), silicon-germanium (SiGe), III-V group compounds, or II-VI group compounds. For example, the second vertical channel pattern 140 may be an epitaxial layer including single-crystalline silicon or poly-crystalline silicon. For example, the second vertical channel pattern 140 may include an undoped semiconductor material, or a semiconductor material doped with dopants of which a conductivity type is the same as that of the substrate 100.

The data storage pattern 130 may be disposed between the stack gate structure 30 and the second vertical channel pattern 140. The data storage pattern 130 may have open top and bottom ends. The data storage pattern 130 may include a thin layer capable of storing data. For example, data stored in the data storage pattern 130 may be changed using the Fowler-Nordheim tunneling effect caused by a voltage difference between the vertical channel structure 200 and the gate electrodes 172. However, the inventive concepts are not limited thereto. Alternatively, the data storage pattern 130 may have a thin layer capable of storing data based on another operation principle (e.g., a thin layer used for a phase change memory device or a thin layer used for a variable resistance memory device).

Referring to FIG. 3A, the data storage pattern 130 may include a first blocking dielectric layer 132 adjacent to the gate electrodes 172, a tunnel dielectric layer 136 adjacent to the second vertical channel pattern 140, and a charge storage layer 134 disposed between the first blocking dielectric layer 132 and the tunnel dielectric layer 136. The tunnel dielectric layer 136 may include, for example, a silicon oxide layer. The charge storage layer 134 may include a trap dielectric layer, or a dielectric layer including conductive nano dots. The trap dielectric layer may contain, for example, a silicon nitride layer. The first blocking dielectric layer 132 may include a silicon oxide layer and/or a high-k dielectric layer (e.g., an aluminum oxide layer or a hafnium oxide layer). The first blocking dielectric layer 132 may include a single layer or a plurality of thin layers. In some embodiments, the first blocking dielectric layer 132 may be a single layer having the silicon oxide layer. In other embodiments, the first blocking dielectric layer 132 may include a plurality of thin layers including at least two of the silicon oxide layer, the aluminum oxide layer, or the hafnium oxide layer.

A second blocking dielectric layer 168 may be additionally provided between the stack gate structure 30 and the second vertical channel pattern 140 and may extend between the insulating layers 110 and the gate electrodes 172. For example, the second blocking dielectric layer 168 may extend in a direction that is substantially horizontal to the substrate 100 to cover top surfaces and bottom surfaces of the gate electrodes 172. For example, the second blocking dielectric layer 168 may be single-layered or multi-layered. For example, the second blocking dielectric layer 168 may include a high-k dielectric layer (e.g., an aluminum oxide layer and/or a hafnium oxide layer). In some embodiments, the second blocking dielectric layer 168 may not be formed.

The filling insulation pattern 144 may fill an inner space of the vertical channel structure 200. The filling insulation pattern 144 may include a silicon oxide layer or a silicon nitride layer.

A conductive pad 146 may be disposed on each of the vertical channel structures 200. The conductive pad 146 may include a conductive material. Alternatively, the conductive pad 146 may be a dopant region doped with dopants. One end, which is in contact with the conductive pad 146, of the vertical channel structure 200 may be a drain region. A pad protecting layer 148 may be disposed on the stack gate structures 30 to cover the conductive pad 146.

A first trench 150 may be disposed between the stack gate structures 30 to separate the stack gate structures 30 from each other. For example, the first trench 150 may be formed between the groups of which each consists of the vertical channel structures 200 of the four columns disposed along the first direction D1. The first trench 150 may extend from a top surface of the pad protecting layer 148 into the substrate 100. Thus, the first trench 150 may include a recess region 150R extending into the substrate 100. The substrate 100 may be over-etched to form the recess region 150R when the first trench 150 is formed. The recess region 150R may have a positively sloped sidewall.

A buffer oxide layer 166 may be disposed in the recess region 150R. For example, the buffer oxide layer 166 may be formed on a sidewall and a bottom surface of the recess region 150R. The buffer oxide layer 166 and the gate oxide layer 164 may be formed by the same oxidation process at the same time. The second blocking dielectric layer 168 may also be provided on the buffer oxide layer 166. The second blocking dielectric layer 168 may be conformally formed in the recess region 150R.

The common source region 154 may be formed in the substrate 100 and may surround the recess region 150R. In other words, the common source region 154 may be disposed between the stack gate structures 30 when viewed from a plan view. For example, the common source region 154 may extend along the second direction D2 in the substrate 100 exposed by the first trench 150. In other words, the common source region 154 may be disposed between the stack gate structures 30 to extend in the second direction D2 when viewed from a plan view. The common source region 154 may include dopants of which a second conductivity is different from the first conductivity type of the substrate 100. For example, the common source region 154 may include N-type dopants, such as arsenic (As) or phosphorus (P). The common source region 154 may include a first dopant region 154a and a second dopant region 154b. For example, the first dopant region 154a may be a low-concentration dopant region, and the second dopant region 154b may be a high-concentration dopant region. For example, a dopant concentration of the first dopant region 154a may be in a range of about $10^{14}$ atoms/cm$^3$ to about $10^{17}$ atoms/cm$^3$, and a dopant concentration of the second dopant region 154b may be in a range of about $10^{19}$ atoms/cm$^3$ to about $10^{21}$ atoms/cm$^3$.

Referring to FIGS. 2B and 3B, the substrate 100 in which the common source region 154 is formed may include a plurality of protruding regions 100a arranged along the second direction D2. The protruding regions 100a may have top surfaces that are disposed at a height PH from a top surface of the substrate 100 disposed between the protruding regions 100a. In other words, the protruding regions 100a may have the height PH. For example, the protruding regions 100a may be spaced apart from each other in the second direction D2 at a distance PL, and each of the protruding regions 100a may have a width PW in the second direction D2. In some embodiments, the distance PL may be several times to several ten times greater than the width PW. The common source region 154 formed in the substrate 100 including the protruding regions 100a may include protruding common source regions CSP and recess common source regions CSR. The protruding common source regions CSP may be defined as dopant regions that are formed in the protruding regions 100a and the substrate 100 under the protruding regions 100a. Each of the recess common source regions CSR may be defined as a dopant region that is formed in the substrate 100 disposed between the protruding regions 100a. Thus, each of the protruding common source regions CSP may have the width PW in the second direction D2, and the protruding common source regions CSP may be spaced apart from each other in the second direction D2 by the distance PL substantially corresponding to a width of the recess common source region CSR. The protruding common source region CSP may include the first dopant region 154a, and the recess common source region CSR may include the first dopant region 154a and the second dopant region 154b. The second dopant region 154b may extend into a portion of the protruding common source region CSP. The first dopant region 154a of the common source region 154 may continuously extend in the second direction D2. The second dopant regions 154b may be discontinuously arranged along the second direction D2. For example, the second dopant regions 154b arranged along the second direction D2 may be spaced apart from each other. The first dopant region 154a may include regions of which heights are different from each other. For example, the first dopant region 154a may have first regions and second regions that are alternately arranged in the second direction D2. The first regions have a first height, and the second regions have a second height different from the first height. In some embodiments, the first dopant region 154a may have a first height SH1 in each of the protruding common source regions CSP and may have a second height SH2 in each of the recess common source regions CSR. The first height SH1 may be greater than the second height SH2. The second dopant region 154b may be formed in the first dopant region 154a. However, the inventive concepts are not limited thereto. In other embodiments, the second dopant region 154b may penetrate the first dopant region 154a and may extend into the substrate 100.

Insulating layers including a lower isolation insulating pattern 180a may be disposed on each of the protruding common source regions CSP. For example, the buffer oxide layer 166, the second blocking dielectric layer 168, and the lower isolation insulating pattern 180a may be sequentially stacked on the protruding region 100a of the substrate 100. Sidewalls of the lower isolation insulating pattern 180a, the second blocking dielectric layer 168, and the buffer oxide layer 166 may be substantially aligned with a sidewall of the protruding region 100a. Thus, widths (e.g., PW) of the lower isolation insulating pattern 180a, the second blocking dielectric layer 168, and the buffer oxide layer 166 may be substantially equal to or similar to each other in the second direction D2. In addition, the lower isolation insulating patterns 180a (or the second blocking dielectric layers 168 or the buffer oxide layers 166) respectively disposed on the protruding regions 100a may be spaced apart from each other by a distance that is substantially equal or similar to the distance PL.

As illustrated in FIG. 2A, the lower isolation insulating pattern 180a and an isolation insulating pattern 180 may constitute one united body, and the lower isolation insulating patterns 180a may correspond to a bottom portion of the isolation insulating pattern 180. The lower isolation insulating pattern 180a may fill at least a portion of the recess region 150R and may be disposed on the first dopant region 154a. The buffer oxide layer 166 and the second blocking dielectric layer 168 disposed under the lower isolation insulating pattern 180a may be disposed in the recess region 150R.

The isolation insulating pattern 180 may be disposed between the stack gate structure 30 and the source plug line 182. For example, the isolation insulating pattern 180 may be disposed between the source plug line 182 and the gate electrodes 172. The isolation insulating pattern 180 may partially fill the first trench 150 and the recess region 150R and may be in contact with the gate electrodes 172. The isolation insulating pattern 180 may fill spaces formed between the insulating layers 110 to protect sidewalls of the gate electrodes 172. A slit-shaped opening may penetrate the isolation insulating pattern 180, and the source plug line 182 may be disposed in the slit-shaped opening. In the second direction D2, a portion of the isolation insulating pattern 180 may remain as the lower isolation insulating pattern 180a on the substrate 100 and another portion of the isolation insulating pattern 180 may be removed along with other insulating layers (e.g., the buffer oxide layer 166 and the second blocking dielectric layer 168) to expose the common source region 154. The isolation insulating pattern 180 may include a nitride layer, an oxynitride layer, or an oxide layer.

The source plug line 182 may be disposed on the common source region 154. The source plug line 182 may be disposed in the first trench 159. In addition, the source plug line 182 may extend into the recess region 150R so as to be connected to the common source region 154. The source plug line 182 may reduce a resistance of the common source region 154. The source plug line 182 may be a line-shaped pattern that continuously extends in the second direction D2. The source plug line 182 may penetrate the second blocking dielectric layer 168 and the buffer oxide layer 166 so as to be connected to the common source region 154. A portion of a bottom surface of the source plug line 182 may be in contact with the common source region 154, and another portion of the source plug line 182 may be separated and spaced apart from the common source region 154. For example, the source plug line 182 may be in contact with top surfaces of the recess common source regions CSR and may be spaced apart from top surfaces of the protruding common source regions CSP by the plurality of insulating layers 180a, 168, and 166. The source plug line 182 may be in contact with a portion of the sidewall of the protruding common source region CSP. In other words, a portion of the bottom surface of the source plug line 182 may be in direct contact with the lower isolation insulating patterns 180a, and another portion of the bottom surface of the source plug line 182 may be in direct contact with the second dopant regions 154b of the common soured region 154. The source plug line 182 may include a conductive material. For example, the source plug line 182 may include a barrier layer 182a and a conductive layer 182b. For example, the barrier layer 182a may be in contact with the second dopant region 154b and may surround a sidewall and a bottom surface of the conductive layer 182b.

The barrier layer 182a may include at least one of a metal and a metal nitride. For example, the barrier layer 182a may include at least one of titanium (Ti), tantalum (Ta), titanium nitride (TiN), tungsten nitride (WN), tantalum nitride (TaN), or any combination thereof. The conductive layer 182b may include, for example, a metal such as tungsten or copper. A silicide layer (not shown) may be formed between the source plug line 182 and the common source region 154.

A supporting pattern 160 may be disposed on the stack gate structures 30. In some embodiments, the supporting pattern 160 crossing over the source plug line 182 may be disposed on the pad protecting layer 148. As illustrated in FIG. 1A, the supporting pattern 160 may include fixing portions 160b disposed on the stack gate structures 30 and a plurality of bridges 160a connecting the fixing portions 160b to each other. The fixing portions 160b may prevent the stack gate structures 30 from leaning. Each of the bridges 160a may have a width BW in the second direction D2. For example, the width BW may be substantially equal to or similar to the width PW of the protruding region 100a. The bridges 160a may be spaced apart from each other in the second direction D2 by, for example, a distance BL that is substantially equal to or similar to the distance PL between the protruding regions 100a. Thus, a second trench 162 having a width BL in the second direction D2 may be provided in the supporting pattern 160. The second trench 162 may have a slit shape. In the first direction D1, a width of the second trench 162 may be greater than that of the first trench 150. A difference between the widths of the second and first trenches 162 and 150 may be twice a distance S illustrated in FIG. 1A. Thus, the source plug line 182 may fill the second trench 162 between the bridges 160a, and the width in the first direction D1 of the source plug line 182 filling the second trench 162 may be greater than that of the source plug line 182 disposed under the bridge 160a. The bridges 160a may intersect the source plug line 182 along the first direction D1 on the source plug line 182.

In some embodiments, the bridges 160a may be arranged in a zigzag form, as illustrated in FIG. 1B. For example, the bridges 160a adjacent to each other in the first direction D1 may not be symmetric. Thus, the protruding regions 100a of neighboring common source regions 154 may not be symmetric but may be arranged in a zigzag form in the first direction D1. In some embodiments, the supporting pattern 160 may have a linear shape extending in the first direction D1, as illustrated in FIG. 4. The supporting pattern 160 may include a plurality of bridges 160a arranged along the second direction D2 and a plurality of fixing portions 160b extending from the bridges 160a onto the stack gate structures 30. The bridges 160a and the fixing portions 160b may connect the stack gate structures 30 to each other. The fixing portions 160b may have the same linear shape as the bridges 160a. However, the inventive concepts are not limited thereto. In other embodiments, widths of the fixing portions 160b may be greater than those of the bridges 160a or may have various shapes. Each of the bridges 160a may have a width BW in the second direction D2. The bridges 160a may be spaced apart from each other by a distance BL in the second direction D2. The supporting pattern 160 may include at least one of an oxide layer, a nitride layer, an oxynitride layer, an undoped poly-silicon layer, or any combination thereof. The supporting pattern 160 may be formed using a chemical vapor deposition (CVD) process or an atomic layer deposition (ALD) process.

An upper interlayer insulating layer 186 may be disposed on the supporting pattern 160. The upper interlayer insulating layer 186 may include an oxide layer, an oxynitride layer, or a nitride layer. A drain contact 190 may be provided in a drain contact hole 188 that penetrate the upper interlayer insulating layer 186, the supporting pattern 160, and the pad protecting layer 148. The drain contact 190 may be connected to the conductive pad 146. The drain contact 190 may be connected to a bit line (not shown). The drain contact 190 may include a conductive material, such as a metal, a metal nitride, or poly-silicon doped with dopants.

The supporting pattern 160 of the semiconductor memory device according to the embodiment may prevent the gate electrodes 172 from leaning in the first direction D1 by non-uniformity of shapes of the gate electrodes 172. For example, as illustrated in FIGS. 1A and 2A, the gate electrodes 172 may be patterned in such a way that a distance T1 from a left sidewall of the stack gate structure 30 to the first vertical channel structure 200a of the first column 1 nearest to the left sidewall is greater than a distance T2 from a right sidewall of the stack gate structure 30 to the fourth vertical channel structure 200d of the fourth column 4 nearest to the right sidewall. In this case, an entire amount of the gate electrodes 172 located at a left side of the first vertical channel structures 200a of the first column 1 may be greater than an entire amount of the gate electrodes 172 located at a right side of the fourth vertical channel structures 200d of the fourth column 4. The balance of the stack gate structures 30 may collapse by the left and right asymmetrical amount of the gate electrodes 172, so the stack gate structures 30 may lean. The leaning phenomenon of the stack gate structure 30 may become more serious as the number of stacked gate electrodes 172 increases. Thus, the supporting pattern 160 may be provided to prevent the leaning phenomenon of the stack gate structures 30. The leaning phenomenon of the stack gate structures 30 may be prevented by the bridges 160a of the supporting pattern 160, thereby preventing a bad connection between the conductive pad 146 and the drain contact 190 and a bad connection between the source plug line 182 and the common source region 154. Thus, structural stability and electrical reliability of the semiconductor memory device may be improved.

Figure 5B:
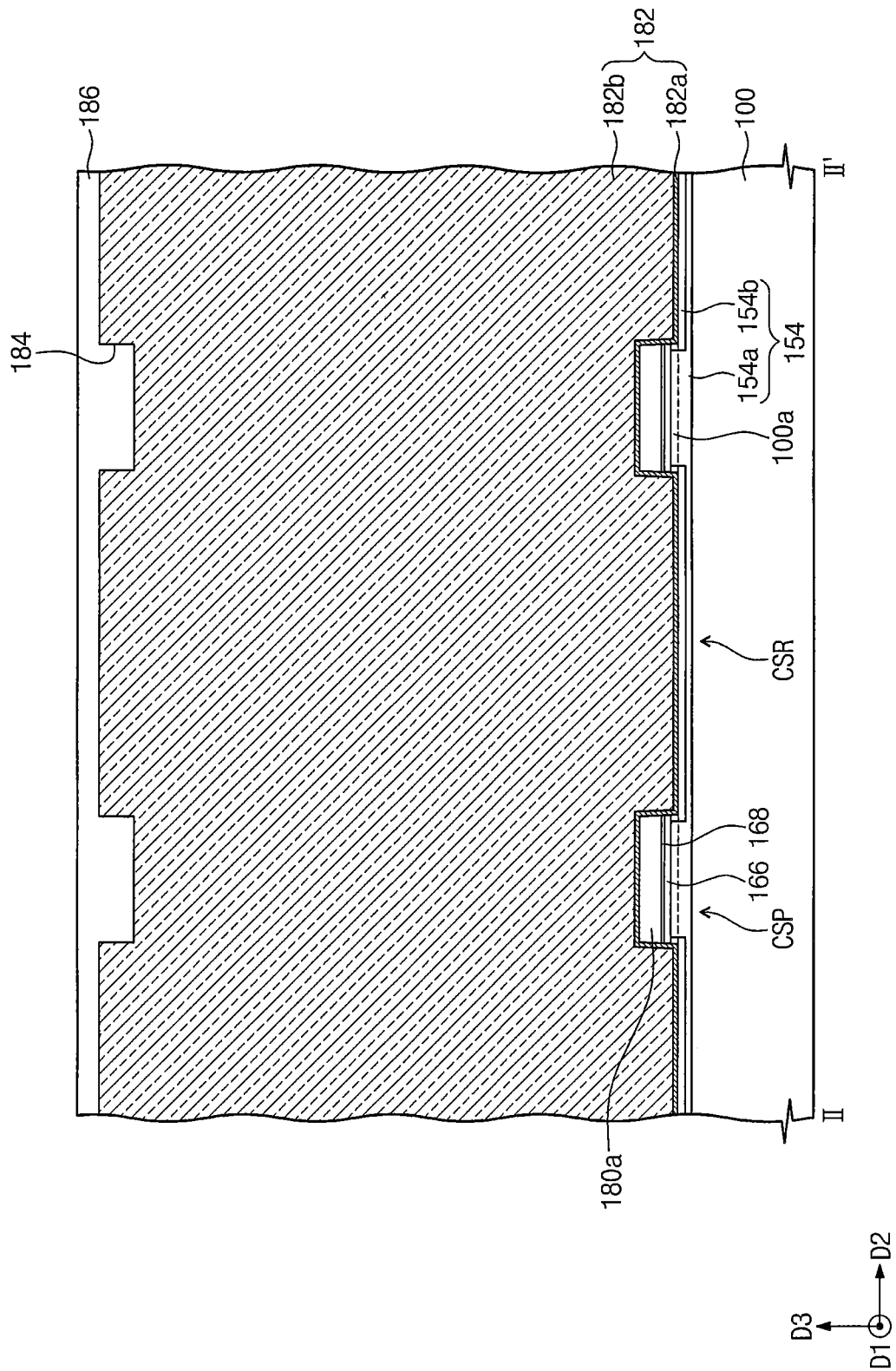

FIGS. 5A and 5B are cross-sectional views taken along lines I-I' and of FIG. 1A, respectively, to illustrate a semiconductor memory device according to an example embodiment of the inventive concepts. Hereinafter, the descriptions to the same elements as described with reference to FIGS. 1A to 4 will be omitted or described briefly. In other words, differences between the present embodiment and the aforementioned embodiments will be primarily described.

Referring to FIGS. 1A, 5A, and 5B, a semiconductor memory device according to an example embodiment may include an upper interlayer insulating layer 186 that is disposed on the pad protecting layer 148 and covers the source plug line 182. For example, the upper interlayer insulating layer 186 may be disposed on a structure that is formed by selectively removing the supporting pattern 160 of the semiconductor memory device described with reference to FIGS. 1A to 4. Thus, the upper interlayer insulating layer 186 may be in contact with the pad protecting layer 148 and may fill bridge groove regions 184 that are formed by removing the bridges 160a of the supporting pattern 160. In addition, the upper interlayer insulating layer 186 may cover the source plug line 182. The bridge groove regions 184 may be arranged in the second direction D2 on the source plug line 182. Thus, a top surface of the source plug line 182 may not be flat. In some embodiments, the isolation insulating pattern 180 and the second blocking dielectric layer 168, which are disposed on an upper portion of the sidewall of the source plug line 182, may be removed. The bridge groove region 184, the lower isolation insulating pattern 180a, and the protruding region 100a of the substrate 100 may substantially overlap with each other when viewed from a plan view. In other words, the bridge groove region 184, the lower isolation insulating pattern 180a, and the protruding region 100a of the substrate 100 may substantially vertically overlap with each other. For example, a sidewall of the bridge groove region 184, the sidewall of the lower isolation insulating pattern 180a, and the sidewall of the protruding region 100a may be substantially aligned with each other. A portion of the bottom surface of the source plug line 182 may be in contact with the lower isolation insulating pattern 180a disposed on the protruding region 100a of the substrate 100. Another portion of the bottom surface of the source plug line 182 may be in contact with the second dopant region 154b and may extend in the second direction D2. The buffer oxide layer 166 and the second blocking dielectric layer 168 may be disposed between the lower isolation insulating pattern 180a and the protruding region 100a.

Figure 6A:
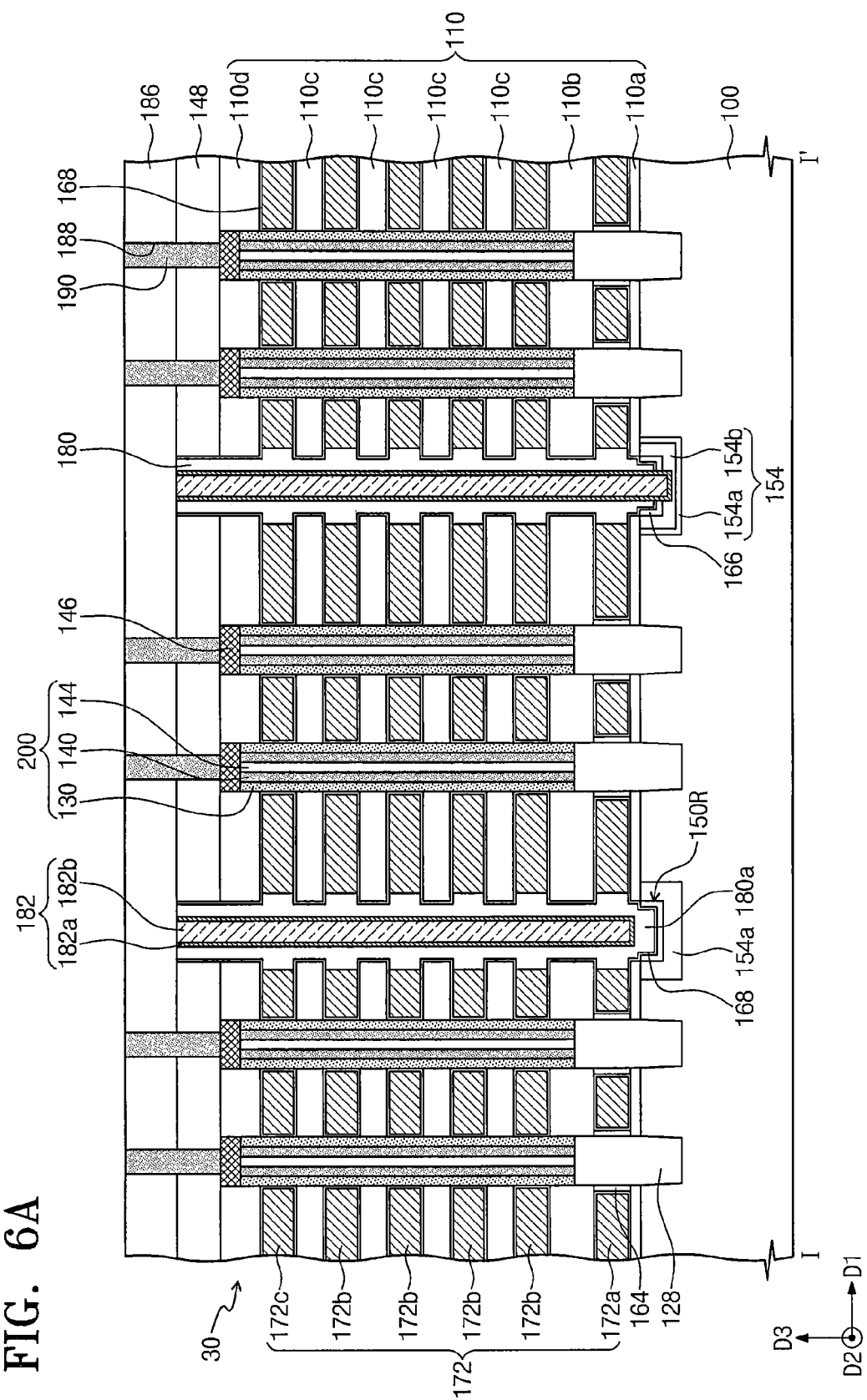

FIGS. 6A and 6B are cross-sectional views taken along lines I-I' and II-II' of FIG. 1A, respectively, to illustrate a semiconductor memory device according to an example embodiment of the inventive concepts. Hereinafter, the descriptions to the same elements as described with reference to FIGS. 1A to 4 will be omitted or described briefly. In other words, differences between the present embodiment and the aforementioned embodiments will be primarily described.

Referring to FIGS. 1A, 6A, and 6B, in a semiconductor memory device according to an example embodiment, an upper interlayer insulating layer 186 may be provided on the pad protecting layer 148 and a source plug line 182 having a flat top surface. For example, the source plug line 182 may be planarized in such a way that the bridge groove regions 184 of FIGS. 5A and 5B are not formed in an upper portion of the source plug line 182. Thus, the top surface of the source plug line 182 may be substantially coplanar with the top surface of the pad protecting layer 148. A portion of the bottom surface of the source plug line 182 may be in contact with the lower isolation insulating pattern 180a disposed on the protruding region 100a of the substrate 100. Another portion of the bottom surface of the source plug line 182 may be in contact with the second dopant region 154b and may extend in the second direction D2. The buffer oxide layer 166 and the second blocking dielectric layer 168 may be disposed between the lower isolation insulating pattern 180a and the protruding region 100a.

Figure 7A:
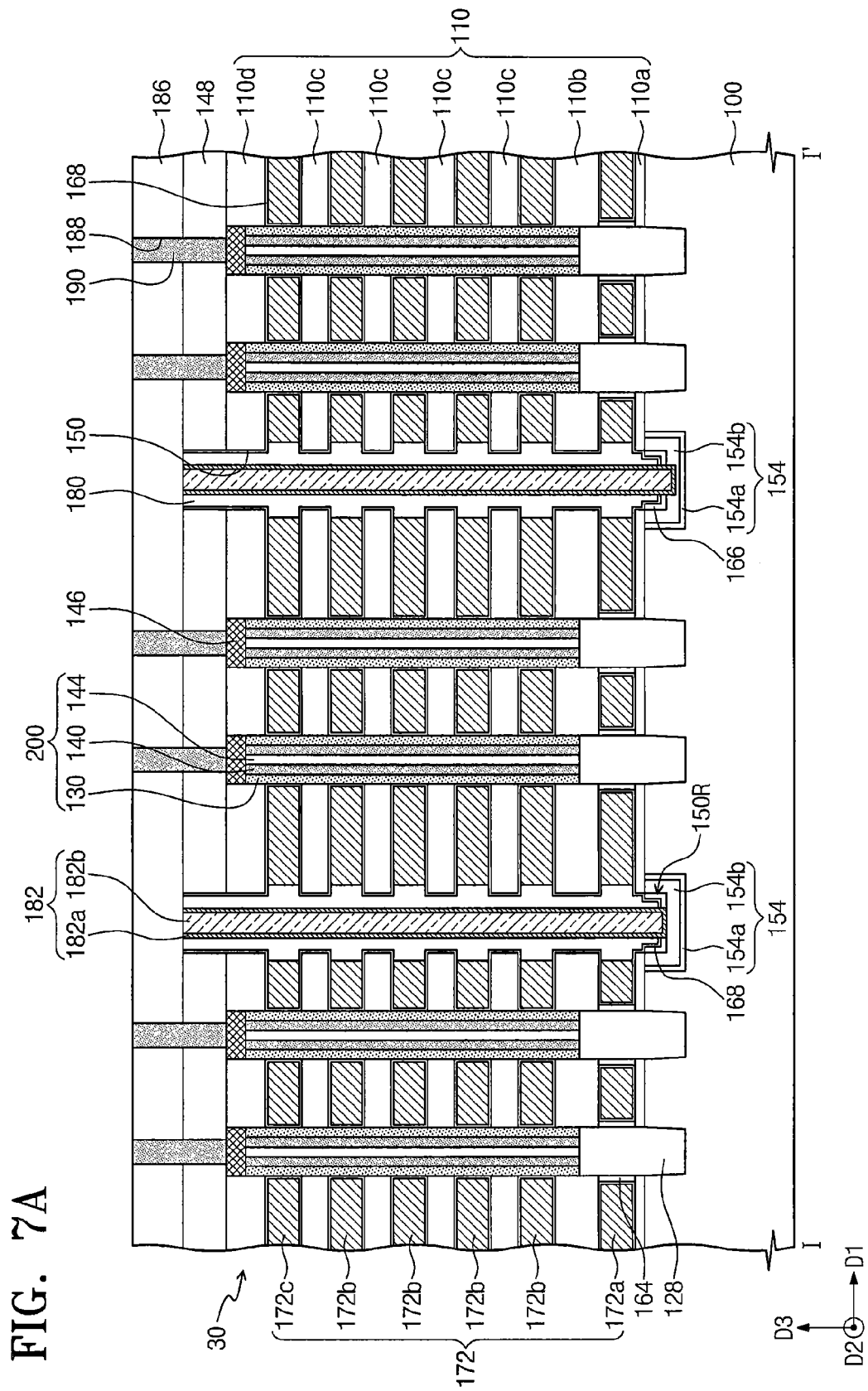
FIGS. 7A and 7B are cross-sectional views taken along lines I-I' and II-II' of FIG. 1A, respectively, to illustrate a semiconductor memory device according to an example embodiment of the inventive concepts.
Figure 7B:
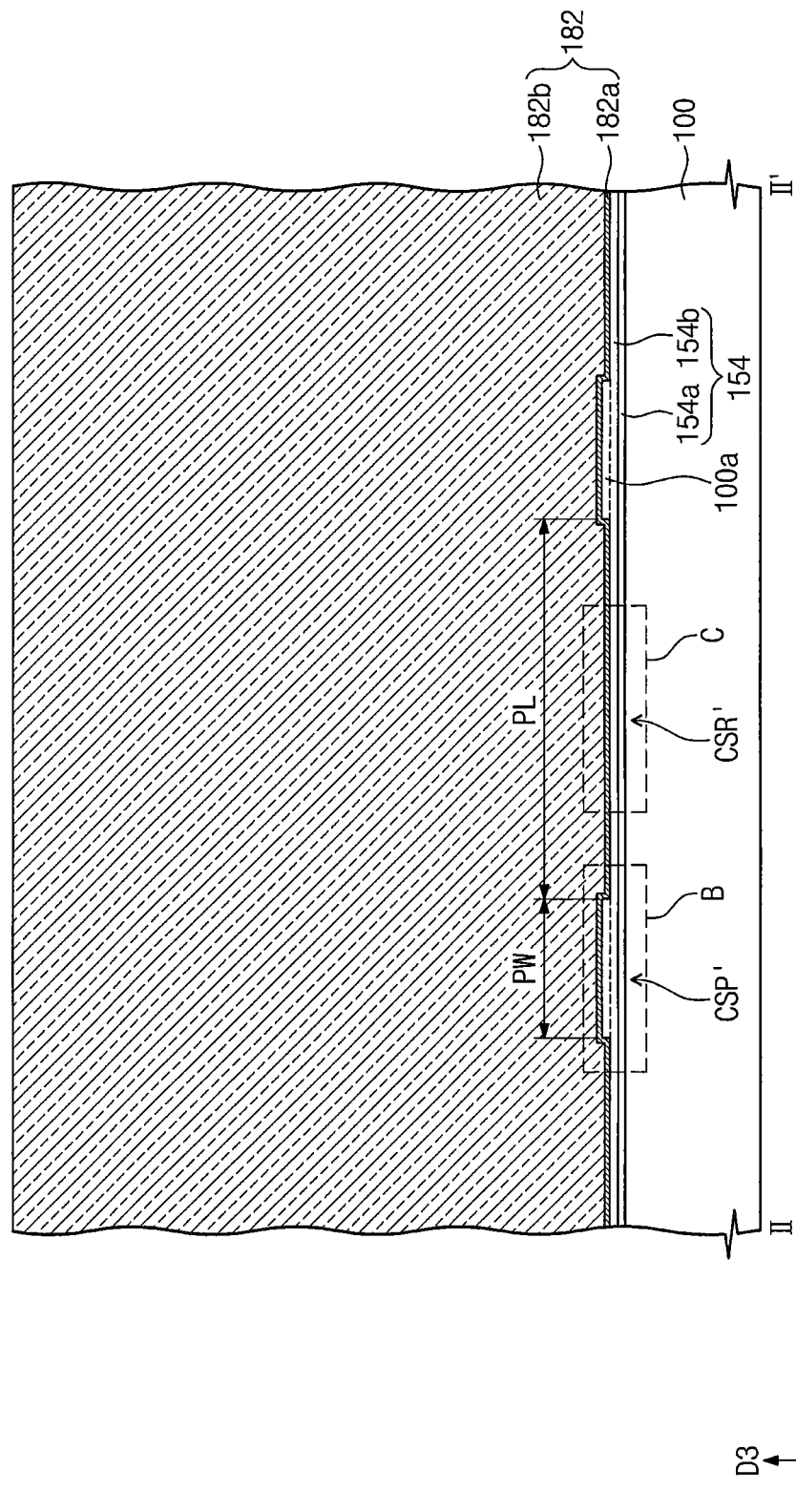
Figure 8A:
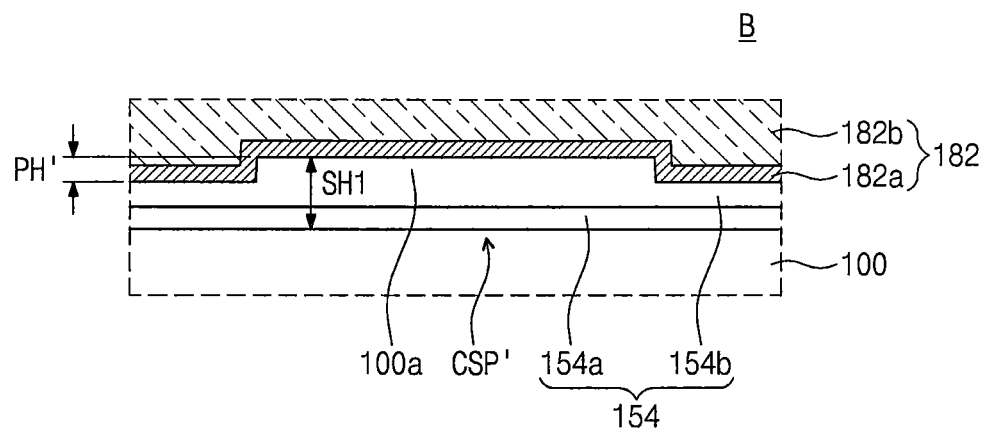
FIGS. 8A and 8B are enlarged views of portions 'B' and 'C' of FIG. 7B, respectively.
Figure 8B:
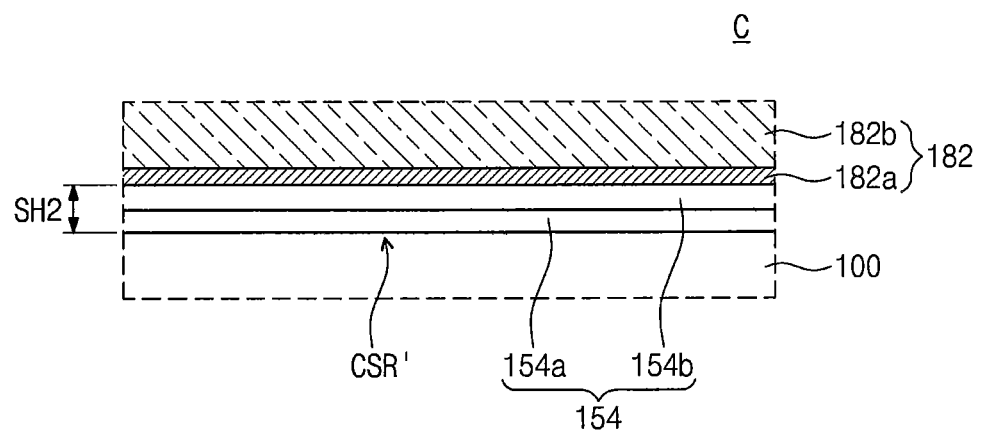

FIGS. 7A and 7B are cross-sectional views taken along lines I-I' and II-II' of FIG. 1A, respectively, to illustrate a semiconductor memory device according to an example embodiment of the inventive concepts. FIGS. 8A and 8B are enlarged views of portions 'B' and 'C' of FIG. 7B, respectively. Hereinafter, the descriptions to the same elements as described with reference to FIGS. 1A to 4 will be omitted or described briefly. In other words, differences between the present embodiment and the aforementioned embodiments will be primarily described.

Referring to FIGS. 1A, 7A, 7B, 8A, and 8B, a semiconductor memory device according to an example embodiment may include a source plug line 182 having a planarized top surface and a common source region 154 being in contact with an entire bottom surface of the source plug line 182. For example, the lower isolation insulating pattern 180a, the second blocking dielectric layer 168, and the buffer oxide layer 166 of FIGS. 6A and 6B may be removed, and the bottom surface of the source plug line 182 may be in direct contact with the protruding region 100a in which the common source region 154 is formed. The protruding region 100a may have a height PH'. Thus, the source plug line 182 may extend in the second direction D2 and may be in contact with the protruding regions 100a arranged in the second direction D2 and the substrate 100 between the protruding regions 100a. A protruding common source region CSP' formed in the substrate 100 including the protruding region 100a may include a first dopant region 154a having a low concentration and a second dopant region 154b having a high concentration. In addition, a recess common source region CSR' formed in the substrate 100 between the protruding regions 100a may also include the first dopant region 154a having the low concentration and the second dopant region 154b having the high concentration. For example, the second dopant region 154b of the high concentration may be surrounded by the first dopant region 154a of the low concentration. The first dopant region 154a may include regions of which heights are different from each other. The first dopant region 154a may have first regions and second regions that are alternately arranged in the second direction D2. The first regions have a height SH1, and the second regions have a height SH2 different from the height SH1. For example, the first dopant region 154a may have the height SH1 in each of the protruding common source regions CSP' and may have the height SH2 in each of the recess common source regions CSR'. The height SH1 may be greater than the height SH2. The second dopant region 154b may be formed in the first dopant region 154a. However, the inventive concepts are not limited thereto. In other embodiments, the second dopant region 154b may penetrate the first dopant region 154a so as to extend into the substrate 100. In some embodiments, the protruding regions 100a may be arranged in a zigzag form along the first direction D1. In addition, the protruding common source regions CSP' of the common source regions 154 may not be symmetric in the first direction D1 and may be arranged in a zigzag form along the first direction D1. The source plug line 182 may extend in the second direction D2 so as to be in direct contact with the second dopant regions 154b which have the high concentration and are formed in the substrate 100 including the protruding regions 100a arranged in the second direction D2.

FIGS. 9, 10, 11A, 12, 13, 14A to 21A, and 14B to 21B are cross-sectional views illustrating some processes of a method of fabricating a semiconductor memory device according to an example embodiment of the inventive concepts. FIGS. 9, 10, 11A, 12, 13, and 14A to 21A are cross-sectional views corresponding to the line I-I' of FIG. 1A, and FIGS. 14B to 21B are cross-sectional views corresponding to the line II-II' of FIG. 1A. FIG. 11B is an enlarged view of a portion 'A' of FIG. 11A. FIGS. 19C and 19D are enlarged views of portions 'B' and 'C' of FIG. 19B, respectively.

Referring to FIG. 9, a molding structure 10 may be formed on a substrate 100. For example, the molding structure 10 may include insulating layers 110 and sacrificial layers 112 that are alternately and repeatedly stacked on the substrate 100. In some embodiments, each of the insulating layers 110 and the sacrificial layers 112 may include a plurality of layers.

The substrate 100 may include a semiconductor material. For example, the substrate 100 may be a silicon single-crystalline substrate, a germanium single-crystalline substrate, or a silicon-germanium single-crystalline substrate. Alternatively, the substrate 100 may be a silicon-on-insulator (SOI) substrate. For example, the substrate 100 may include a semiconductor layer (e.g., a silicon layer, a silicon-germanium layer, or a germanium layer) disposed on an insulating layer that protects transistors provided on a semiconductor substrate. The substrate 100 may include a dopant region having a first conductivity type (e.g., a P-type).

The sacrificial layers 112 may be formed of a material having an etch selectivity with respect to the insulating layers 110. For example, an etch rate of the sacrificial layers 112 may be higher than that of the insulating layers 110 during a wet etching process using a chemical solution. For example, each of the insulating layers 110 may be a silicon oxide layer or a silicon nitride layer, and each of the sacrificial layers 112 may be one of a silicon oxide layer, a silicon nitride layer, a silicon carbide layer, a silicon layer, or a silicon-germanium layer. At this time, the sacrificial layers 112 are formed of a material having an etch selectivity with respect to the insulating layers 110. In some embodiments, the insulating layers 110 may be silicon oxide layers, and the sacrificial layers 112 may be silicon nitride layers.

The insulating layers 110 and the sacrificial layers 112 may be formed using a thermal CVD process, a plasma enhanced CVD process, or an ALD process.

Thicknesses of the sacrificial layers 112 may be equal to each other. In other embodiments, an insulating layer 110a being in contact with the substrate 100 may be a silicon oxide layer that is formed by a thermal oxidation process or a deposition process, and a thickness of the insulating layer 110a may be less than those of other insulating layers 110b, 110c, and 110d. In other embodiments, an insulating layer 110b secondly stacked from the substrate 100, an uppermost insulating layer 110d, and an insulating layer 110c directly adjacent to the uppermost insulating layer 110d may be thicker than other insulating layers 110c or the sacrificial layers 112.

Figure 10:
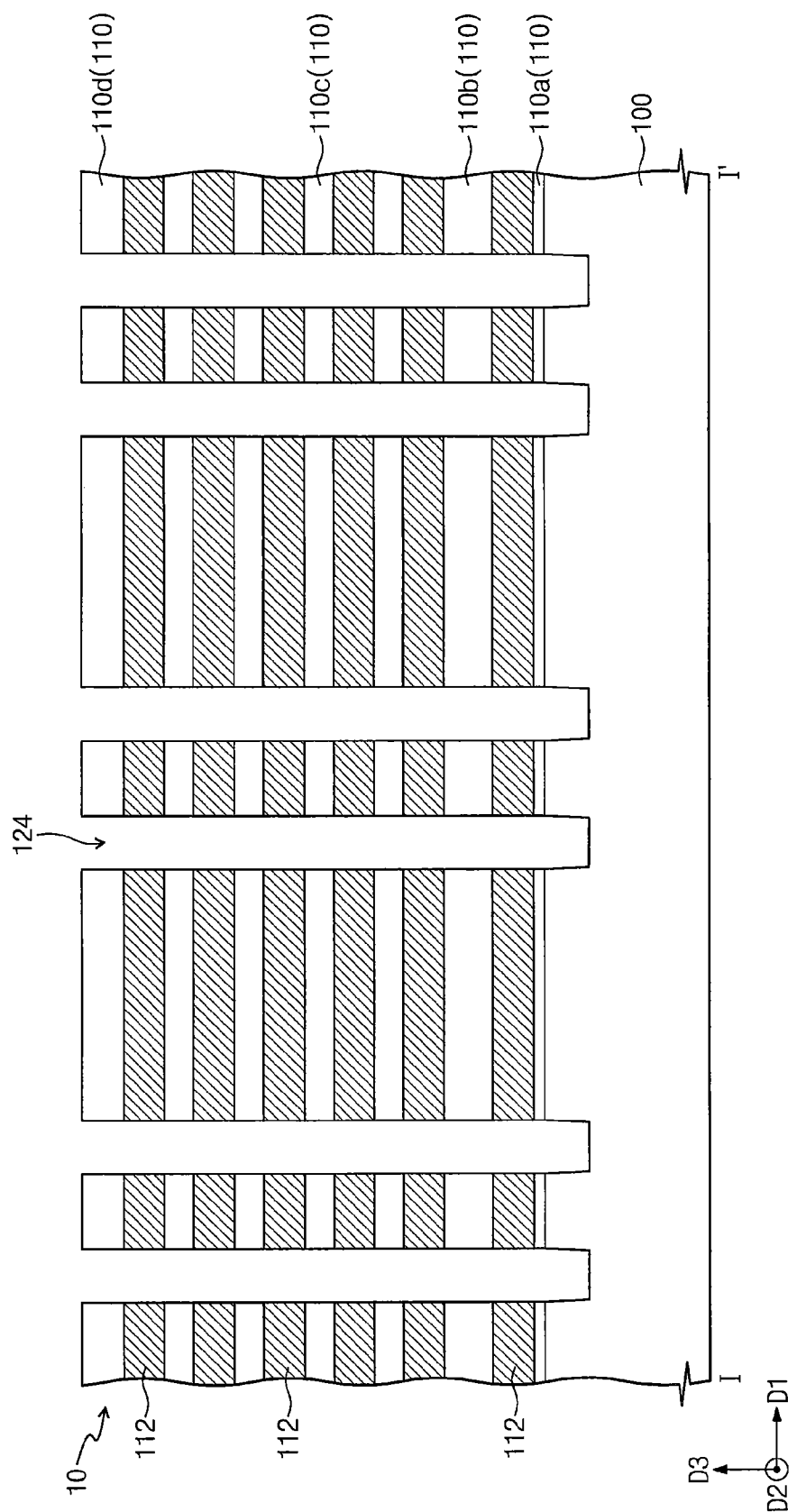
Figure 11B:
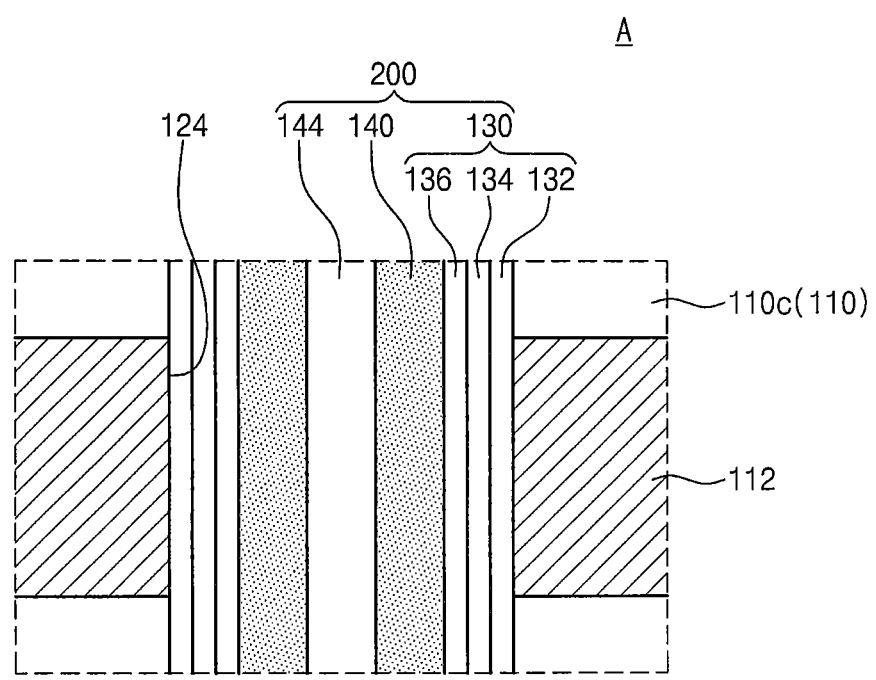
FIG. 11B is an enlarged view of a portion 'A' of FIG. 11A.

Referring to FIG. 10, channel holes 124 may be formed to penetrate the molding structure 10. The channel holes 124 may expose the substrate 100.

The channel holes 124 may be formed by anisotropically etching the molding structure 10. The channel holes 124 may be arranged in the same form as the vertical channel structures 200 illustrated in FIG. 1A. For example, the channel holes 124 arranged along four columns parallel to the second direction D2 may constitute a group, and a plurality of the groups may be disposed to be spaced apart from each other in the first direction D1. The inventive concepts are not limited to the four columns of the channel holes 124. In other embodiments, the channel holes 124 may be arranged along two columns or five or more columns. When the channel holes 124 are formed, the substrate 100 may be over-etched to form recess regions. For example, a depth of the recess region may be in a range of 10 nm to 200 nm.

Referring to FIGS. 11A and 11B, vertical channel structures 200 may be formed on the substrate 100. The vertical channel structures 200 may penetrate the molding structure 10 and may extend in the third direction D3. The vertical channel structures 200 may fill the channel holes 124, respectively. In addition, the vertical channel structures 200 may extend into the substrate 100 (e.g., the recess regions disposed under the channel holes 124). Each of the vertical channel structures 200 may include a first vertical channel pattern 128, a data storage pattern 130, a second vertical channel pattern 140, and a filling insulation pattern 144. The first vertical channel pattern 128 may fill the recess region and may vertically protrude from the substrate 100 like a pillar shape. The first vertical channel pattern 128 may fill a lower portion of each of the channel holes 124. For example, the first vertical channel pattern 128 may protrude to be in contact with sidewalls of the lowermost insulating layer 110a and the lowermost sacrificial layer 112a of the molding structure 10. In addition, the first vertical channel pattern 128 may further protrude to cover a portion of a sidewall of the insulating layer 110b secondly stacked from the substrate 100. For example, a top surface of the first vertical channel pattern 128 may be lower than a top surface of the insulating layer 110b secondly stacked from the substrate 100. The first vertical channel pattern 128 may include a semiconductor material. For example, the first vertical channel pattern 128 may include at least one of silicon (Si), germanium (Ge), silicon-germanium (SiGe), III-V group compounds, or II-VI group compounds. For example, the first vertical channel pattern 128 may include a semiconductor material that is formed by a selective epitaxial growth (SEG) process. The first vertical channel pattern 128 may include dopants of which a conductivity type is the same as that of the substrate 100. For example, the first vertical channel pattern 128 may be doped with the dopants in-situ during the SEG process. Alternatively, the first vertical channel pattern 128 may be doped with the dopants by an ion implantation process.

Subsequently, the data storage pattern 130, the second vertical channel pattern 140, and the filling insulation pattern 144, which penetrate the molding structure 10, may be formed on the first vertical channel pattern 128.

The data storage pattern 130 may cover an inner sidewall of the channel hole 124. For example, the data storage pattern 130 may have a spacer shape on the inner sidewall of the channel hole 124 and may extend from a top end of the channel hole 124 to the top surface of the first vertical channel pattern 128. For example, the data storage pattern 130 may have open top and bottom ends. The data storage pattern 130 may be in contact with the insulating layers 110 and the sacrificial layers 112 of the molding structure 10. The data storage pattern 130 may include a thin layer capable of storing data. For example, the data storage pattern 130 may include a thin layer capable of storing data using the Fowler-Nordheim tunneling effect. However, the inventive concepts are not limited thereto. Alternatively, the data storage pattern 130 may have a thin layer capable of storing data based on another operation principle (e.g., a thin layer used for a phase change memory device or a thin layer used for a variable resistance memory device). The data storage pattern 130 may be formed of a plurality of thin layers.

The data storage pattern 130 may include, for example, a first blocking dielectric layer 132, a charge storage layer 134, and a tunnel dielectric layer 136, as illustrated in FIG. 11B. For example, the first blocking dielectric layer 132, the charge storage layer 134, and the tunnel dielectric layer 146 may be sequentially formed on the inner sidewall of the channel hole 124. The first blocking dielectric layer 132 may include a silicon oxide layer and/or a high-k dielectric layer (e.g., an aluminum oxide layer or a hafnium oxide layer). The first blocking dielectric layer 132 may consist of a single layer or a plurality of thin layers. In some embodiments, the first blocking dielectric layer 132 may be a single layer formed of the silicon oxide layer. In other embodiments, the first blocking dielectric layer 132 may include a plurality of thin layers including at least two of the silicon oxide layer, the aluminum oxide layer, and/or the hafnium oxide layer.

The charge storage layer 134 may include a trap dielectric layer, or a dielectric layer including conductive nano dots. The trap dielectric layer may include, for example, a silicon nitride layer. The tunnel dielectric layer 136 may include, for example, a silicon oxide layer. The first blocking dielectric layer 132 and the charge storage layer 134 may be formed using a plasma enhanced CVD process or an ALD process. The tunnel dielectric layer 136 may be formed using a plasma enhanced CVD process, an ALD process, or a thermal oxidation process. The tunnel dielectric layer 136 may be in contact with the second vertical channel pattern 140.

The second vertical channel pattern 140 may be electrically connected to the first vertical channel pattern 128 and may be in contact with the data storage pattern 130. The second vertical channel pattern 140 may be conformally formed in the channel hole 124 to have a liner shape. The second vertical channel pattern 140 may extend in the third direction D3. The second vertical channel pattern 140 may have a hollow macaroni shape with an open top end. In some embodiments, top and bottom ends of the second vertical channel pattern 140 may be opened. In other embodiments, the second vertical channel pattern 140 may have a cylinder shape that fills the channel hole 124 without the filling insulation pattern 144. The second vertical channel pattern 140 may include a semiconductor material. For example, the second vertical channel pattern 140 may include a poly-crystalline semiconductor material, an amorphous semiconductor material, or a single-crystalline semiconductor material. For example, the second vertical channel pattern 140 may include at least one of silicon (Si), germanium (Ge), silicon-germanium (SiGe), gallium-arsenic (GaAs), III-V group compounds, II-VI group compounds, or any mixture thereof. The second vertical channel pattern 140 may include an undoped semiconductor material or a semiconductor material doped with dopants of which a conductivity type is the same as that of the substrate 100. The second vertical channel pattern 140 may be formed using an ALD process, a CVD process, or an epitaxial growth process.

The filling insulation pattern 144 may be formed to fill the channel hole 124 having the second vertical channel pattern 140. The filling insulation pattern 144 may include a silicon oxide layer or a silicon nitride layer. A hydrogen annealing process may be further performed before the formation of the filling insulation pattern 144, thereby curing crystal defects that may exist in the second vertical channel pattern 140.

Conductive pads 146 may be formed on the vertical channel structures 200, respectively. For example, an upper portion of each of the vertical channel structures 200 may be recessed, and then, the recessed region may be filled with a conductive material to form the conductive pad 146. Alternatively, the conductive pad 146 may be formed by injecting dopants into the second vertical channel pattern 140. A drain region may be formed in the second vertical channel pattern 140 disposed under the conductive pad 146. A pad protecting layer 148 may be formed on the conductive pad 146 and the uppermost insulating layer 110d.

Figure 12:
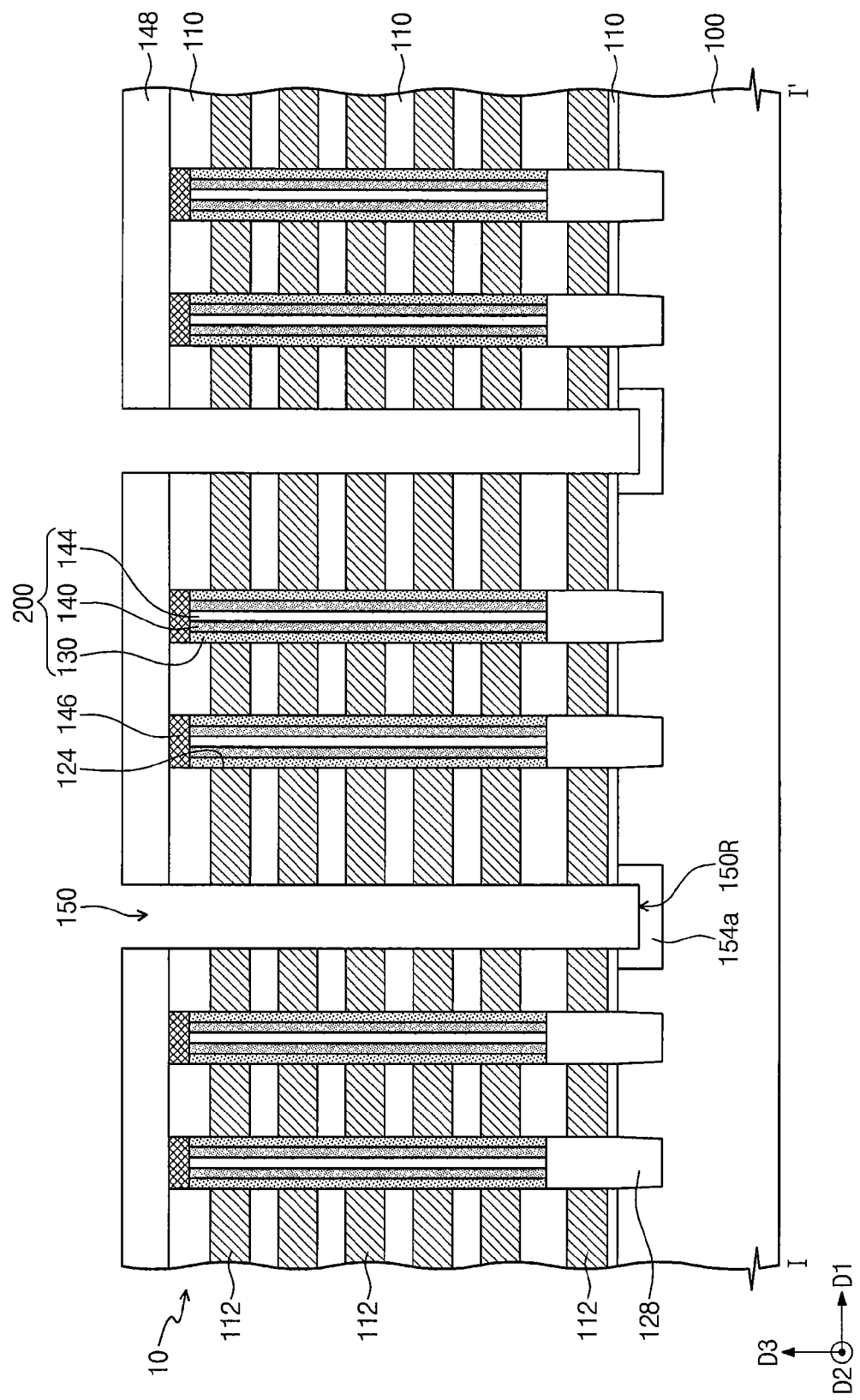

Referring to FIG. 12, the molding structure 10 may be patterned to form a first trench 150 between the vertical channel structures 200 adjacent to each other. The first trench 150 may expose the substrate 100. A first dopant region 154a for a common source region may be formed in the substrate 100 exposed by the first trench 150. For example, the molding structure 10 may be anisotropically etched to form the first trench 150. For example, the first trench 150 may be formed between the groups of which each consists of the vertical channel structures 200 arranged along the four columns parallel to the second direction D2. In other embodiments, the first trench 150 may be formed between the groups of which each consists of the vertical channel structures 200 arranged along two columns or five or more columns. The first trench 150 may extend in the second direction D2. The molding structure 10 of FIG. 11A may be divided into a plurality of molding structures 10 by the first trench 150, as illustrated in FIG. 12. When the first trench 150 is formed, the substrate 100 may be over-etched to form a recess region 150R. For example, a depth of the recess region 150R may be in a range of 5 nm to 150 nm. The recess region 150R may have a positively sloped sidewall. The first dopant region 154a may be formed to surround the recess region 150R. The first dopant region 154a may surround the sidewall and a bottom surface of the recess region 150R. The first dopant region 154a may include dopants of which a second conductivity type (e.g., an N-type) is different from the first conductivity type of the substrate 100. The first dopant region 154a may be a low-concentration dopant region. For example, N-type dopants (e.g., arsenic (As) ions or phosphorus (P) ions) may be implanted into the substrate 100 with an energy of about 10 KeV to about 40 KeV and a dose of about $10^{12}$ atoms/cm$^2$ to about $10^{13}$ atoms/cm$^2$, thereby forming the first dopant region 154a.

Figure 13:
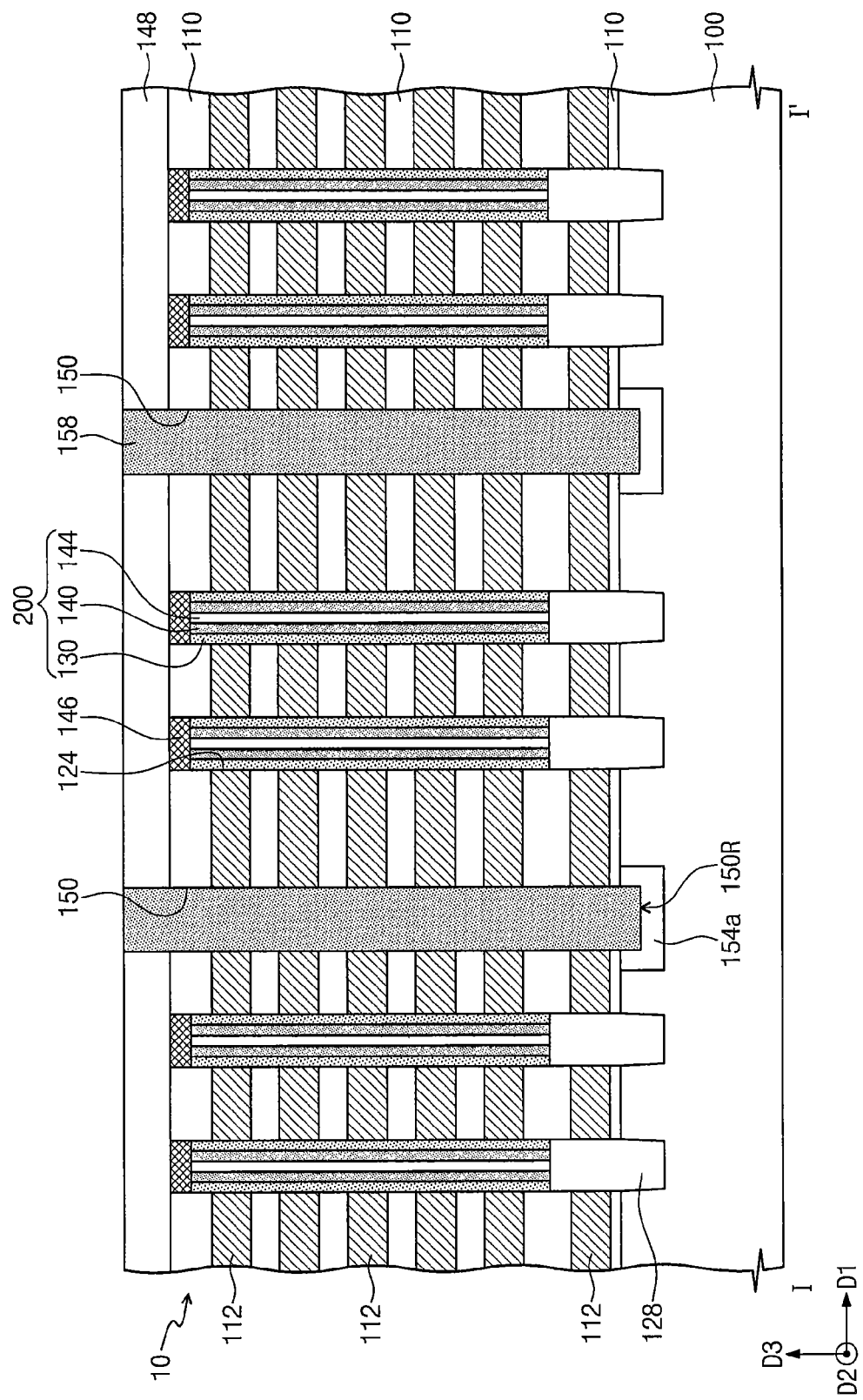

Referring to FIG. 13, a sacrificial filling pattern 158 may be formed in the first trench 150. For example, a sacrificial filling layer may be formed on the pad protecting layer 148 to fill the first trench 150, and then, the sacrificial filling layer may be planarized by an etch-back process or a chemical mechanical polishing (CMP) process until a top surface of the pad protecting layer 148 is exposed. Thus, the sacrificial filling pattern 158 may be formed in the first trench 150. The sacrificial filling pattern 158 may include an insulating layer, a poly-silicon layer, or any combination thereof. For example, the insulating layer for the sacrificial filling pattern 158 may be a nitride layer, a silicon-based spin-on-hard mask (SOH) layer, or a carbon-based SOH layer. The sacrificial filling pattern 158 may be formed using a CVD process, an ALD process, or a spin-coating process.

Figure 14A:
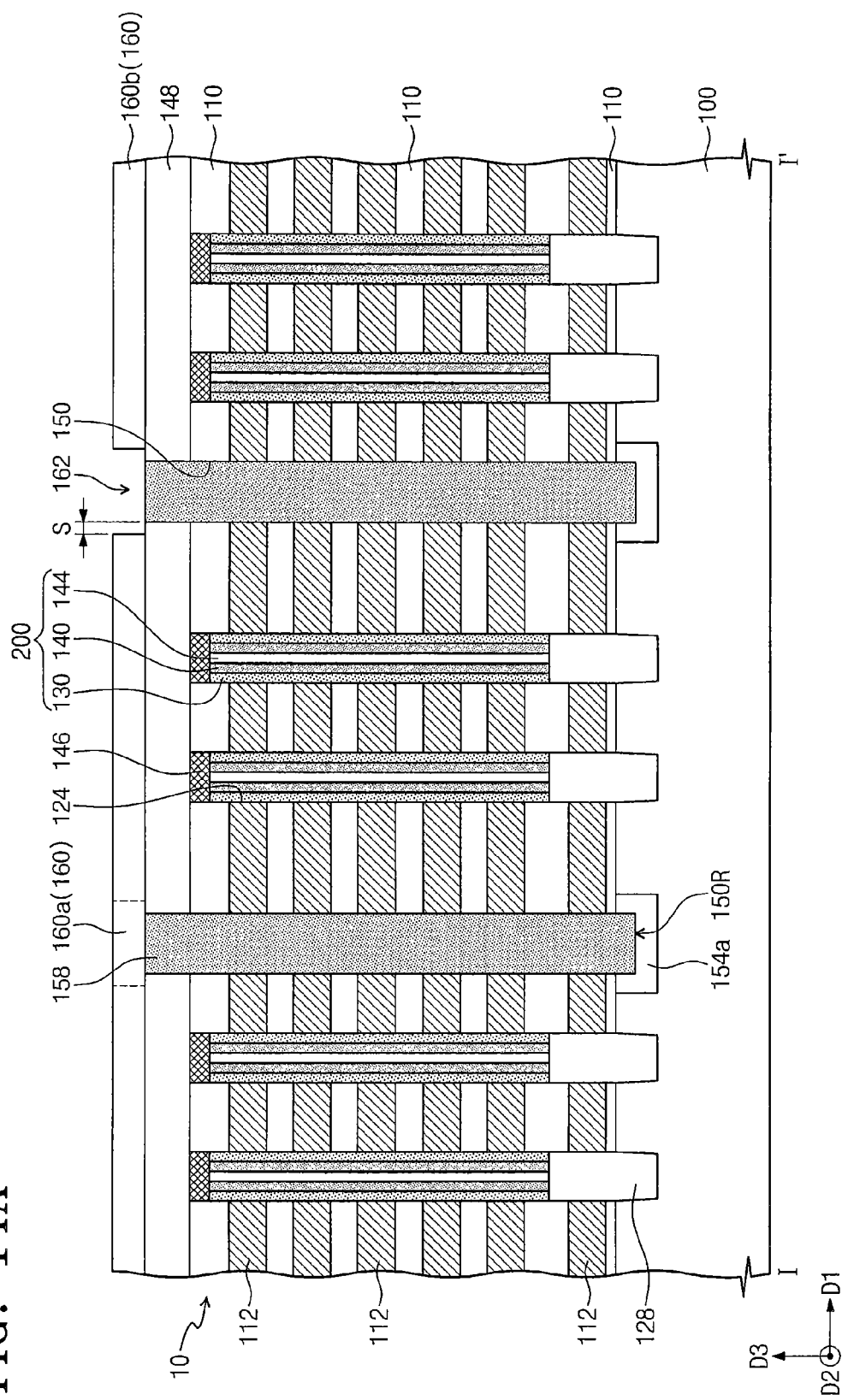
Figure 14B:
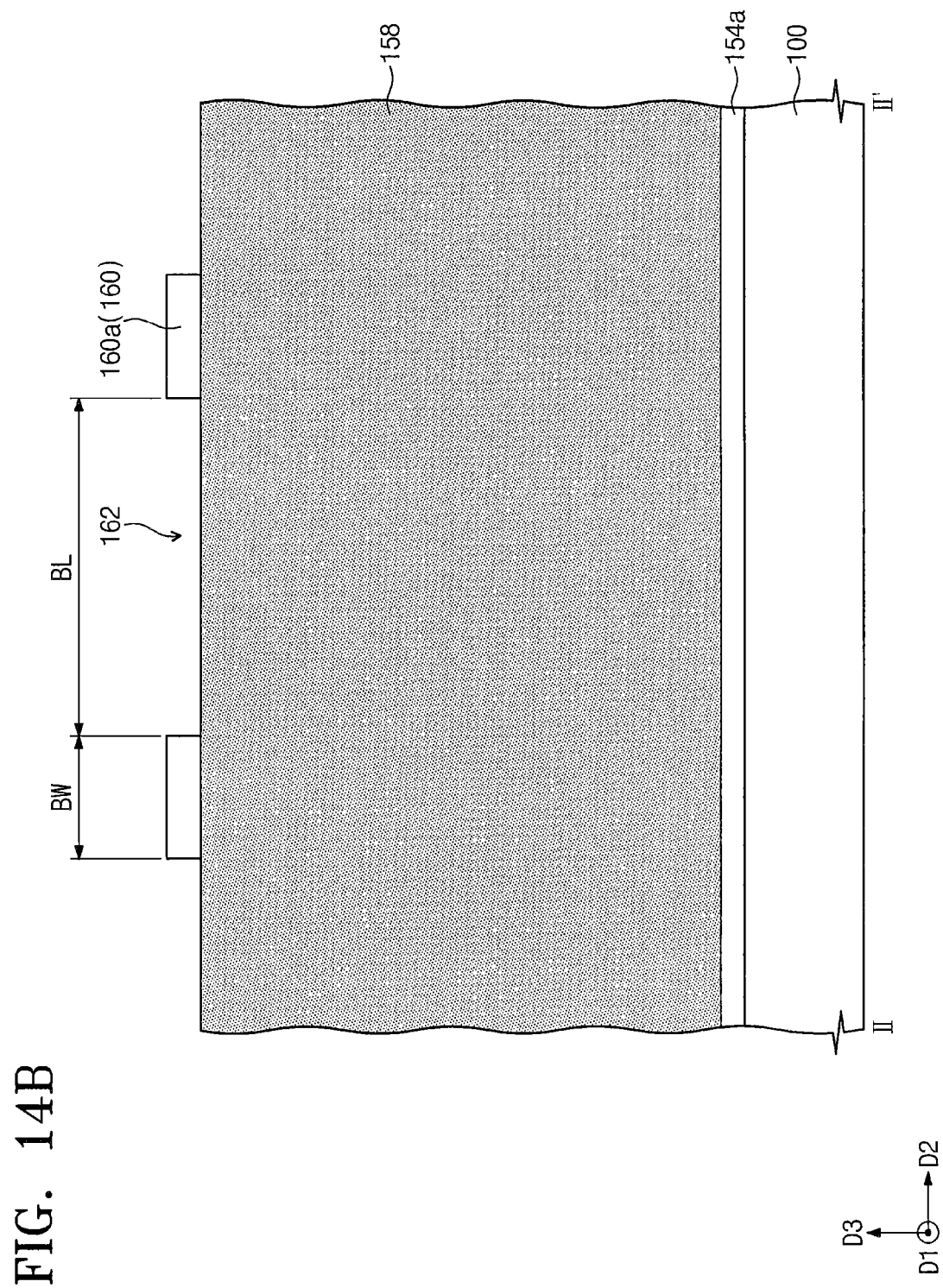

Referring to FIGS. 1A, 14A, and 14B, a supporting pattern 160 may be formed on the molding structure 10. For example, the supporting pattern 160 may be formed on the pad protecting layer 148 and the sacrificial filling pattern 158. As illustrated in FIG. 1A, the supporting pattern 160 may be formed to include a plurality of bridges 160a and fixing portions 160b connecting to the bridges 160a. For example, the supporting pattern 160 formed on the pad protecting layer 148 may include the fixing portions 160b disposed on the molding structures 10 and the bridges 160b connecting the molding structures 10 to each other. The bridges 160a may cross over the sacrificial filling pattern 158 in the first direction D1. Each of the bridges 160a may have a width BW in the second direction D2. The bridges 160a may be spaced apart from each other by a distance BL in the second direction D2. Thus, a second trench 162 exposing the sacrificial filling pattern 158 may be provided in the supporting pattern 160. The second trench 162 may have a slit shape having a width BL in the second direction D2. For example, the distance BL may be several times to several ten times greater than the width BW. In the first direction D1, a width of the second trench 162 may be greater than that of the first trench 150. A difference between the widths in the first direction D1 of the second and first trenches 162 and 150 may be twice a distance S illustrated in FIG. 14A.

In some embodiments, the bridges 160a of the supporting pattern 160 may be arranged in a zigzag form, as illustrated in FIG. 1B. For example, the bridges 160a adjacent to each other in the first direction D1 may not be symmetric and may be arranged in the zigzag form. In other embodiments, the supporting pattern 160 may have a linear shape extending in the first direction D1, as illustrated in FIG. 4. In FIG. 4, the supporting pattern 160 may be provided in plurality and the supporting patterns 160 may be arranged along the second direction D2 on the pad protecting layer 148. The supporting patterns 160 may include a plurality of bridges 160a crossing over the sacrificial filling pattern 158 in the first direction D1 and extending onto the pad protecting layer 148. For example, fixing portions 160b that have the substantially same shape as the bridges 160a may be formed on the molding structure 10. However, the inventive concepts are not limited thereto. Widths of the fixing portions 160b may be greater than those of the bridges 160a or may have various shapes. Each of the bridges 160a may have the width BW in the second direction D2, and the bridges 160a may be spaced apart from each other by the distance BL in the second direction D2.

Figure 15B:
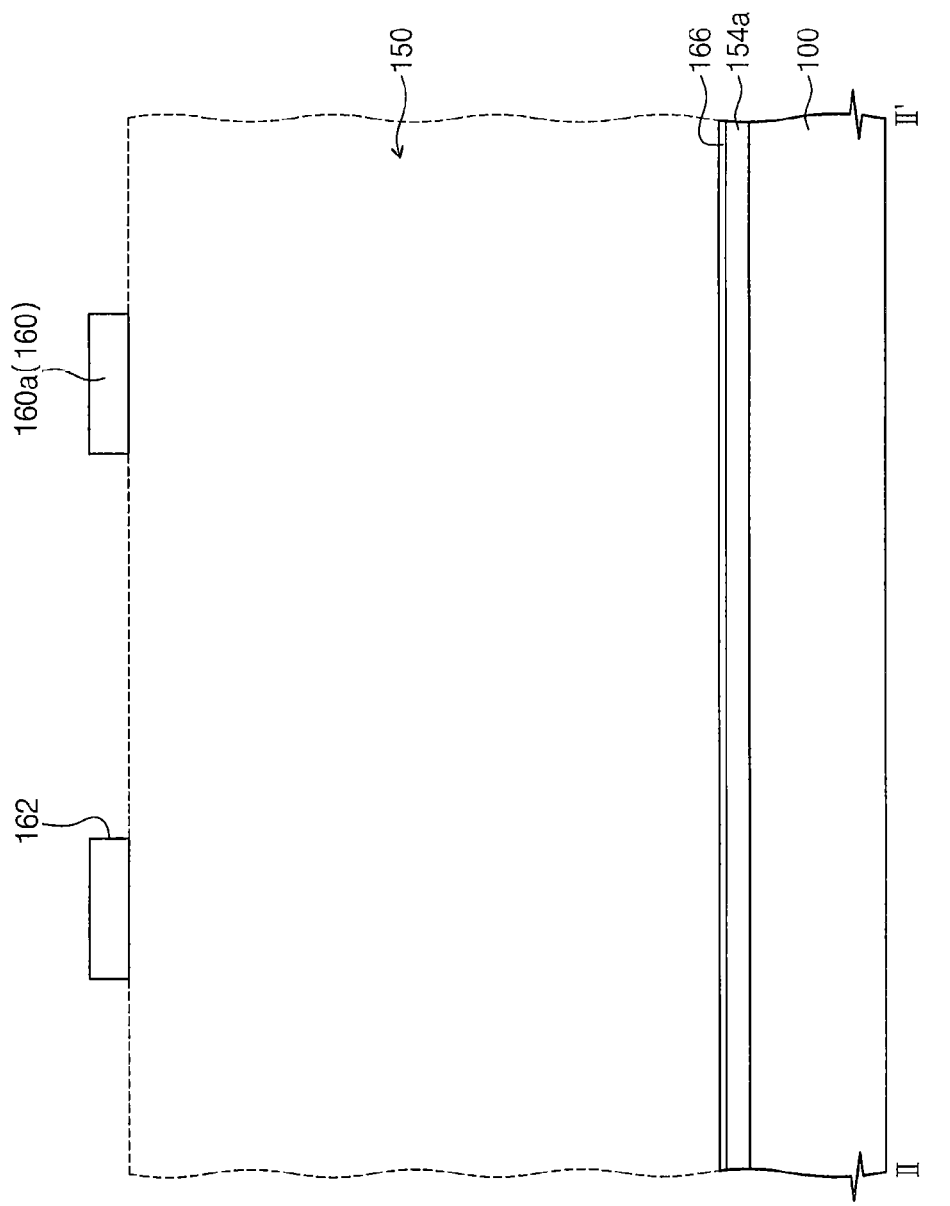

Referring to FIGS. 15A and 15B, opening regions OA may be formed in the molding structure 10. The sacrificial layers 112 and the sacrificial filling pattern 158 may be removed through the first and second trenches 150 and 162 to form the opening regions OA between the insulating layers 110. For example, if the sacrificial layers 112 and the sacrificial filling pattern 158 are formed of silicon nitride layers and the insulating layers 112 are formed of silicon oxide layers, the sacrificial layers 112 and the sacrificial filling pattern 158 may be isotropically etched using an etching solution including phosphoric acid to form the opening regions OA. For example, if the sacrificial layers 112 are silicon nitride layers and the sacrificial filling pattern 158 is a SOH layer, the sacrificial filling pattern 158 may be removed by an ashing process and the sacrificial layers 112 may be removed using the etching solution including phosphoric acid. The opening regions OA may be regions in which gate electrodes will be formed. Portions of the vertical channel structure 200 may be exposed by the opening regions OA. For example, the data storage pattern 130 of the vertical channel structure 200 may be exposed by the opening regions OA. For example, the first blocking dielectric layer (132 of FIG. 11B) of the data storage pattern 130 may be exposed by the opening regions OA. In addition, the sidewall of the first vertical channel pattern 128 may be exposed by at least one of the opening regions OA. The opening region OA corresponding to each of the sacrificial layers 112 may extend in the first direction D1 and the second direction D2.

A gate oxide layer 164 may be formed on the sidewall of the first vertical channel pattern 128, and a buffer oxide layer 166 may be formed in the recess region 150R. For example, the sidewall, exposed through the opening region OA, of the first vertical channel pattern 128 may be oxidized to form the gate oxide layer 164. At the same time, the substrate 100 exposed by the recess region 150R may also be oxidized to form the buffer oxide layer 166. For example, the sidewall of the first vertical channel pattern 128 and the substrate 100 exposed by the recess region 150R may be oxidized by the same thermal oxidation process. The gate oxide layer 164 formed by the thermal oxidation process may be used as a gate oxide layer of a ground selection transistor. The buffer oxide layer 166 may protect the substrate 100 including the first dopant region 154a exposed by the recess region 150R.

Figure 16A:
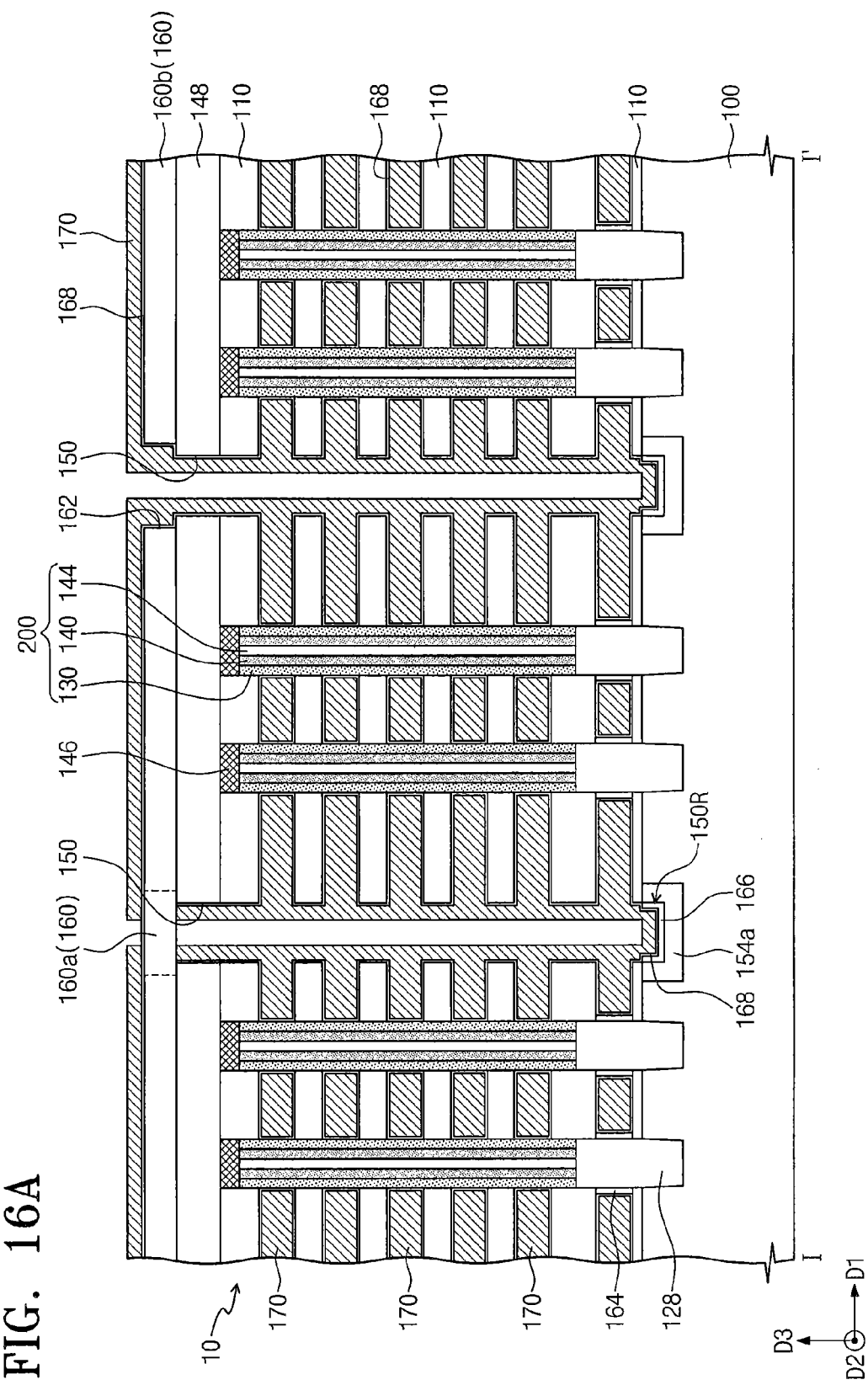
Figure 16B:
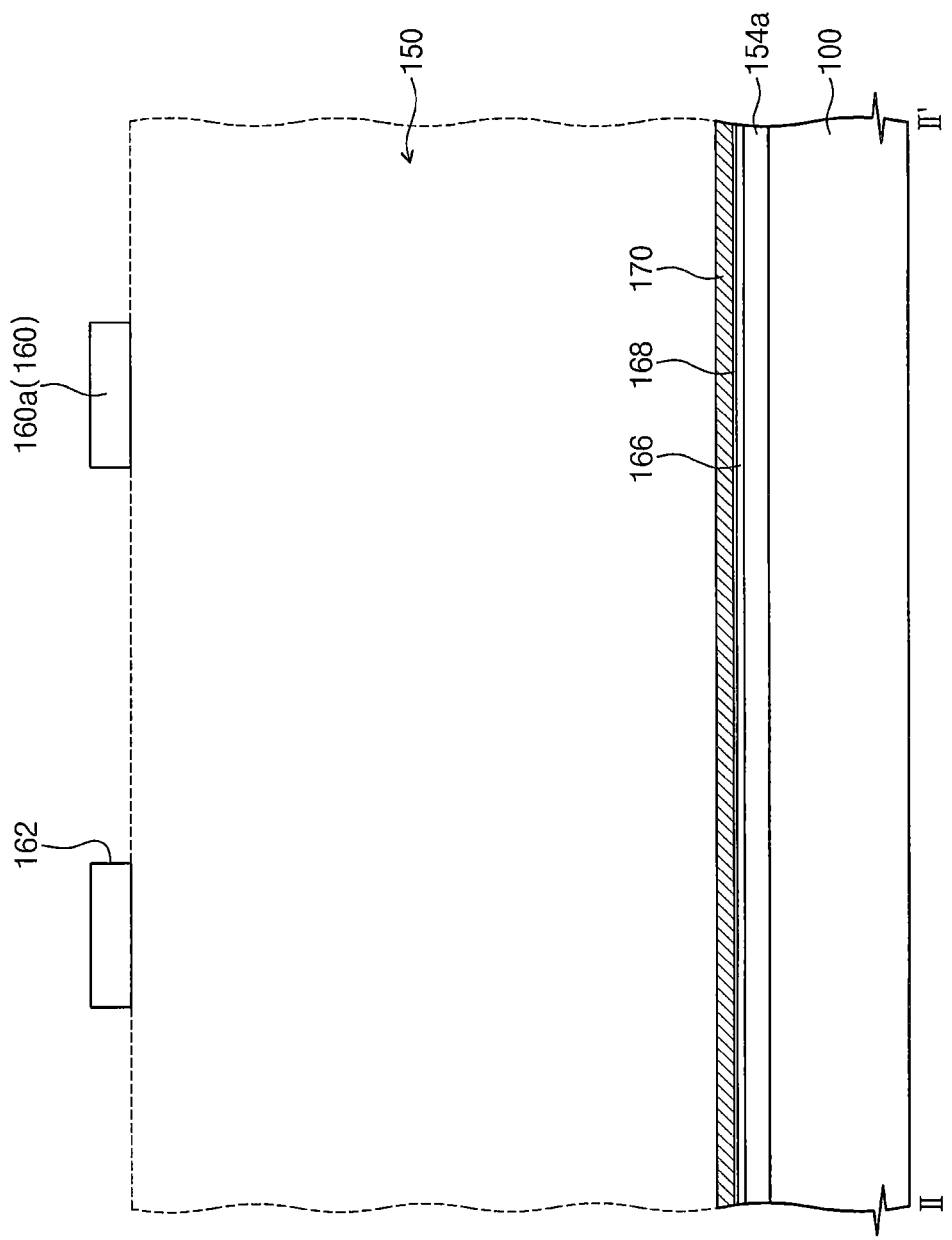

Referring to FIGS. 16A and 16B, a second blocking dielectric layer 168 and a gate conductive layer 170 may be sequentially formed on the substrate 100 to fill the opening regions OA. The second blocking dielectric layer 168 may be formed to conformally cover inner surfaces of the opening regions OA. For example, the second blocking dielectric layer 168 may be in contact with top surfaces and bottom surfaces of the insulating layers 110. The second blocking dielectric layer 168 may be in contact with the sidewall of the vertical channel structure 200. For example, the second blocking dielectric layer 168 may be in contact with the first blocking dielectric layer 132. In addition, the second blocking dielectric layer 168 may be in contact with the gate oxide layer 164 of the first vertical channel pattern 128. The second blocking dielectric layer 168 may extend into the recess region 150R so as to be formed on the buffer oxide layer 166. For example, the second blocking dielectric layer 168 may include a single layer or a plurality of thin layers. For example, the second blocking dielectric layer 168 may include a high-k dielectric layer (e.g., an aluminum oxide layer and/or a hafnium oxide layer). In other embodiments, the second blocking dielectric layer 168 may not be formed but may be omitted.

The gate conductive layer 170 may be formed to fill the opening regions OA having the second blocking dielectric layer 168. For example, the gate conductive layer 170 may include a conductive layer including a metal. For example, the gate conductive layer 170 may include at least one of a metal layer, a metal silicide layer, or a metal nitride layer. For example, the metal layer may include at least one of nickel, cobalt, platinum, titanium, tantalum, or tungsten. The metal layer may be formed using an ALD process or a CVD process. For example, the metal silicide layer may include at least one of nickel silicide, cobalt silicide, platinum silicide, titanium silicide, tantalum silicide, or tungsten silicide. In some embodiments, a poly-silicon layer and a metal layer may be deposited to fill the opening regions OA and the deposited poly-silicon layer and metal layer may react with each other by a thermal treatment process to form the metal silicide layer. For example, the metal nitride layer may include at least one of titanium nitride, tungsten nitride, or tantalum nitride. The gate conductive layer 170 may fill at least a portion of the recess region 150R.

Figure 17A:
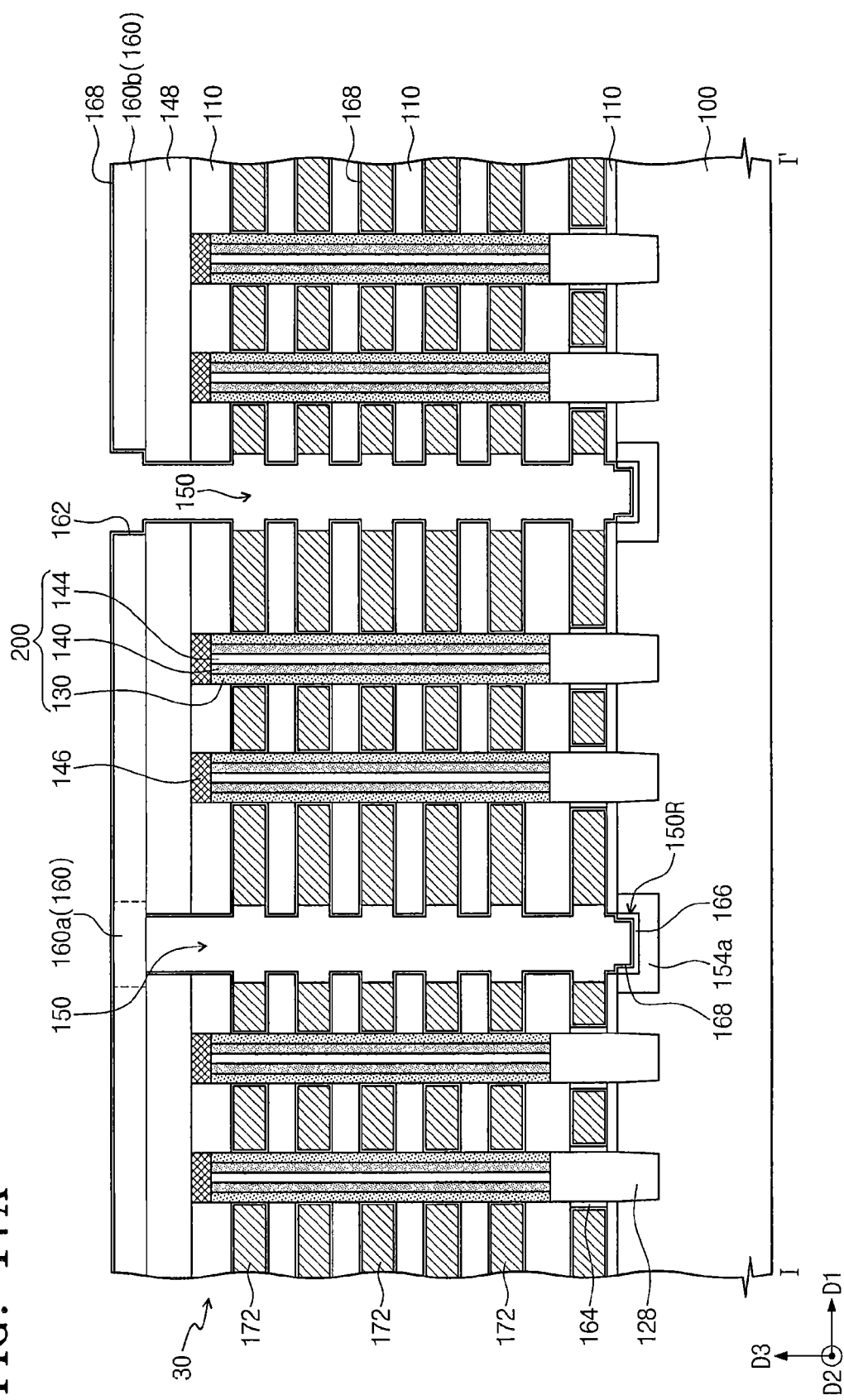
Figure 17B:
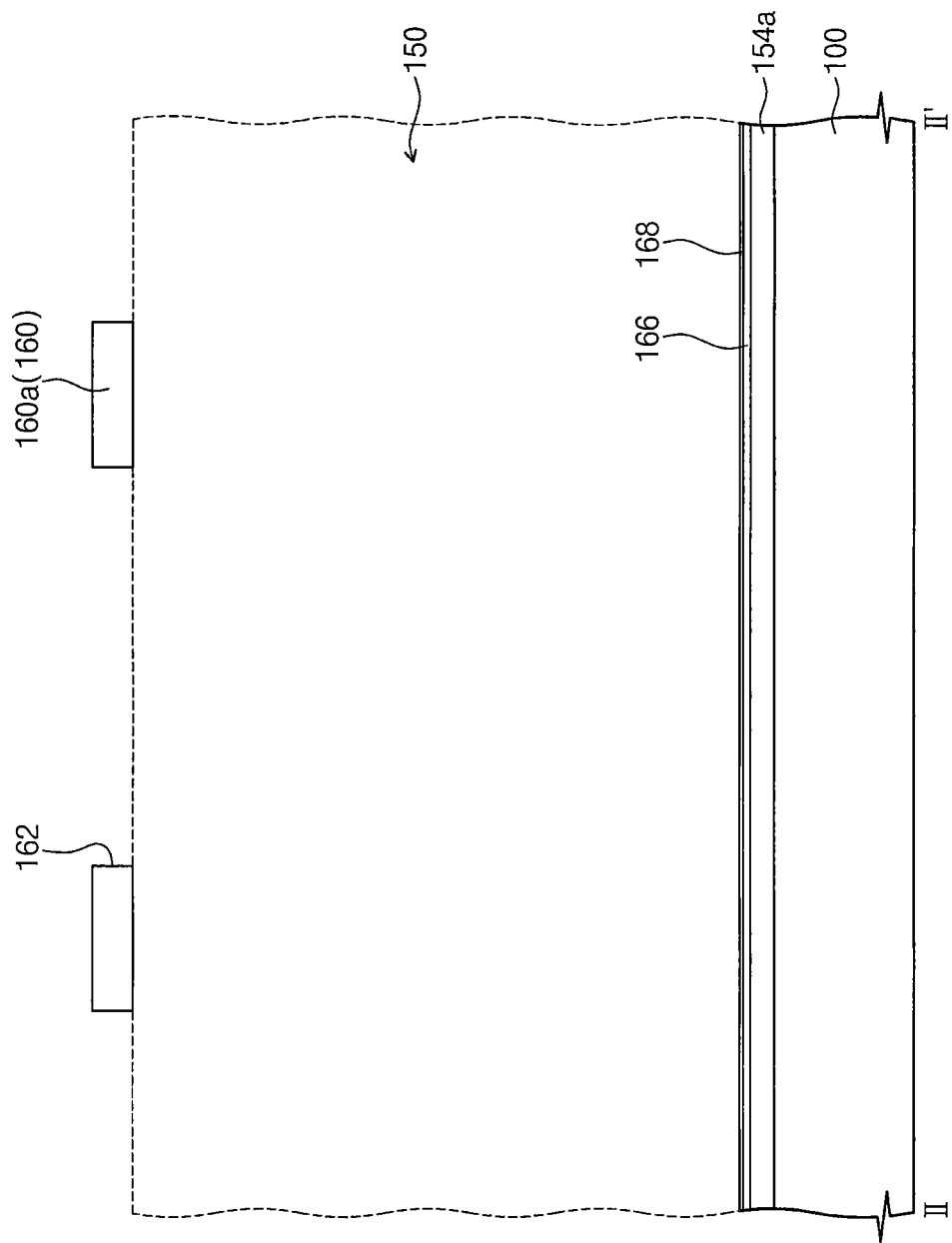

Referring to FIGS. 17A and 17B, stack gate structures 30 may be formed on the substrate 100. Each of the stack gate structures 30 may include gate electrodes 172 sequentially stacked on the substrate 100. In some embodiments, the gate conductive layer 170 may be isotropically etched to form the stacked gate electrodes 172 that are separated from each other in the third direction D3. For example, the gate electrodes 172 may have truncated ends that are recessed laterally from sidewalls of the insulating layers 110 toward the vertical channel structures 200 in the first direction D1. Thus, the gate electrodes 172 adjacent to each other in the third direction D3 may be physically separated from each other to prevent a short therebetween. As a result, each of the stack gate structures 30 may include the insulating layers 110 and the gate electrodes 172 that are alternately and repeatedly stacked on the substrate 100.

Meanwhile, if the amount of the gate electrodes 172 between the vertical channel structure 200 and a left sidewall of the stack gate structure 30 is different from the amount of the gate electrodes 172 between the vertical channel structure 200 and a right sidewall of the stack gate structure 30 as described with reference to FIGS. 1A, 2A, and 2B, the stack gate structure 30 may lean toward the sidewall at which the amount of the gate electrodes 172 is greater. The leaning phenomenon of the stack gate structure 30 may become more serious as the number of stacked gate electrodes 172 increases. However, according to embodiments of the inventive concepts, the leaning phenomenon of the stack gate structures 30 may be reduced or prevented by the supporting pattern 160. For example, the stack gate structures 30 may be connected to each other through the bridges 160a of the supporting pattern 160, so structural stability of the stack gate structures 30 may be secured to reduce or prevent the leaning phenomenon of the stack gate structures 30. As a result, the stack gate structures 30 may reduce or prevent process errors that may be caused in subsequent processes.

Figure 18A:
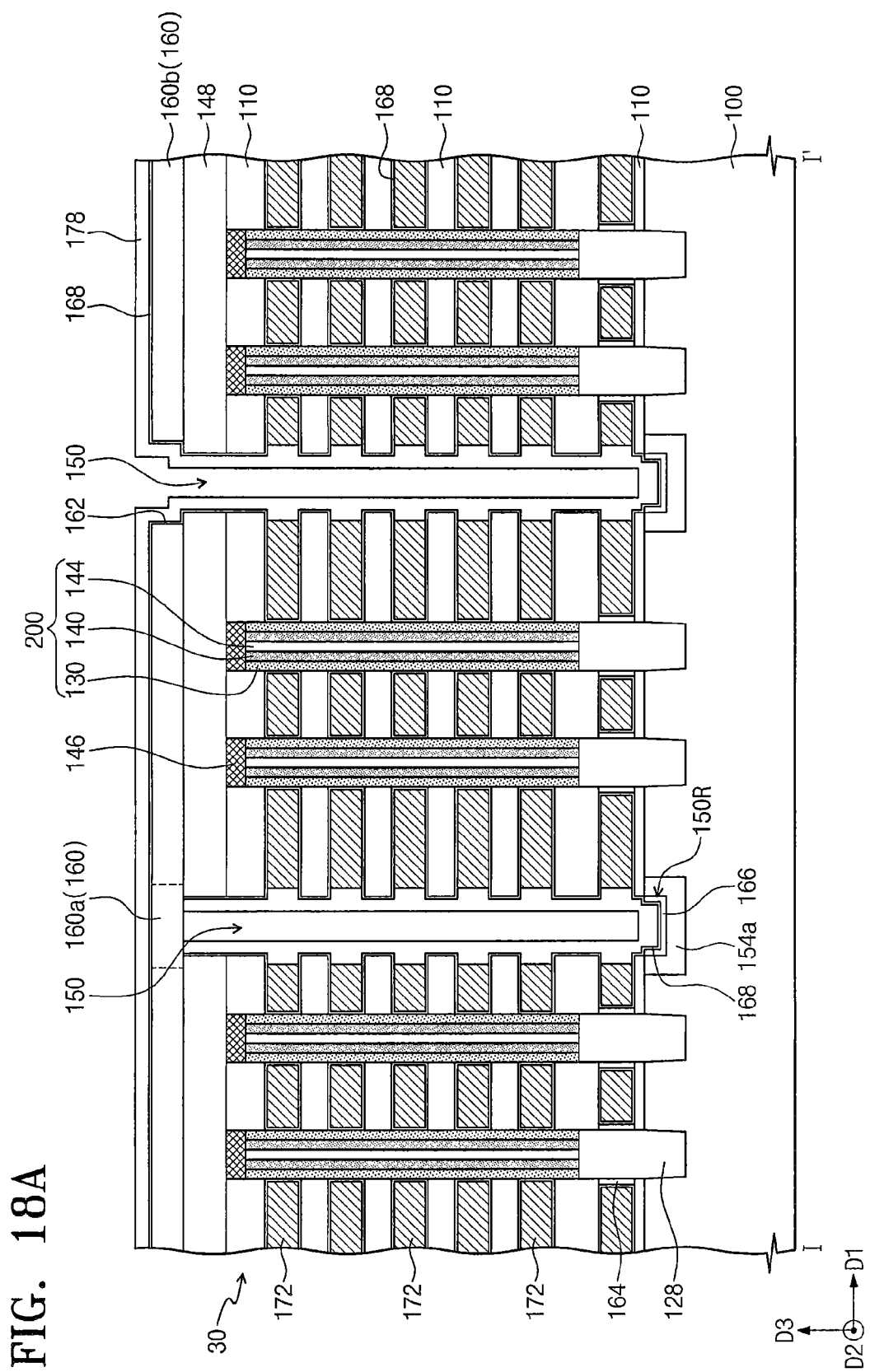
Figure 18B:
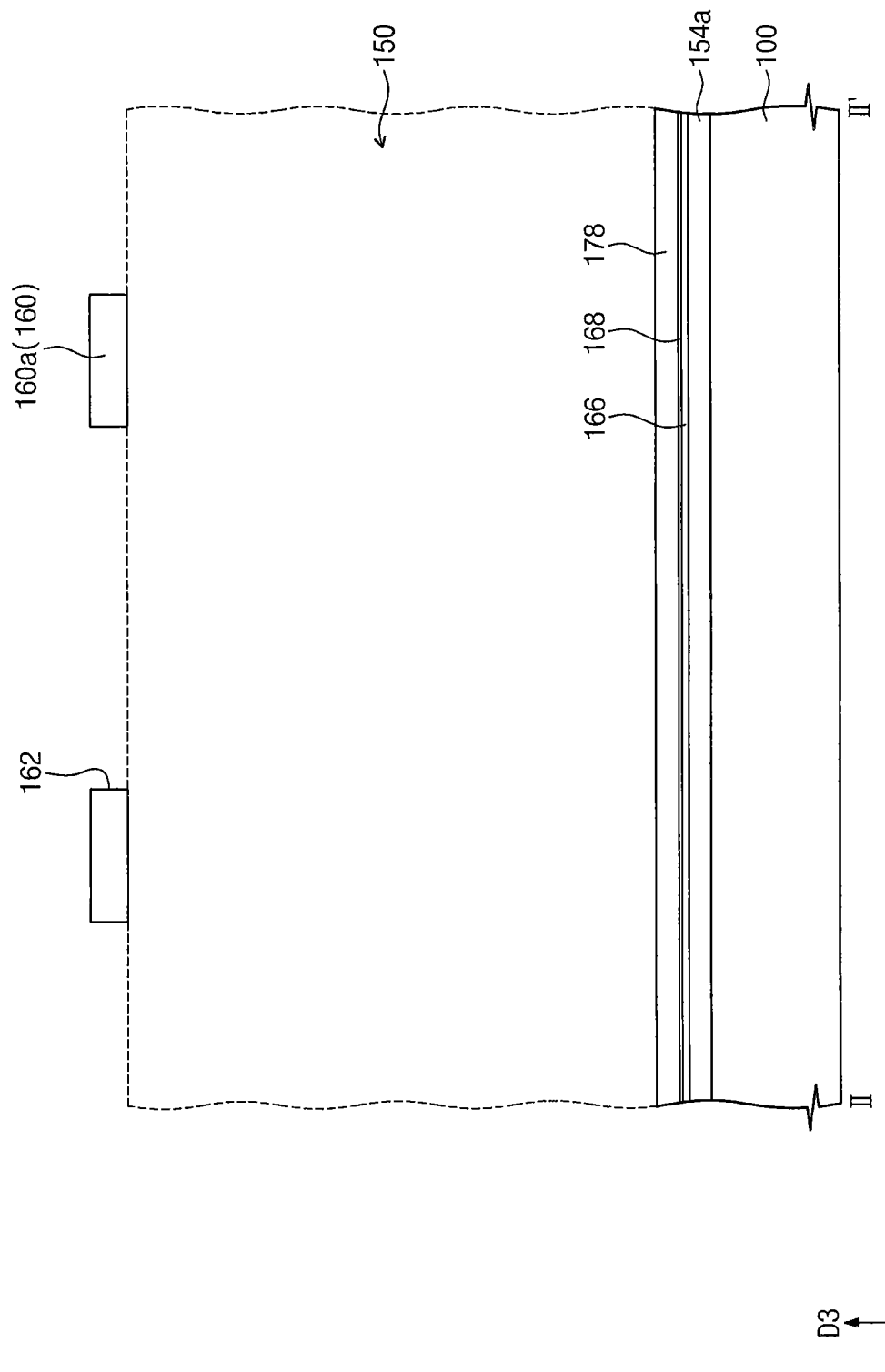
Figure 19B:
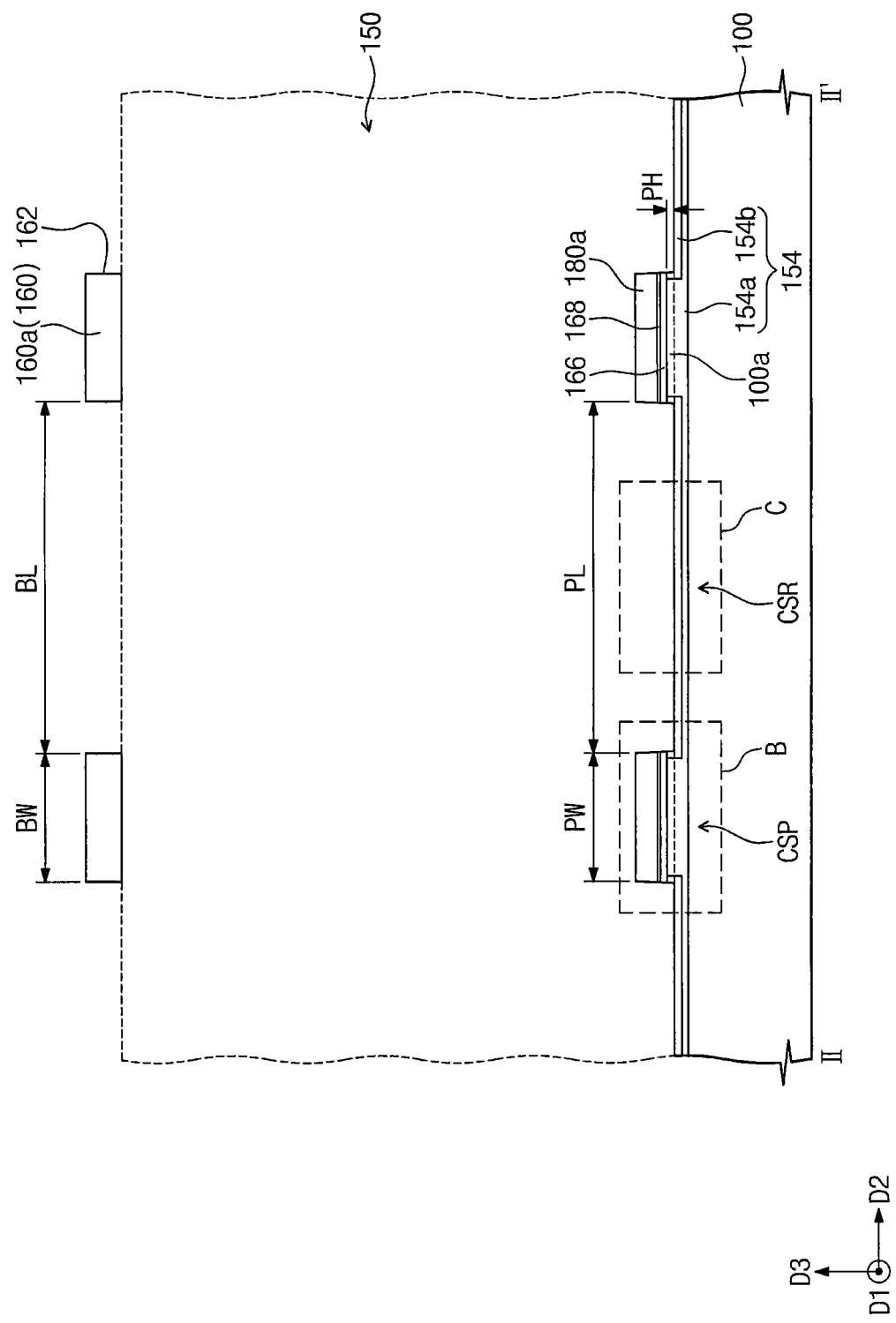

Referring to FIGS. 18A and 18B, an isolation insulating layer 178 may be formed in the first trench 150 between the stack gate structures 30. For example, the isolation insulating layer 178 may have a liner shape that is formed on the supporting pattern 160 and inner surfaces of the first and second trenches 150 and 162. The isolation insulating layer 178 may fill the recess region 150R. The isolation insulating layer 178 may also fill spaces between the insulating layers 110 to protect the ends of the gate electrodes 172. The isolation insulating layer 178 may include a nitride layer, an oxide layer, or an oxynitride layer. The isolation insulating layer 178 may be formed using a CVD process or an ALD process.

Referring to FIGS. 19A, 19B, 19C, and 19D, an isolation insulating pattern 180 may be formed on the inner sidewall of the first trench 150 between the stack gate structures 30. The isolation insulating pattern 180 may also be formed on the inner sidewall of the second trench 162. Protruding regions 110a may be formed on the substrate 100 exposed by the first trench 150, and a lower isolation insulating pattern 180a may be formed on each of the protruding regions 100a. For example, the isolation insulating layer 178 may be etched-back by an anisotropic etching process to form the isolation insulating pattern 180 in the first and second trenches 150 and 162. At this time, the second blocking dielectric layer 168 and the buffer oxide layer 166 may be etched along with the isolation insulating layer 178 to expose the first dopant region 154a. In addition, the substrate 100 may be over-etched by, for example, a depth PH. During this etch-back process of the isolation insulating layer 178, the bridges 160a of the supporting pattern 160 may protect portions of the isolation insulating layer 178 to form the lower isolation insulating patterns 180a. In other words, the lower isolation insulating patterns 180a may correspond to the portions of the isolation insulating layer 178, which remain under the bridges 160a. The lower isolation insulating patterns 180a may substantially overlap with the bridges 160a in a plan view and may be arranged along the second direction D2. For example, a sidewall of each of the lower isolation insulating patterns 180a may be aligned with a sidewall of each of the bridges 160a. A portion of the second blocking dielectric layer 168 and a portion of the buffer oxide layer 166 may remain under each of the lower isolation insulating patterns 180a, and the protruding region 100a of the substrate 100 may be formed under remaining portion of the buffer oxide layer 166. Widths of the remaining portions of the second blocking dielectric layer 168 and the buffer oxide layer 166 may be substantially the same as that of the lower isolation insulating pattern 180a. The protruding region 100a of the substrate 100 may have a height PH and disposed under each of the lower isolation insulating patterns 180a. The height PH may correspond to a vertical distance between a top surface of the protruding region 100a and a top surface of the etched substrate 100. The protruding regions 100a of the substrate 100 may be arranged along the second direction D2. The lower isolation insulating patterns 180a and the isolation insulating pattern 180 may be connected to each other to constitute one united body. The isolation insulating pattern 180 may have a spacer shape that is formed on the inner sidewalls of the first and second trenches 150 and 162, and the lower isolation insulating patterns 180a may be formed on a bottom surface of the first trench 150 to correspond to the bridges 160a of the supporting pattern 160, respectively. The isolation insulating pattern 180 may isolate the stack gate structures 30 from each other. For example, the isolation insulating pattern 180 may isolate the gate electrodes 172 from each other in the first direction D1. The lower isolation insulating patterns 180a and the protruding regions 100a may have a width PW in the second direction D2. The lower isolation insulating patterns 180a may be spaced apart from each other by a distance PL in the second direction D2. The protruding regions 110a may also be spaced apart from each other by the distance PL in the second direction D2. The width PW may be substantially equal to the width BW, and the distance PL may be substantially equal to the distance BL.

Subsequently, second dopant regions 154b may be formed in the substrate 100 disposed between the protruding regions 100a. The second dopant regions 154b may be arranged along the second direction D2 and may be formed in the first dopant region 154a, which is continuously formed in the second direction D2. The second dopant regions 154b may be spaced apart from each other. In some embodiments, the second dopant region 154b may penetrate the first dopant region 154a to extend into the substrate 100.

The second dopant region 154b and the first dopant region 154a may constitute a common source region 154. Dopants may be heavily implanted into the substrate 100 having the first dopant region 154a to form the second dopant region 154b. For example, the second dopant region 154b may include dopants of which a conductivity type is the same as that of the dopants of the first dopant region 154b. In other words, the second dopant region 154b may have the dopants of the second conductivity type. For example, N-type dopants (e.g., arsenic (As) ions or phosphorus (P) ions) may be implanted into the substrate 100 with an energy of about 5 KeV to about 30 KeV and a dose of about $10^{14}$ atoms/cm$^2$ to about $10^{15}$ atoms/cm$^2$, thereby forming the second dopant region 154b. The common source region 154 may include protruding common source regions CSP and recess common source regions CSR. Each of the protruding common source regions CSP may be formed in the each of the protruding regions 110a and the substrate 100 thereunder, and each of the recess common source regions CSR may be formed in the substrate 100 between the protruding regions 100a or in the substrate 100 adjacent to the protruding regions 100a. Each of the protruding common source regions CSP may include a portion of the first dopant region 154a, and each of the recess common source regions CSR may include a portion of the first dopant region 154a and the second dopant region 154b. The second dopant region 154b may extend into the protruding common source region CSP adjacent to the sidewall of the protruding region 100a.

The first dopant region 154a may include regions of which heights are different from each other. For example, the first dopant region 154a may have first regions and second regions that are alternately arranged in the second direction D2. The first regions have a first height, and the second regions have a second height different from the first height. In some embodiments, the first dopant region 154a may have a first height SH1 in each of the protruding common source regions CSP and may have a second height SH2 in each of the recess common source regions CSR. For example, the first height SH1 may be greater than the second height SH2.

In some embodiments, the lower isolation insulating patterns 180a and the protruding regions 100a, which are disposed under the bridges 160a arranged in a zigzag form along the first direction D1 as illustrated in FIG. 1B, may be arranged in the zigzag form along the first direction D1. In addition, the protruding common source regions CSP of the common source regions 154 may not be symmetric in the first direction D1, but may be arranged in a zigzag form along the first direction D1.

Figure 20A:
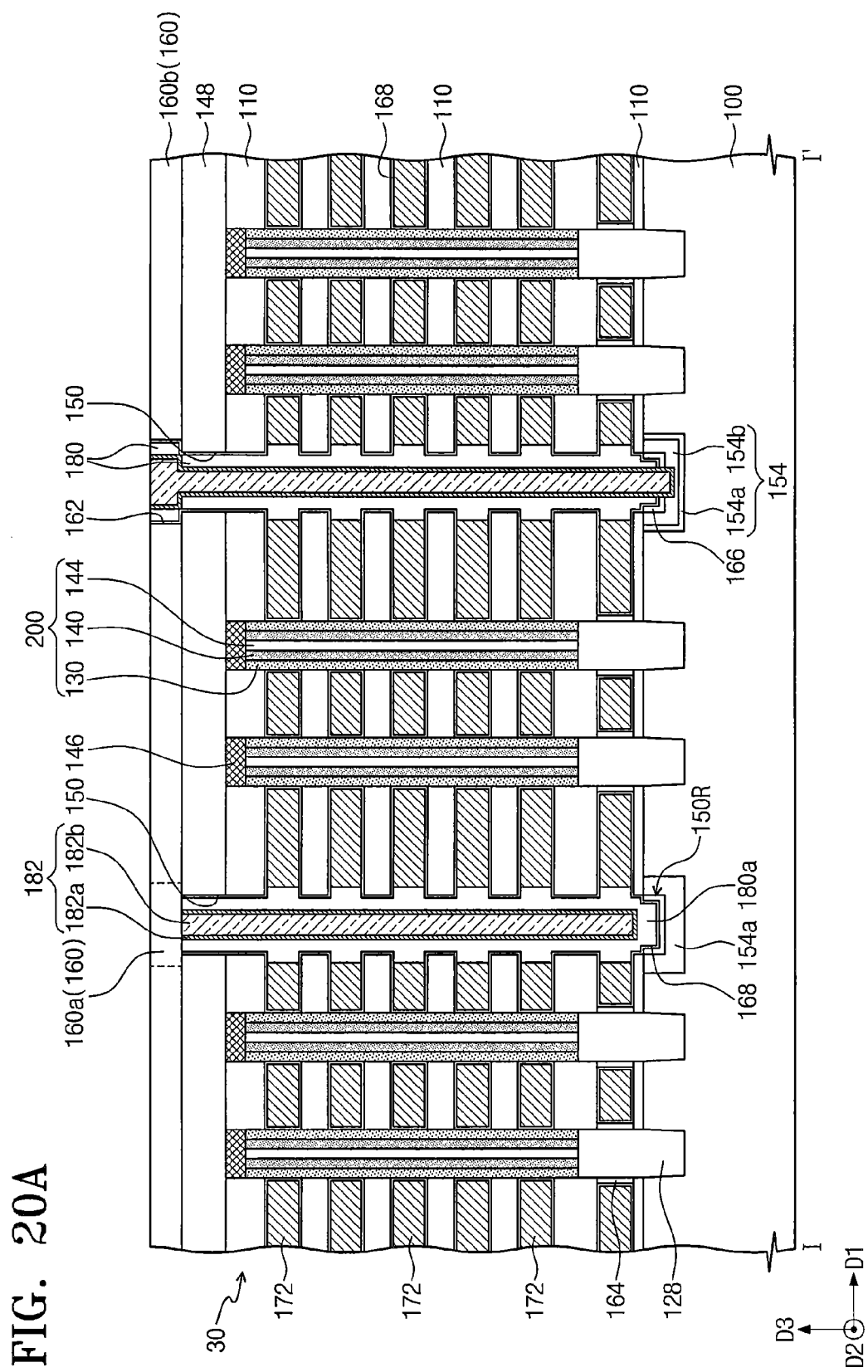

Referring to FIGS. 20A and 20B, a source plug line 182 may be formed in the first and second trenches 150 and 162. The source plug line 182 may extend into the recess region 150R so as to be connected to the common source region 154 and may extend in the second direction D2. The source plug line 182 may include a barrier layer 182a and a conductive layer 182b. The barrier layer 182a may be in contact with the second dopant region 154b and may surround a sidewall and a bottom surface of the conductive layer 182*b*. The barrier layer 182*a* and the conductive layer 182*b* may continuously extend in the second direction D2. For example, a barrier layer 182*a* and a conductive layer 182*b* may be formed to fill the first and second trenches 150 and 162 having the isolation insulating pattern 180, and the barrier layer 182*a* and the conductive layer 182*b* may be planarized until the supporting pattern 160 is exposed, thereby forming the source plug line 182. The barrier layer 182*a* may include at least one of a metal and a metal nitride. For example, the barrier layer 182*a* may include at least one of titanium (Ti), tantalum (Ta), titanium nitride (TiN), tungsten nitride (WN), or tantalum nitride (TaN). For example, the conductive layer 182*b* may include a metal, such as tungsten or copper. A portion of a bottom surface of the source plug line 182 may be in contact with the common source region 154, and another portion of the bottom surface of the source plug line 182 may be separated from the common source region 154. For example, the source plug line 182 may be in contact with top surfaces of the recess common source regions CSR, but may be spaced apart from top surfaces of the protruding common source regions CSP by the lower isolation insulating patterns 180*a*, the portions of the second blocking dielectric layer 168, and the portions of the buffer oxide layer 166. The source plug line 182 may be in contact with portions of sidewalls of the protruding common source regions CSP and may have a linear shape that continuously extends in the second direction D2. In other words, portions of the bottom surface of the source plug line 182 may be in direct contact with the lower isolation insulating patterns 180*a*, and other portions of the bottom surface of the source plug line 182 may be in direct contact with the second dopant regions 154*b*. The source plug line 182 may extend in the second direction D2.

Figure 21A:
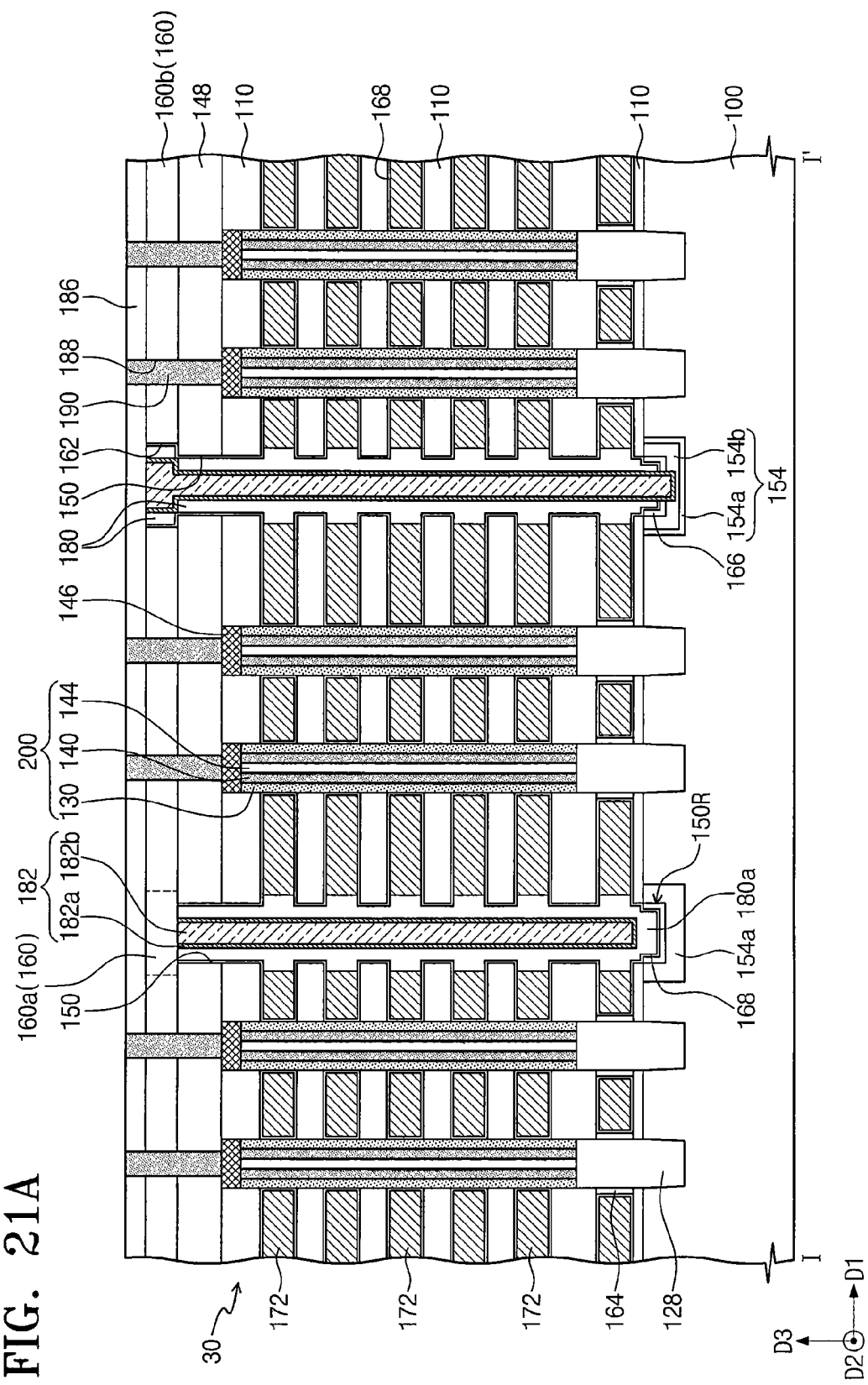
Figure 21B:
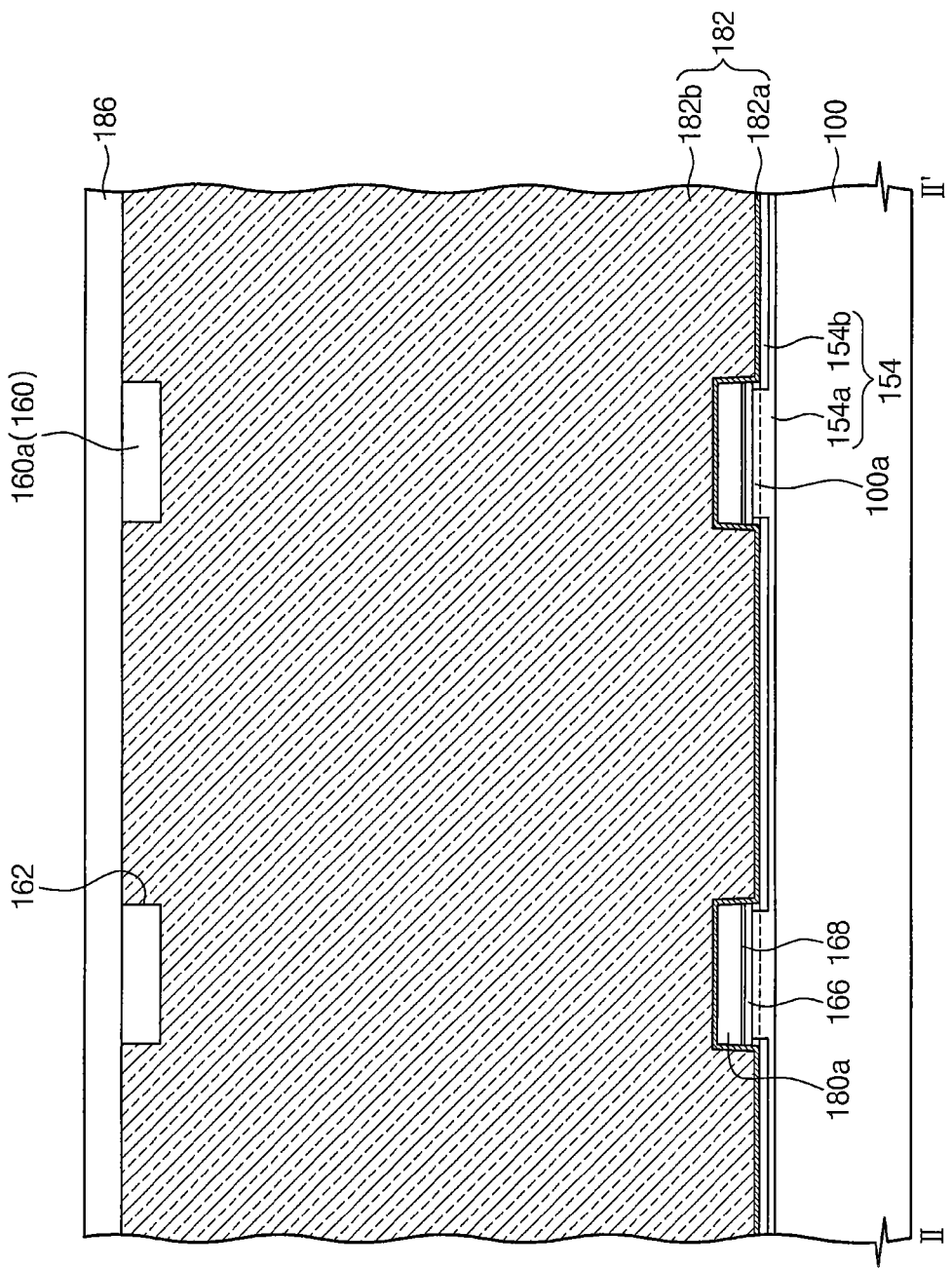

Referring to FIGS. 21A and 21B, an upper interlayer insulating layer 186 may be formed to cover the source plug line 182, and a drain contact 190 may be formed to be connected to the conductive pad 146. In some embodiments, the upper interlayer insulating layer 186 may cover the source plug line 182 and may be formed on the supporting pattern 160. The upper interlayer insulating layer 186 may be formed of at least one of an oxide layer, an oxynitride layer, and a nitride layer. The drain contact 190 may penetrate the upper interlayer insulating layer 186, the supporting pattern 160, and the pad protecting layer 148 so as to be connected to the conductive pad 146. For example, a drain contact hole 188 may be formed to penetrate the upper interlayer insulating layer 186, the supporting pattern 160, and the pad protecting layer 148. The drain contact hole 188 exposes the conductive pad 146. A conductive material may be deposited to fill the drain contact hole 188, and the deposited conductive material may be planarized by an etch-back process or a chemical mechanical polishing (CMP) process to form the drain contact 190. The drain contact 190 may include a conductive material such as a metal, a metal nitride, and/or poly-silicon doped with dopants. The drain contact 190 may be connected to a bit line (not shown) to be formed in a subsequent process.

The leaning phenomenon of the stack gate structures 30 may be reduced or prevented by the supporting pattern 160 described above, thereby reducing or preventing process errors. For example, if the stack gate structures 30 leans by the difference between the amounts of the gate electrodes 172 adjacent to the left and right sidewalls of the stack gate structure 30, the common source region 154 may not be exposed when the isolation insulating layer 178 is etched to form the isolation insulating pattern 180. Thus, the source plug line 182 formed in a subsequent process may not be connected to the common source region 154. In addition, the isolation insulating layer 178 adjacent to the gate electrodes 172 may be etched, so the gate electrodes 172 may be exposed to cause a short between the source plug line 182 and the gate electrodes 172. Furthermore, when the drain contact hole 188 is formed, the conductive pad 146 may not be exposed or only a small part of the conductive pad 146 may be exposed, thereby causing a connection error between the drain contact 190 and the conductive pad 146. However, according to the example embodiment of the inventive concepts, the leaning phenomenon of the stack gate structures 30 may be reduced or prevented by the supporting pattern 160, thereby improving the structural stability and the electrical reliability of the semiconductor memory device.

Figure 22A:
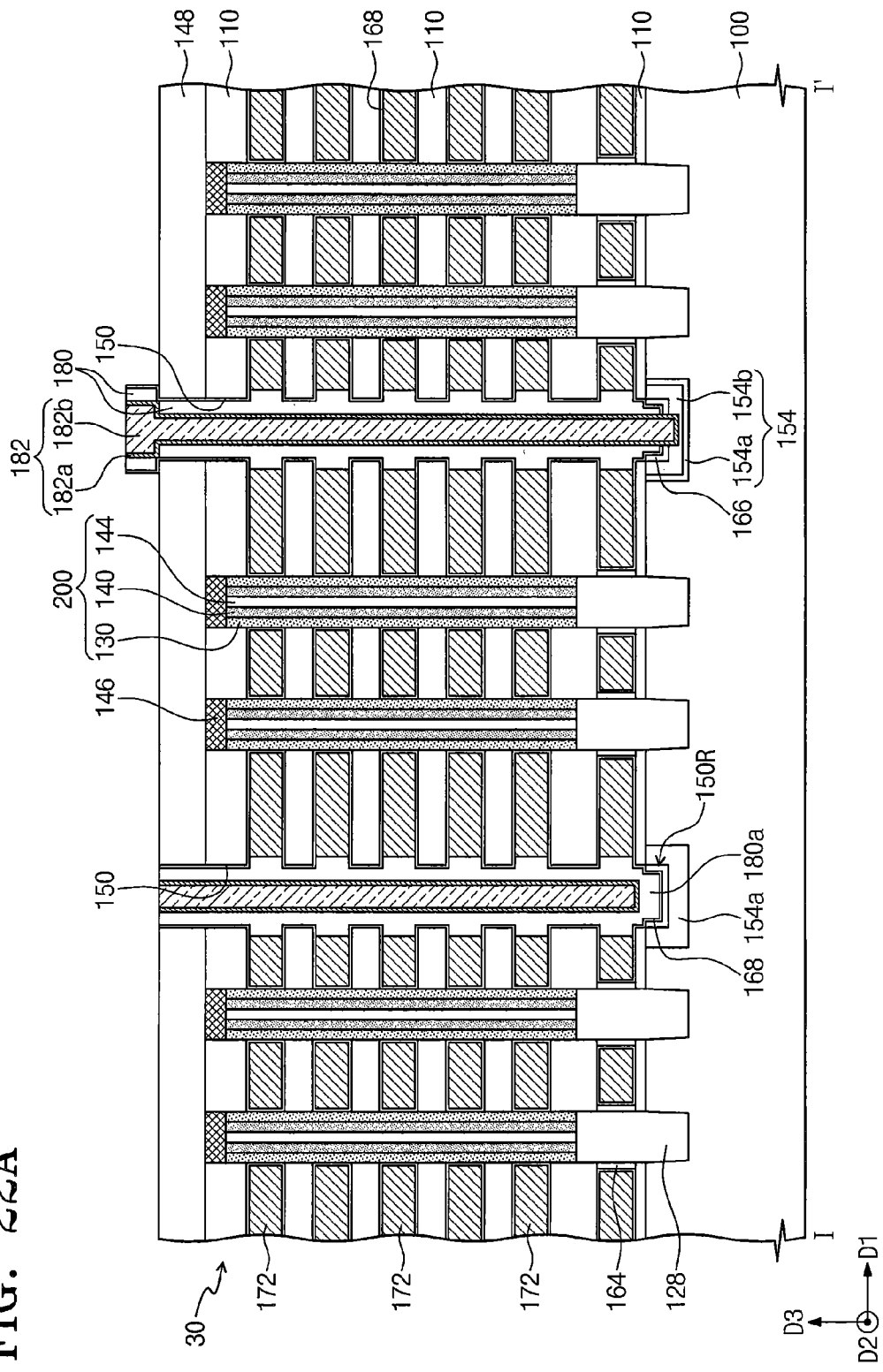
FIGS. 22A and 22B are cross-sectional views taken along lines I-I' and II-II' of FIG. 1A, respectively, to illustrate some processes of a method of fabricating the semiconductor memory device of FIGS. 5A and 5B.
Figure 22B:
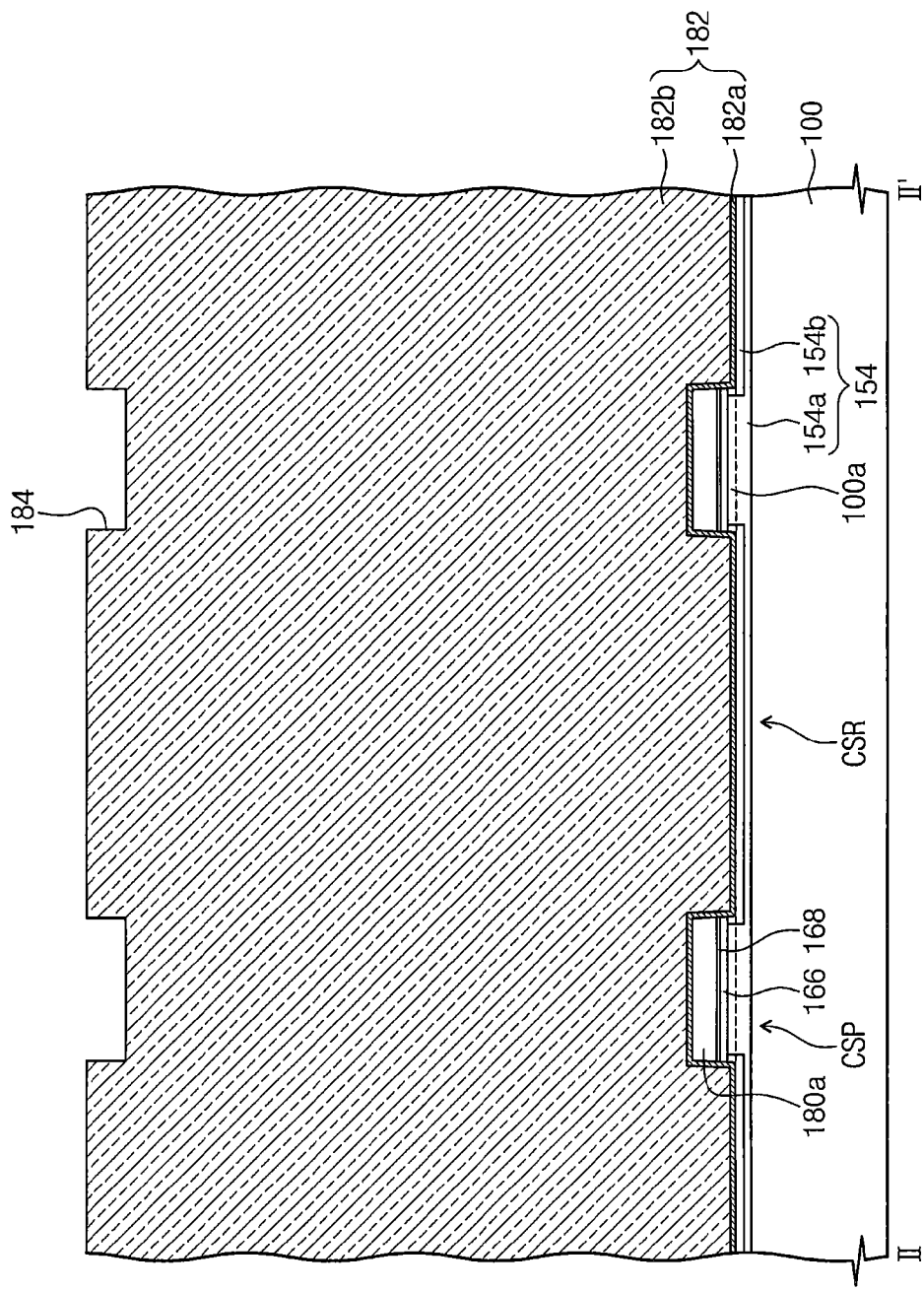

FIGS. 22A and 22B are cross-sectional views taken along lines I-I' and II-II' of FIG. 1A, respectively, to illustrate some processes of a method of fabricating the semiconductor memory device of FIGS. 5A and 5B. In the present embodiment, a method of fabricating a semiconductor memory device may include the formation process of the molding structure 10 to the formation process of the source plug line 182 described with reference to FIGS. 9 to 20B.

Referring to FIGS. 22A and 22B, the supporting pattern 160 may be removed after the formation of the source plug line 182. For example, the supporting pattern 160 may be selectively removed by an anisotropic or isotropic etching process, thereby exposing the pad protecting layer 148 and the source plug line 182. In some embodiments, the isolation insulating pattern 180 and the second blocking dielectric layer 168 formed on the inner sidewall of the second trench 162 may be removed together when the supporting pattern 160 is removed. Bridge groove regions 184 may be formed in an upper portion of the source plug line 182 by the removal of the supporting pattern 160. Thus, a top surface of the source plug line 182 may not be flat. Inner sidewalls of the bridge groove regions 184 may be aligned with the sidewalls of the lower isolation insulating patterns 180*a* and the sidewalls of the protruding regions 100*a*. For example, the bridge groove regions 184 may overlap with the lower isolation insulating patterns 180*a* and the protruding regions 100*a*, respectively, when viewed from a plan view. The bridge groove regions 184 may be filled with the upper interlayer insulating layer 186, as illustrated in FIGS. 5A and 5B. Subsequently, the drain contact 190 may be formed in the drain contact hole 188 penetrating the upper interlayer insulating layer 186 and the pad protecting layer 148. The drain contact 190 may be connected to the conductive pad 146.

Figure 23A:
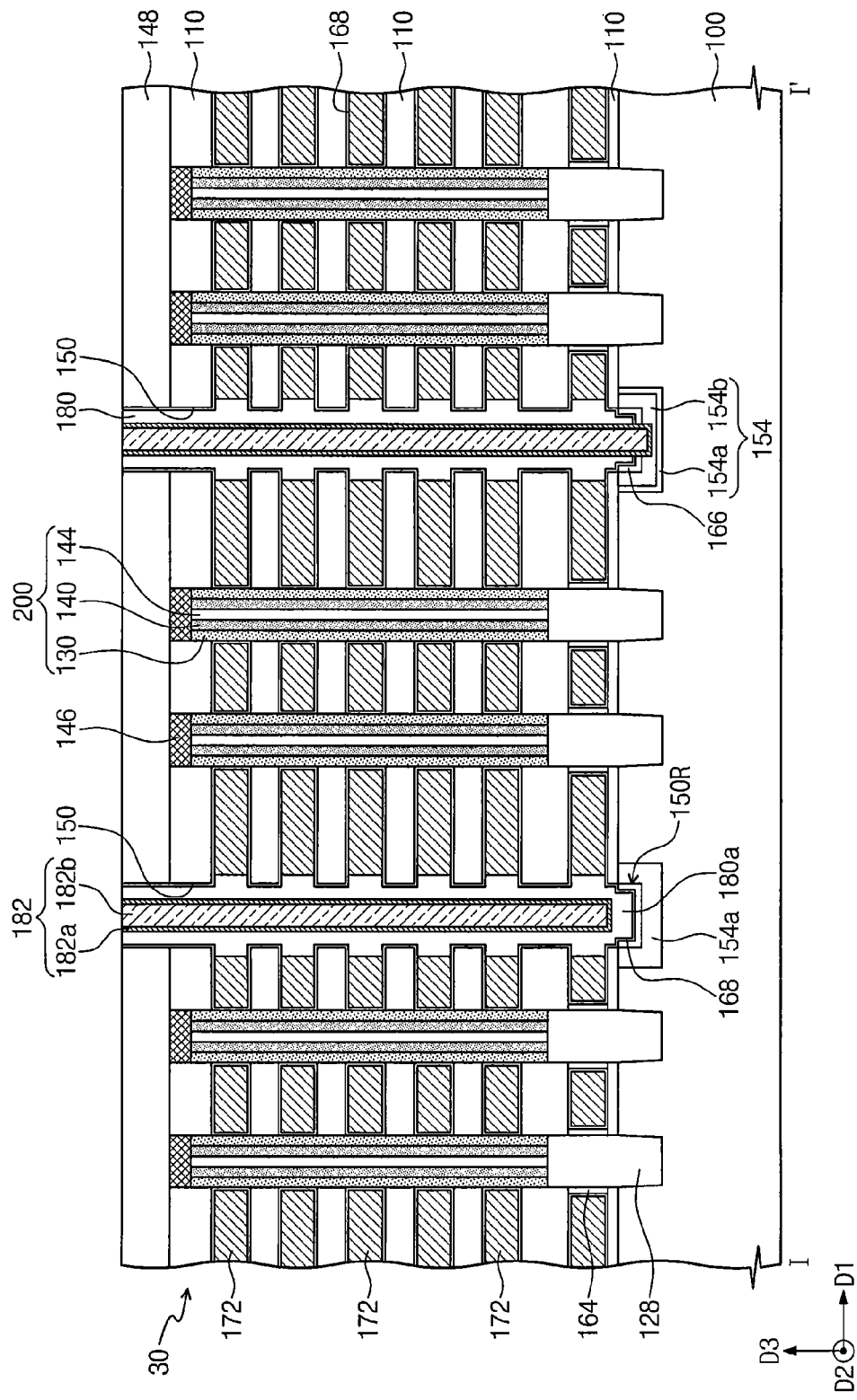
FIGS. 23A and 23B are cross-sectional views taken along lines I-I' and II-II' of FIG. 1A, respectively, to illustrate some processes of a method of fabricating the semiconductor memory device of FIGS. 6A and 6B.
Figure 23B:
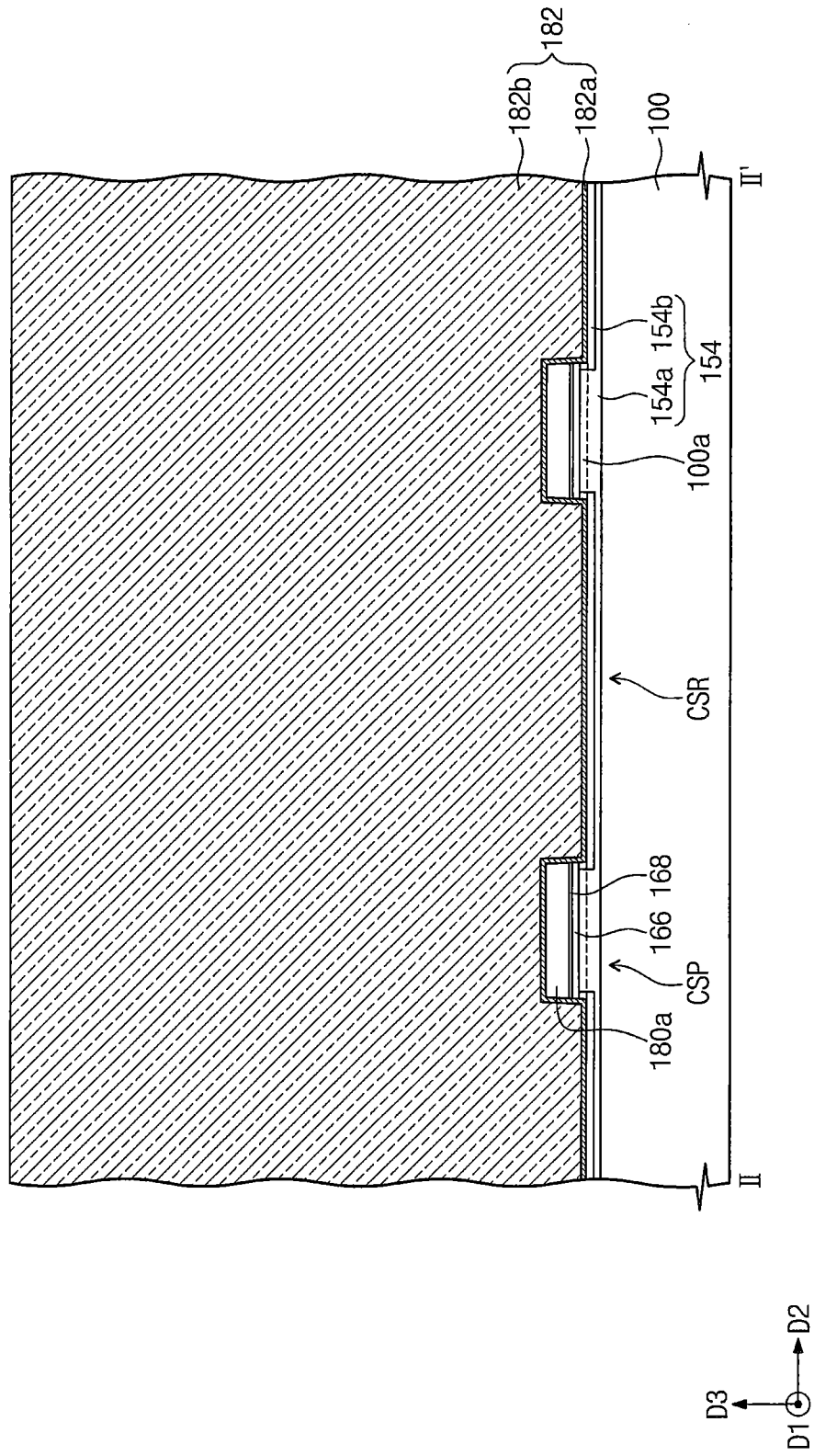

FIGS. 23A and 23B are cross-sectional views taken along lines I-I' and II-II' of FIG. 1A, respectively, to illustrate some processes of a method of fabricating the semiconductor memory device of FIGS. 6A and 6B. In the present embodiment, a method of fabricating a semiconductor memory device may include the formation process of the molding structure 10 to the formation process of the source plug line 182 described with reference to FIGS. 9 to 20B.

Referring to FIGS. 23A and 23B, a portion of the source plug line 182 and the supporting pattern 160 may be removed after the formation of the source plug line 182. For example, the supporting pattern 160 and a portion of an upper portion of the source plug line 182 may be removed by a planarization process, so a top surface of the source plug line 182 may be planarized. For example, the supporting pattern 160 and the portion of the upper portion of the source plug line 182 may be removed using a CMP process to expose the top surface of the pad protecting layer 148 and to form the source plug line 182 having a generally flat top surface. Thus, the top surface of the source plug line 182 may be substantially coplanar with the top surface of the pad protecting layer 148. Thereafter, as illustrated in FIGS. 6A and 6B, the upper interlayer insulating layer 186 may be formed on the pad protecting layer 148 and the source plug line 182 having the generally flat top surface, and the drain contact 190 may be formed in the drain contact hole 188 penetrating the upper interlayer insulating layer 186 and the pad protecting layer 148. The drain contact 190 may be connected to the conductive pad 146.

Figure 24A:
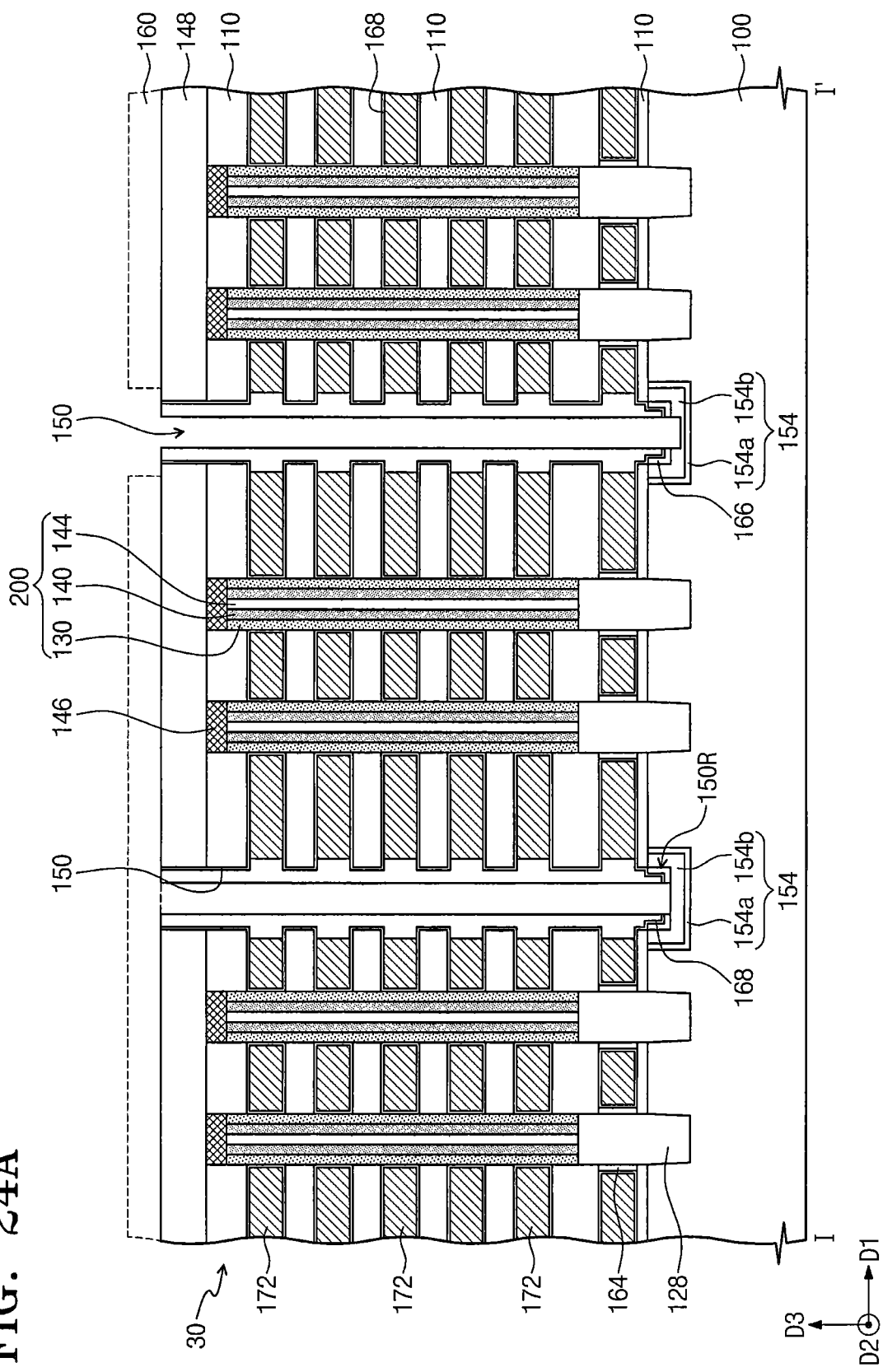
FIGS. 24A and 25A are cross-sectional views taken along a line I-I' of FIG. 1A to illustrate some processes of a method of fabricating the semiconductor memory device of FIGS. 7A, 7B, 8A, and 8B.
Figure 24B:
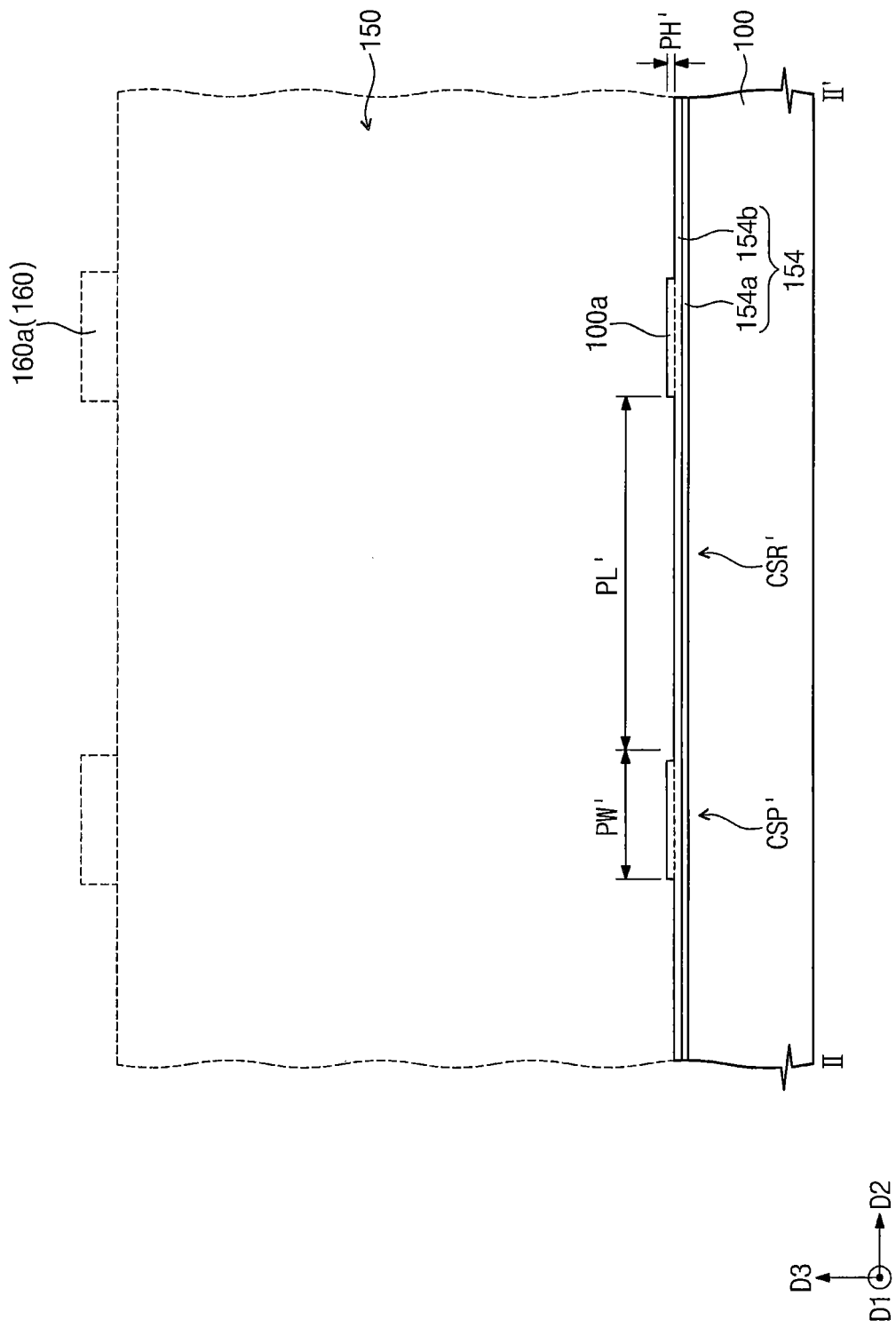
Figure 25A:
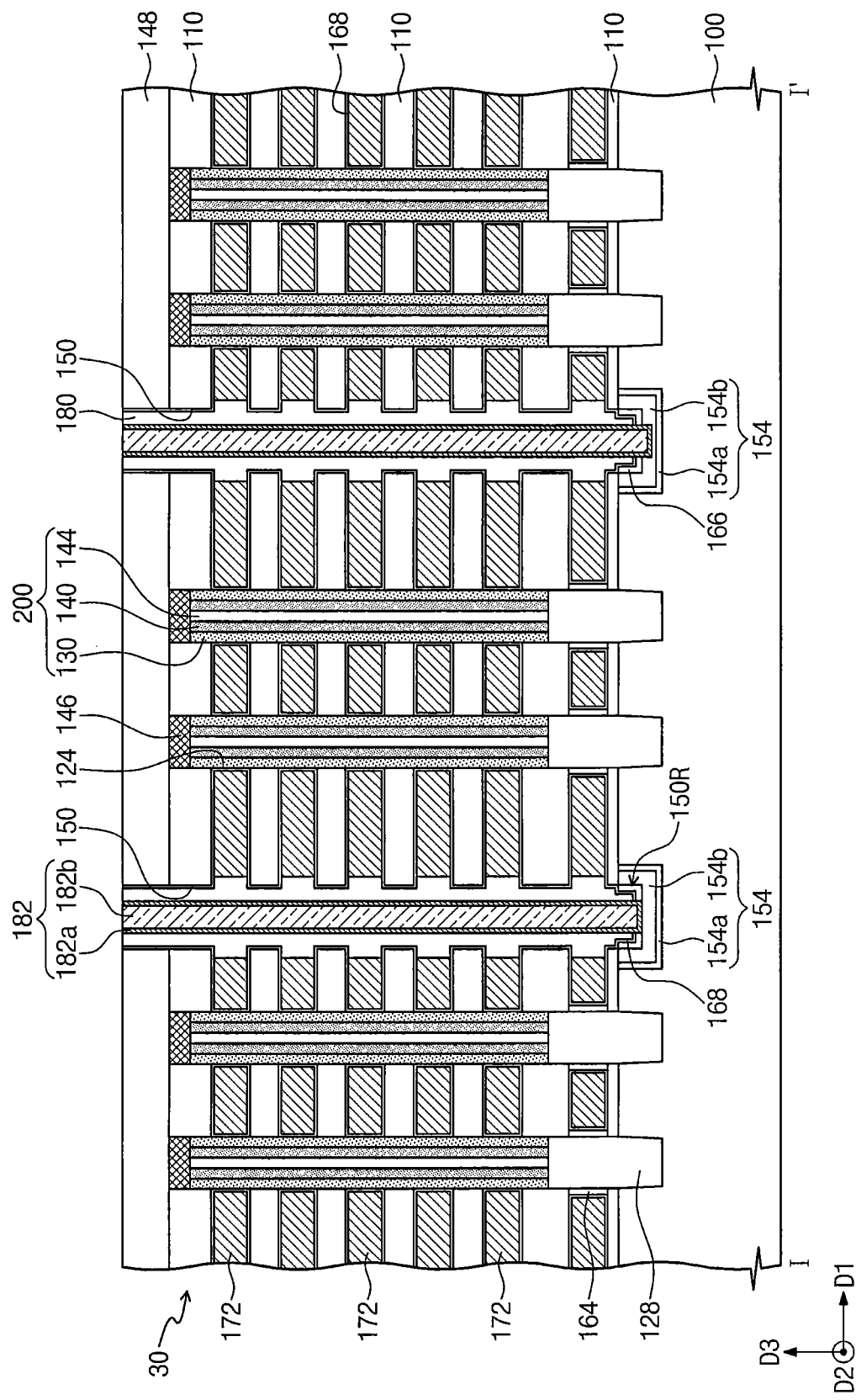

FIGS. 24A and 25A are cross-sectional views taken along a line I-I' of FIG. 1A to illustrate some processes of a method of fabricating the semiconductor memory device of FIGS. 7A, 7B, 8A, and 8B. FIGS. 24B and 25B are cross-sectional views taken along a line II-II' of FIG. 1A to illustrate some processes of a method of fabricating the semiconductor memory device of FIGS. 7A, 7B, 8A, and 8B. In the present embodiment, a method of fabricating a semiconductor memory device may include the formation process of the molding structure 10 to the formation process of the isolation insulating layer 178 described with reference to FIGS. 9 to 18B.

Referring to FIGS. 24A and 24B, the supporting pattern 160 may be removed when the etch-back process is performed on the isolation insulating layer 178 to form the isolation insulating pattern 180. For example, when the supporting pattern 160 and the isolation insulating layer 178 are formed of the same material, a portion of the isolation insulating layer 178 and the supporting pattern 160 may be removed using the same etching condition. Thus, the isolation insulating layer 178, the second blocking dielectric layer 168, and the buffer oxide layer 166 which fill the recess region 150R may be removed, and the isolation insulating pattern 180 may be formed on the inner sidewalls of the first and second trenches 150 and 162. The isolation insulating pattern 180 may continuously expose the top surface of the substrate 100 having the first dopant region 154a along the second direction D2. At this time, because the isolation insulating layer 178 disposed in regions overlapping with the bridges 160a is also etched, the substrate 100 may be over-etched. Thus, protruding regions 100a similar to the bridges 160a may be formed to have a height PH' and a width PW'. The protruding regions 100a may be spaced apart from each other by a distance PL'. For example, the height PH' may be substantially equal to or greater than the height PH illustrated in FIG. 19C. For example, the width PW' and the distance PL' may be substantially similar to equal to the width PW and the distance PL illustrated in FIG. 19B, respectively. A second dopant region 154b may be continuously formed in the substrate 100 having the first dopant region 154a along the second direction D2. The second dopant region 154b and the first dopant region 154a may constitute a common source region 154. Dopants may be heavily implanted into the substrate 100 having the first dopant region 154a, thereby forming the second dopant region 154b. For example, the second dopant region 154b may include dopants of which the second conductivity type is the same as that of the dopants of the first dopant region 154b. For example, N-type dopants (e.g., arsenic (As) ions or phosphorus (P) ions) may be implanted into the substrate 100 with an energy of about 10 KeV to about 40 KeV and a dose of about $10^{14}$ atoms/cm$^2$ to about $10^{15}$ atoms/cm$^2$, thereby forming the second dopant region 154b.

A protruding common source region CSP' formed in the substrate 100 including the protruding region 100a may include the first dopant region 154a having a low concentration and the second dopant region 154b having a high concentration. A recess common source region CSR' formed in the substrate 100 disposed between the protruding regions 100a may also include the first dopant region 154a having the low concentration and the second dopant region 154b having the high concentration. For example, the second dopant region 154b with the high concentration may be surrounded by the first dopant region 154a with the low concentration. However, the inventive concepts are not limited thereto. In other embodiments, the second dopant region 154b may penetrate the first dopant region 154a to extend into the substrate 100. The first dopant region 154a may include regions of which heights are different from each other as illustrated in FIGS. 8A and 8B. For example, the first dopant region 154a may include first regions and second regions that are alternately arranged in the second direction D2. The first regions may have a first height SH1, and the second regions may have a second height SH2 different from the first height SH1. For example, the first dopant region 154a may have the first height SH1 in each of the protruding common source regions CSP' and may have the second height SH2 in each of the recess common source regions CSR'. For example, the first height SH1 may be greater than the second height SH2.

In some embodiments, if the supporting pattern 160 having the bridges 160a arranged in the zigzag form as illustrated in FIG. 1B is removed, the protruding regions 100a may be arranged in a zigzag form along the first direction D1. In addition, the protruding common source regions CSP' of the common source regions 154 may not be symmetric in the first direction D1, but may be arranged in a zigzag form along the first direction D1.

Referring to FIGS. 25A and 25B, a source plug line 182 may be formed to fill the first trench 150. The source plug line 182 may include a barrier layer 182a and a conductive layer 182b. The barrier layer 182a of the source plug line 182 may be in contact with the second dopant region 154b and may surround a sidewall and a bottom surface of the conductive layer 182b. The barrier layer 182a and the conductive layer 182b may continuously extend in the second direction D2. For example, a barrier layer 182a and a conductive layer 182b may be formed to fill the first trench 150 having the isolation insulating pattern 180, and the barrier layer 182a and the conductive layer 182b may be planarized until the pad protecting layer 148 is exposed, thereby forming the source plug line 182. A conductive material included in the source plug line 182 may be the same as described with reference to FIGS. 20A and 20B.

A bottom surface of the source plug line 182 may be in direct contact with the protruding region 100a having the height PH'. Thus, the source plug line 182 may be in contact with the protruding regions 100a arranged along the second direction D2 and the substrate 100 therebetween. The source plug line 182 may extend in the second direction D2. In other words, the source plug line 182 may extend in the second direction D2 so as to be in direct contact with the second dopant region 154b, which is continuously formed in the substrate 100 including the protruding regions 100a arranged along the second direction D2. Subsequently, as illustrated in FIGS. 7A and 7B, the upper interlayer insulating layer 186 may be formed on the pad protecting layer 148 and the source plug line 182 having the generally flat top surface. The drain contact 190, which is connected to the conductive pad 146, may be formed in the drain contact hole 188 penetrating the upper interlayer insulating layer 186 and the pad protecting layer 148.

Figure 26:
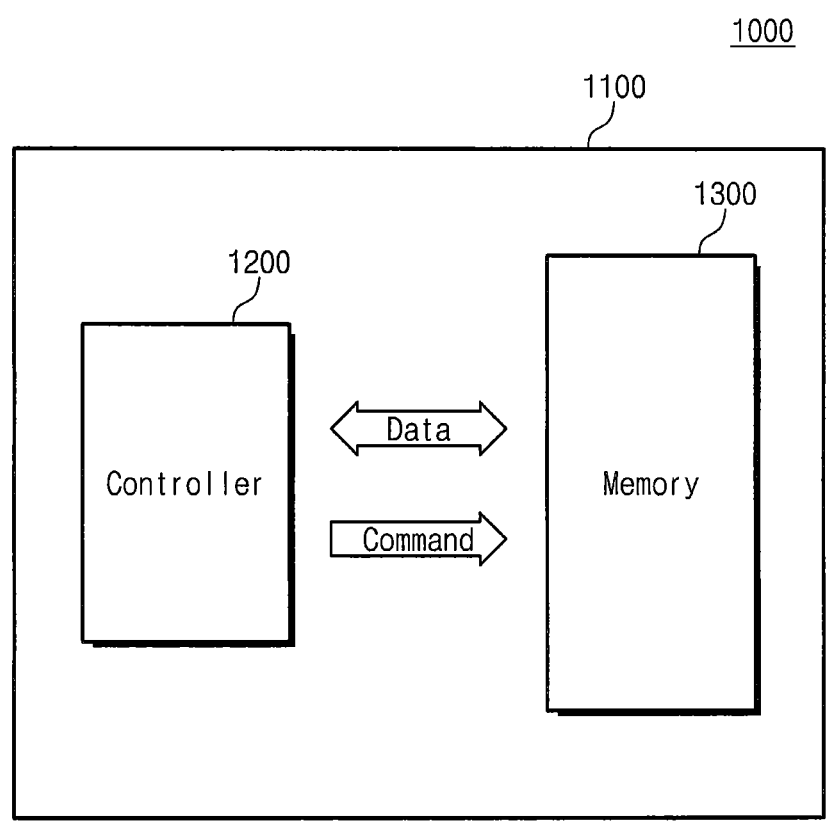
FIG. 26 is a schematic block diagram illustrating a semiconductor device system including a semiconductor memory device according to example embodiments of the inventive concepts.

FIG. 26 is a schematic block diagram illustrating a semiconductor device system including a semiconductor memory device according to example embodiments of the inventive concepts.

Referring to FIG. 26, a memory system 1000 according to example embodiments of the inventive concepts may be a semiconductor storage device. For example, the memory system 1000 may be a memory card or a solid state drive (SSD). The memory system 1000 may include a controller 1200 and a memory device 1300 that are disposed in a housing 1100. The controller 1200 may exchange electrical signals with the memory device 1300. For example, the controller 1200 and the memory device 1300 may exchange data with each other in response to a command of the controller 1200. Thus, the memory system 1000 may store data in the memory device 1300 or may output data from the memory device 1300 to an external system. The memory device 1300 may include at least one of the semiconductor memory devices according to example embodiments of the inventive concepts.

Figure 27:
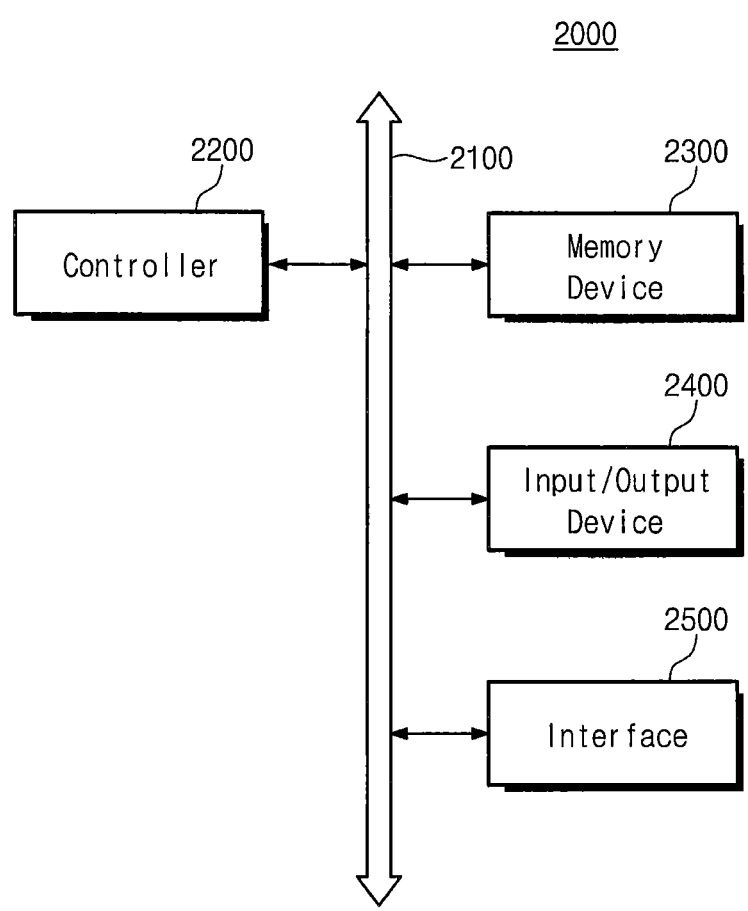
FIG. 27 is a schematic block diagram illustrating an electronic system including a semiconductor memory device according to example embodiments of the inventive concepts.

FIG. 27 is a schematic block diagram illustrating an electronic system including a semiconductor memory device according to example embodiments of the inventive concepts.

Referring to FIG. 27, an electronic system 2000 may include a controller 2200, a memory device 2300, and an input/output device 2400. The controller 2200, the memory device 2300, and the input/output device 2400 may be coupled to each other through a data bus 2100. The data bus 2100 may correspond to a path that transmits data. For example, the controller 2200 may include at least one of a microprocessor, a digital signal processor, a microcontroller, or other logic devices. Functions of the other logic devices may be similar to any one of the microprocessor, the digital signal processor and the microcontroller. The input/output device 2400 may include at least one of a keypad, a keyboard, or a display device. The memory device 2300 is a device capable of storing data. The memory device 2300 may store data and/or commands to be executed by the controller 2200. The memory device 2300 may include a volatile memory device and/or a non-volatile memory device. Alternatively, the memory device 2300 may include a flash memory device. The flash memory device may be realized as a solid state drive (SSD). In this case, the electronic system 2000 may stably store large amounts of data in the memory device 2300. The memory device 2300 may include at least one of the semiconductor memory devices according to example embodiments of the inventive concepts. The electronic system 2000 may further include an interface unit 2500 that transmits data to a communication network or receives data from a communication network. The interface unit 2500 may operate by wireless or cable. For example, the interface unit 2500 may include an antenna or a wireless/cable transceiver.

The semiconductor memory devices according to example embodiments of the inventive concepts may be encapsulated using various packaging techniques. For example, the semiconductor memory devices according to the aforementioned embodiments of the inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to example embodiments of the inventive concepts, the leaning phenomenon of the stack gate structures may be reduced or prevented to improve the structural stability and the electrical reliability of the semiconductor memory device.

According to example embodiments of the inventive concepts, the supporting pattern may be formed to reduce or prevent the stack gate structures surrounding the vertical channel structures from leaning, so process errors may be reduced or prevented in subsequent processes. As a result, it is possible to provide the method of fabricating the semiconductor memory device capable of improving the reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor memory device comprising:
a substrate;
a plurality of stack gate structures spaced apart from each other in a first direction parallel to a main surface of the substrate, each of the stack gate structures including insulating layers and gate electrodes that are alternately and repeatedly stacked on the substrate;
a plurality of vertical channel structures penetrating each of the stack gate structures; and
a source plug line disposed between the stack gate structures, the source plug line being in contact with the substrate and extending in a second direction intersecting the first direction,
wherein the substrate being in contact with the source plug line includes a plurality of protruding regions arranged along the second direction,
wherein each of the protruding regions has a first width, and
wherein the protruding regions are spaced apart from each other by a first distance greater than the first width.
2. The semiconductor memory device of claim 1, wherein each of the vertical channel structures comprises: a tunnel dielectric layer, a charge storage layer, a blocking dielectric layer, and a vertical channel pattern including a semiconductor material.
3. The semiconductor memory device of claim 2, wherein the vertical channel pattern includes a first vertical channel pattern vertically protruded from the substrate and a second vertical channel pattern vertically disposed on the first vertical channel pattern, and wherein the tunnel dielectric layer, the charge storage layer and the blocking dielectric layer are disposed between the second vertical channel pattern and the plurality of stack gate structures.

4. The semiconductor memory device of claim 2, wherein the source plug line includes a barrier layer and a conductive layer on the barrier layer.

5. The semiconductor memory device of claim 1, further comprising:
an isolation insulating pattern disposed between the source plug line and the stack gate structures.

6. The semiconductor memory device of claim 5, further comprising:
a lower isolation insulating pattern selectively disposed on the plurality of protruding regions,
wherein the lower isolation insulating pattern is in direct contact with a bottom surface of the source plug line, and
wherein the lower isolation insulating pattern is connected to the isolation insulating pattern.

7. The semiconductor memory device of claim 6, further comprising:
a supporting pattern disposed on the stack gate structures,
wherein the supporting pattern comprises: a plurality of bridges crossing over the source plug line in the first direction and spaced apart from each other in the second direction; and fixing portions connected to the bridges and disposed on the stack gate structures, respectively.

8. The semiconductor memory device of claim 7, wherein the bridges are arranged in a zigzag form along the first direction.

9. The semiconductor memory device of claim 7, wherein each of the bridges substantially vertically overlaps with each of the protruding regions.

10. The semiconductor memory device of claim 7, wherein the supporting pattern has a linear type extending in the first direction.

11. The semiconductor memory device of claim 1, wherein the source plug line comprises an upper portion including a plurality of groove regions arranged along the second direction.

12. The semiconductor memory device of claim 1, further comprising:
a common source region in contact with the source plug line and disposed in the substrate.

13. A semiconductor memory device comprising:
a plurality of stack gate structures disposed on a substrate, each of the stack gate structures including insulating layers and gate electrodes that are alternately and repeatedly stacked on the substrate, and the stack gate structures being spaced apart from each other in a first direction;
a plurality of vertical channel structures penetrating each of the stack gate structures;
a source plug line disposed between the plurality of stack gate structures, the source plug line including a conductive material and extending in a second direction intersecting the first direction; and
a common source region being in contact with the source plug line and disposed in the substrate,
wherein the common source region comprises a first dopant region and a second dopant region that are alternately formed along the second direction,
wherein the first dopant region has a first height and the second dopant region has a second height, and
wherein the first height is greater than the second height.

14. The semiconductor memory device of claim 13, further comprising:
a third dopant region disposed in the second dopant region,
wherein a dopant concentration of the third dopant region is higher than those of the first and second dopant regions.

15. The semiconductor memory device of claim 14, further comprising:
a lower isolation insulating pattern disposed on the first dopant region.

16. The semiconductor memory device of claim 15, further comprising:
an isolation insulating pattern disposed between the source plug line and the stack gate structures,
wherein the isolation insulating pattern is connected to the lower isolation insulating pattern.

17. The semiconductor memory device of claim 13, further comprising:
a supporting pattern disposed on the stack gate structures,
wherein the supporting pattern comprises: a plurality of bridges crossing over the source plug line in the first direction and spaced apart from each other in the second direction; and fixing portions connected to the bridges and disposed on the stack gate structures, respectively.

18. A semiconductor memory device comprising:
a plurality of vertical channel structures disposed on a substrate and extending in a direction vertical to the substrate;
a plurality of stack gate structures surrounding the vertical channel structures and including gate electrodes stacked in the direction vertical to the substrate, the stack gate structures being spaced apart from each other in a first direction parallel to the substrate; and
a common source region formed in the substrate and including a plurality of protruding regions that are formed along a second direction intersecting the first direction between the stack gate structures,
wherein each of the protruding regions has a first width in the second direction, and
wherein the protruding regions are spaced apart from each other by a first distance greater than the first width.

19. The semiconductor memory device of claim 18, further comprising
a source plug line disposed on the common source region, the source plug line being in contact with the common source region and extending in the second direction.

20. The semiconductor memory device of claim 18, further comprising:
a supporting pattern disposed on the stack gate structures,
wherein the supporting pattern comprises: a plurality of bridges crossing over the source plug line in the first direction and spaced apart from each other in the second direction; and fixing portions connected to the bridges and disposed on the stack gate structures, respectively.

* * * * *